United States Patent
Lee et al.

(10) Patent No.: US 11,924,987 B2
(45) Date of Patent: Mar. 5, 2024

(54) ELECTRONIC DEVICE INCLUDING HINGE STRUCTURE

(71) Applicant: Samsung Electronics Co., Ltd., Suwon-si (KR)

(72) Inventors: Giyun Lee, Suwon-si (KR); Chungkeun Yoo, Suwon-si (KR); Jongkeun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 267 days.

(21) Appl. No.: 17/559,367

(22) Filed: Dec. 22, 2021

(65) Prior Publication Data

US 2022/0217859 A1    Jul. 7, 2022

Related U.S. Application Data

(63) Continuation of application No. PCT/KR2021/018437, filed on Dec. 7, 2021.

(30) Foreign Application Priority Data

Jan. 5, 2021    (KR) .................. 10-2021-0000859

(51) Int. Cl.
*H05K 5/00*    (2006.01)
*H05K 5/02*    (2006.01)
(Continued)

(52) U.S. Cl.
CPC ......... *H05K 5/0226* (2013.01); *H05K 5/0017* (2013.01); *E05D 3/122* (2013.01); *E05D 3/18* (2013.01); *E05Y 2900/606* (2013.01)

(58) Field of Classification Search
None
See application file for complete search history.

(56) References Cited

U.S. PATENT DOCUMENTS 9,348,450 B1    5/2016 Kim
9,557,771 B2    1/2017 Park et al.
(Continued)

FOREIGN PATENT DOCUMENTS

CN    209710124 U    11/2019
CN    110784570 A    2/2020
(Continued)

OTHER PUBLICATIONS

Japanese Office Action dated Apr. 11, 2023, issued in Japanese Application No. 2022/500644.
(Continued)

*Primary Examiner* — Anthony Q Edwards
*Assistant Examiner* — Rashen E Morrison
(74) *Attorney, Agent, or Firm* — Jefferson IP Law, LLP

(57) ABSTRACT

An electronic device is provided. The electronic device includes a display extending from a first housing to a second housing, and a hinge structure rotatably connecting the first housing and the second housing and including a fixed member, a first rotary member coupled to the fixed member so as to be rotatable about a first axis extending parallel to an axial direction and connected with the first housing, a second rotary member coupled to the fixed member so as to be rotatable about a second axis parallel to the axial direction and connected with the second housing, a first guide member coupled to the first rotary member so as to be rotatable about a third axis parallel to the first axis, a second guide member coupled to the second rotary member so as to be rotatable about a fourth axis parallel to the second axis, a first rotary plate at least partially coupled to the first guide member to rotate about the third axis with the first guide member and supporting a partial area of the display, and a second rotary plate at least partially coupled to the second guide member to rotate about the fourth axis with the second guide member (Continued)

and supporting another partial area of the display. When the first housing or the second housing is folded or unfolded, the first rotary member rotates about the first axis in a first rotational direction, the first guide member and the first rotary plate rotate about the third axis in the first rotational direction, the second rotary member rotates about the second axis in a second rotational direction opposite to the first rotational direction, and the second guide member and the second rotary plate rotate about the fourth axis in the second rotational direction.

20 Claims, 31 Drawing Sheets

(51) Int. Cl.
*E05D 3/12* (2006.01)
*E05D 3/18* (2006.01)

(56) References Cited

U.S. PATENT DOCUMENTS

| | | | |
|---|---|---|---|
| 9,791,892 | B2 | 10/2017 | Park et al. |
| 10,152,089 | B2 | 12/2018 | Park et al. |
| 10,310,551 | B2 | 6/2019 | Bae et al. |
| 10,585,458 | B2 | 3/2020 | Park et al. |
| 10,761,573 | B2 * | 9/2020 | Hsu ................. G06F 1/1681 |
| 10,845,850 | B1 * | 11/2020 | Kang ................. E05D 3/122 |
| 10,895,894 | B2 * | 1/2021 | Jan ................. G06F 1/1652 |
| 11,137,801 | B2 | 10/2021 | Park et al. |
| 11,336,759 | B2 | 5/2022 | Liao et al. |
| 2015/0366089 | A1 | 12/2015 | Park et al. |
| 2015/0378397 | A1 | 12/2015 | Park et al. |
| 2016/0302314 | A1 | 10/2016 | Bae et al. |
| 2020/0103935 | A1 | 4/2020 | Hsu |
| 2021/0368032 | A1 | 11/2021 | Liao et al. |
| 2022/0019266 | A1 | 1/2022 | Park et al. |

FOREIGN PATENT DOCUMENTS

| | | | |
|---|---|---|---|
| CN | 109469680 | B | 6/2020 |
| CN | 111698355 | A | 9/2020 |
| CN | 111828462 | A | 10/2020 |
| CN | 111984060 | A | 11/2020 |
| JP | 2012/251572 | A | 12/2012 |
| JP | 2020/125841 | A | 8/2020 |
| KR | 10-2004-0010123 | A | 1/2004 |
| KR | 10-2015-0142290 | A | 12/2015 |
| KR | 10-2016-0001622 | A | 1/2016 |
| KR | 10-1776262 | B1 | 9/2017 |
| KR | 10-2018-0030435 | A | 3/2018 |
| KR | 10-2020-0018176 | A | 2/2020 |

OTHER PUBLICATIONS

International Search Report dated Mar. 25, 2022, issued in International Patent Application No. PCT/KR2021/018437.

* cited by examiner

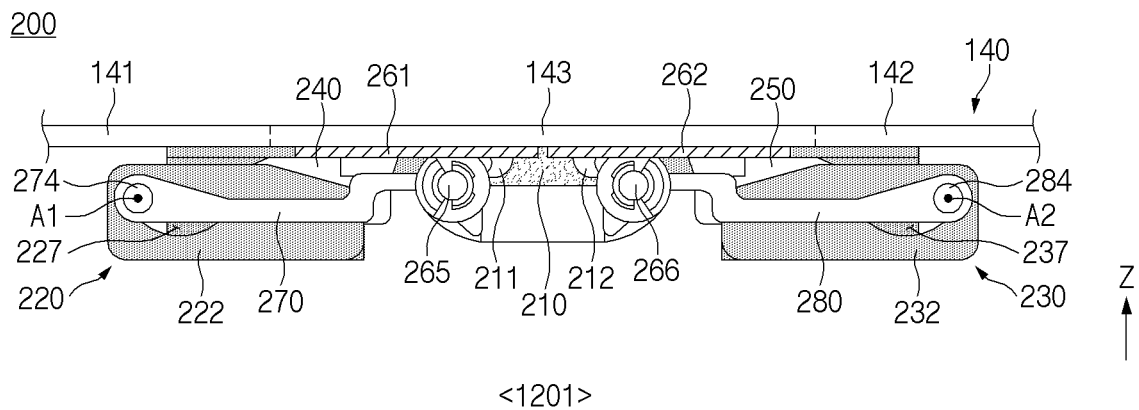
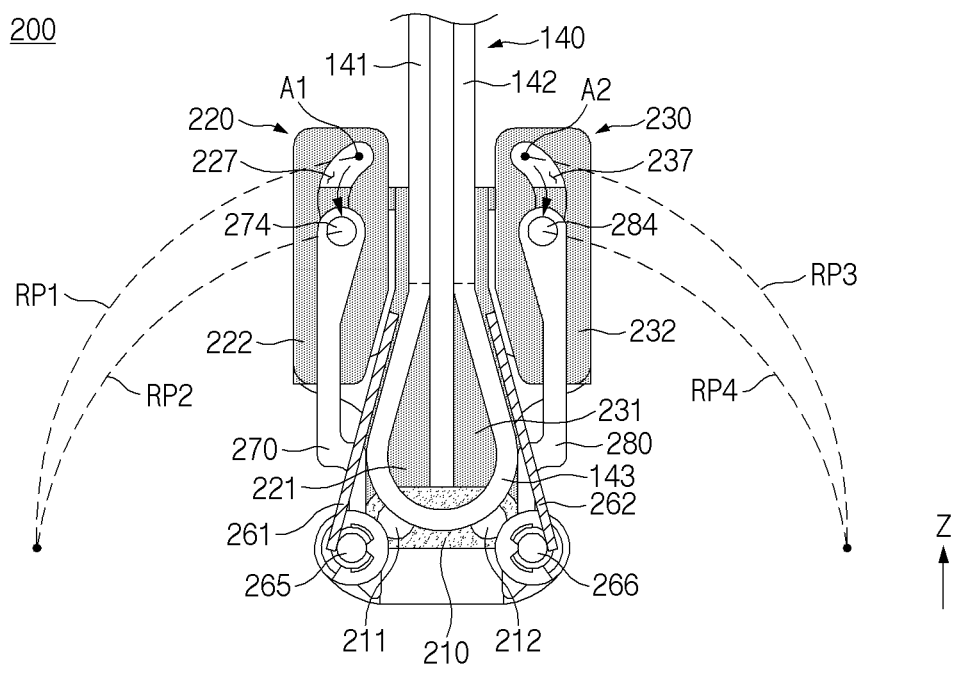
FIG.12

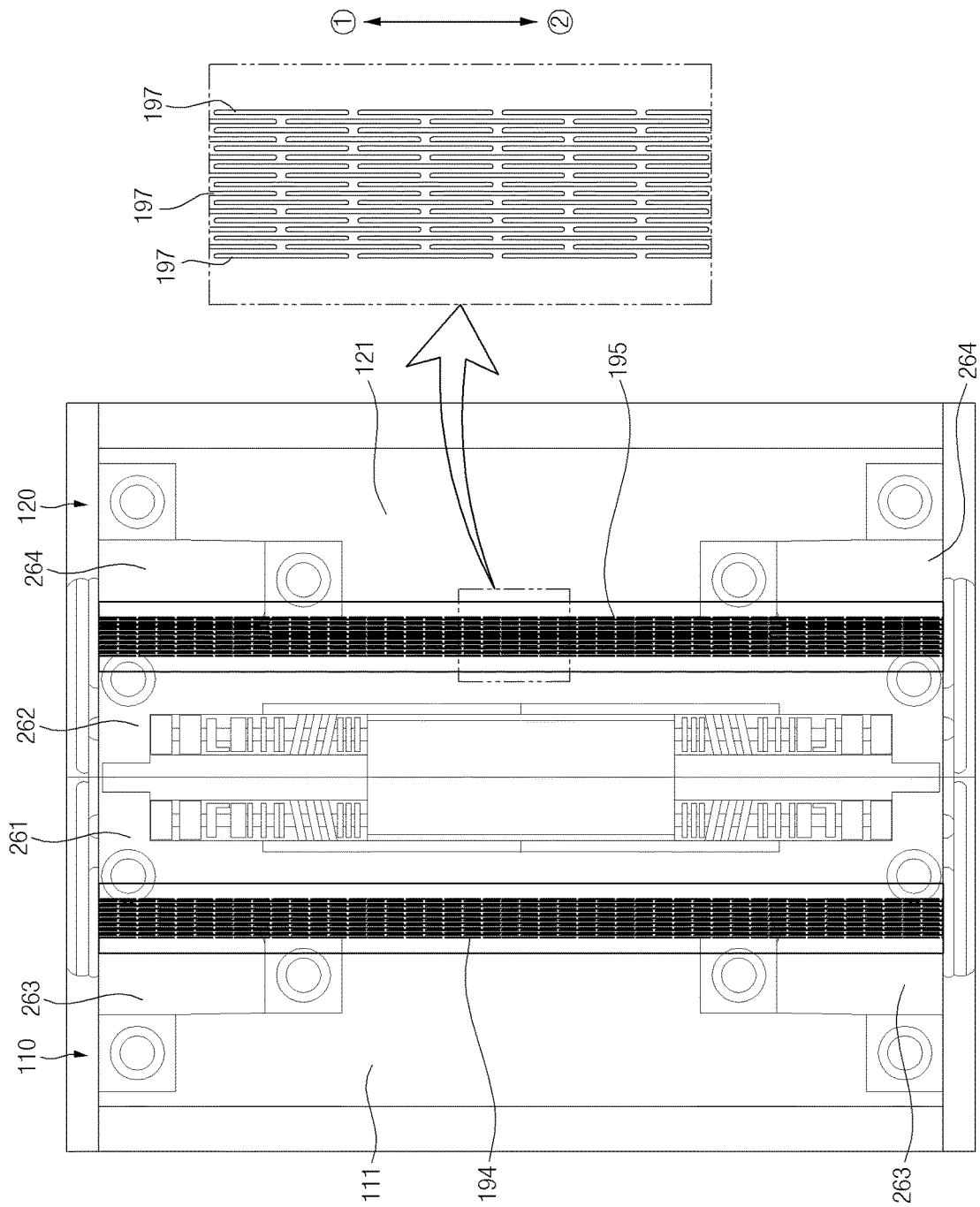

ELECTRONIC DEVICE INCLUDING HINGE STRUCTURE

CROSS-REFERENCE TO RELATED APPLICATION(S)

This application is a continuation application, claiming priority under § 365(c), of an International application No. PCT/KR2021/018437, filed on Dec. 7, 2021, which is based on and claims the benefit of a Korean patent application number 10-2021-0000859, filed on Jan. 5, 2021, in the Korean Intellectual Property Office, the disclosure of which is incorporated by reference herein in its entirety.

BACKGROUND

1. Field

The disclosure relates to an electronic device including a hinge structure.

2. Description of Related Art

A portable electronic device such as a smartphone may provide various functions, such as telephone call, video playback, and Internet search, based on various types of applications. A user may want to use the aforementioned various functions through a wider screen. However, portability may be deteriorated with an increase in the size of the screen of the portable electronic device. Accordingly, a foldable electronic device including a flexible display, a partial area of which is deformable to be curved or flat, is being developed. The foldable electronic device may include a hinge structure to fold or unfold the flexible display.

The hinge structure of the foldable electronic device may be connected with adjacent housings such that the adjacent housings rotate at a predetermined angle. As the adjacent housings rotate, the flexible display may be unfolded or folded.

The above information is presented as background information only to assist with an understanding of the disclosure. No determination has been made, and no assertion is made, as to whether any of the above might be applicable as prior art with regard to the disclosure.

SUMMARY

The foldable electronic device may include the flexible display, at least a partial area (e.g., a folding area) of which is deformable to be curved or flat. When the electronic device is folded, a fold (or crease) may occur in the folding area if the curvature of the folding area is large. Furthermore, when the electronic device is folded, a gap may occur between the housings if the curvature of the folding area is small.

Aspects of the disclosure are to address at least the above-mentioned problems and/or disadvantages and to provide at least the advantages described below. Accordingly, an aspect of the disclosure is to provide a hinge structure including a structure supporting a display to substantially completely close a housing while reducing damage to the display when an electronic device is in a folded state.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first housing and a second housing, a display that extends from the first housing to the second housing, and a hinge structure that rotatably connects the first housing and the second housing. The hinge structure includes a fixed member, a first rotary member coupled to the fixed member so as to be rotatable about a first axis of rotation and connected with the first housing, the first axis of rotation extending parallel to an axial direction, a second rotary member coupled to the fixed member so as to be rotatable about a second axis of rotation parallel to the axial direction and connected with the second housing, a first guide member coupled to the first rotary member so as to be rotatable about a third axis of rotation parallel to the first axis of rotation, a second guide member coupled to the second rotary member so as to be rotatable about a fourth axis of rotation parallel to the second axis of rotation, a first rotary plate that is at least partially coupled to the first guide member to rotate about the third axis of rotation together with the first guide member and that supports a partial area of the display, and a second rotary plate that is at least partially coupled to the second guide member to rotate about the fourth axis of rotation together with the second guide member and that supports another partial area of the display. The hinge structure is configured such that when the first housing and/or the second housing is folded or unfolded, the first rotary member rotates about the first axis of rotation in a first rotational direction, the first guide member and the first rotary plate rotate about the third axis of rotation in the first rotational direction, the second rotary member rotates about the second axis of rotation in a second rotational direction opposite to the first rotational direction, and the second guide member and the second rotary plate rotate about the fourth axis of rotation in the second rotational direction.

In accordance with another aspect of the disclosure, an electronic device is provided. The electronic device includes a housing including a first housing and a second housing, a display that extends from the first housing to the second housing, and a hinge structure that rotatably connects the first housing and the second housing. The hinge structure includes a fixed member, a first rotary member that is coupled to the fixed member so as to be rotatable about a first axis of rotation parallel to an axial direction and connected with the first housing and that includes a first guide protrusion, a second rotary member that is coupled to the fixed member so as to be rotatable about a second axis of rotation parallel to the axial direction and connected with the second housing and that includes a second guide protrusion, a first arm shaft rotatably coupled to the fixed member and parallel to the axial direction, a second arm shaft rotatably coupled to the fixed member and parallel to the axial direction, a first arm that is coupled to the first arm shaft and that rotates together with the first arm shaft, the first arm including a first cam that surrounds the first arm shaft, a second arm that is coupled to the second arm shaft and that rotates together with the second arm shaft, the second arm including a second cam that surrounds the second arm shaft, a cam member coupled to the first arm shaft and the second arm shaft and linearly movable in the axial direction, the cam member including a third cam engaged with the first cam and a fourth cam engaged with the second cam, a first elastic member that is coupled to the first arm shaft and that provides an elastic force to the cam member in the axial direction, a second elastic member that is coupled to the second arm shaft and that provides an elastic force to the cam member in the axial direction, a first guide member that is coupled to the first rotary member so as to be rotatable about a third axis of rotation parallel to the first axis of rotation and that includes a first guide groove having an arc shape in which the first guide protrusion is accommodated, the third axis of rotation being defined as the center of the arc of the first guide groove, a second guide member that is coupled to the second rotary member so as to be rotatable about a fourth axis of rotation parallel to the second axis of rotation and that includes a second guide groove having an arc shape in which the second guide protrusion is accommodated, the fourth axis of rotation being defined as the center of the arc of the second guide groove, a first rotary plate that is coupled to the first guide member to rotate together with the first guide member and that supports a partial area of the display, and a second rotary plate that is coupled to the second guide member to rotate together with the second guide member and that supports another partial area of the display. The first guide member and the second guide member rotate relative to the first rotary member and the second rotary member as the first rotary member and the second rotary member rotate. When viewed in the axial direction, each of the third axis of rotation and the fourth axis of rotation overlaps at least a partial area of the display.

According to the various embodiments of the disclosure, when the electronic device is in a folded state, the display may be supported to form a specified shape (e.g., a waterdrop shape). Accordingly, the curvature of the folding area may be made small, and a fold in the folding area may be decreased.

Furthermore, according to the various embodiments of the disclosure, when the electronic device is in a folded state, the first housing and the second housing may be substantially completely brought into close contact with each other. Accordingly, the exterior aesthetics may be improved.

Moreover, according to the various embodiments of the disclosure, the adhesive area of the display of the electronic device may be formed to be large. Accordingly, the surface quality and/or smoothness of the display may be improved.

In addition, the disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 12 is a view illustrating a folding motion of a hinge structure and a display according to an embodiment of the disclosure;

FIG. 25 is a view illustrating reinforcing plates of an electronic device according to an embodiment of the disclosure;

Throughout the drawings, it should be noted that like reference numerals are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications, of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
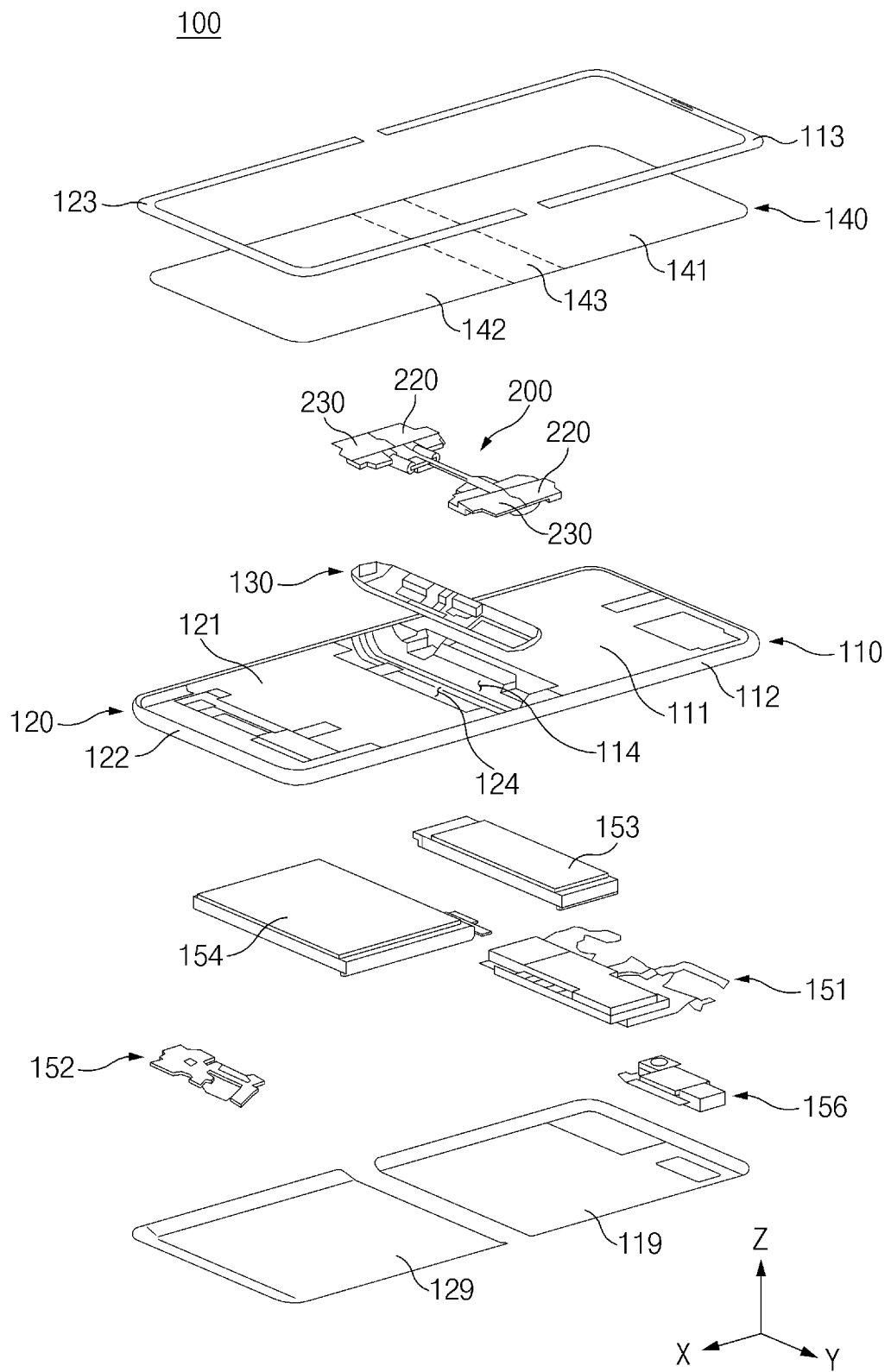
FIG. 1 is an exploded perspective view of an electronic device according to an embodiment of the disclosure.

FIG. 1 is an exploded perspective view of an electronic device according to an embodiment of the disclosure.

Referring to FIG. 1, the electronic device 100 according to an embodiment may include a first housing 110, a second housing 120, a hinge housing 130, a display 140, and a hinge structure 200.

In an embodiment, the first housing 110 may be connected with the second housing 120 using the hinge structure 200. The first housing 110 may include a first plate 111 on which the display 140 is seated and a first frame 112 surrounding at least part of the first plate 111. For example, the first frame 112 may form a part of surfaces (e.g., side surfaces) of the electronic device 100. For example, at least a portion of a first area 141 of the display 140 and at least a portion of a folding area 143 of the display 140 may be disposed on the first plate 111. A first rotary member 220 of the hinge structure 200 may be connected to the first plate 111.

In an embodiment, at least part of the first housing 110 may be attached with the first area 141 of the display 140. Alternatively, part of the periphery of the front surface of the first housing 110 may be attached with the periphery of the first area 141 of the display 140. In this regard, an adhesive layer may be disposed between the first plate 111 of the first housing 110 and the first area 141 of the display 140.

In an embodiment, at least part of the inside of the first housing 110 may be provided in a hollow form. A first circuit board 151, a first battery 153, and a camera module 156 may be disposed in the first housing 110. The first circuit board 151 and the first battery 153 may be electrically connected with a second circuit board 152 and a second battery 154 disposed in the second housing 120 through a flexible circuit board (not illustrated). For example, the flexible circuit board (not illustrated) may extend from a partial area of the first housing 110 to a partial area of the second housing 120 across the hinge housing 130. A partial area of the flexible circuit board (not illustrated) may be located in the hinge housing 130. For example, a processor and a memory may be disposed on the first circuit board 151. For example, the first battery 153 and the first circuit board 151 may be disposed on the first plate 111.

In an embodiment, at least part of the first housing 110 may be formed of a metallic material, or at least part of the first housing 110 may be formed of a non-metallic material. To support at least part of the display 140, the first housing 110 may be formed of a material having a predetermined rigidity. In an embodiment, a portion of the first housing 110 that faces the second housing 120 may include a depression, at least part of which has a predetermined curvature such that the hinge housing 130 is disposed therein.

In various embodiments, the first housing 110 may include a first decorative member 113 surrounding the periphery of the display 140 and a first back cover 119 facing the first plate 111 and forming a surface of the electronic device 100. For example, the first decorative member 113 may be disposed to cover the peripheral portion of the first area 141 of the display 140 and the periphery of part of the folding area 143. For example, in an unfolded state (e.g., refer to FIG. 2A), the first back cover 119 may form the rear surface of the electronic device 100, and the display 140 may form the front surface of the electronic device.

In an embodiment, the second housing 120 may be connected with the first housing 110 through the hinge structure 200. The second housing 120 may include a second plate 121 on which the display 140 is seated and a second frame 122 surrounding at least part of the second plate 121. For example, the second frame 122 may form a part of the surfaces (e.g., the side surfaces) of the electronic device 100. For example, at least a portion of a second area 142 and at least part of the folding area 143 may be disposed on the second plate 121. A second rotary member 230 of the hinge structure 200 may be connected to the second plate 121.

In an embodiment, at least part of the second housing 120 may be attached with the second area 142 of the display 140. Alternatively, part of the periphery of the front surface of the second housing 120 may be attached with the periphery of the second area 142 of the display 140. In this regard, an adhesive layer may be disposed between the second plate 121 of the second housing 120 and the second area 142 of the display 140.

In an embodiment, at least part of the inside of the second housing 120 may be provided in a hollow form. The second circuit board 152 and the second battery 154 may be disposed in the second housing 120. The second circuit board 152 and the second battery 154 may be electrically connected with the first circuit board 151 and/or the first battery 153 disposed in the first housing 110 through the flexible circuit board (not illustrated). For example, the second battery 154 and the second circuit board 152 may be disposed on the second plate 121.

In an embodiment, at least part of the second housing 120 may be formed of a metallic material, or at least part of the second housing 120 may be formed of a non-metallic material. To support at least part of the display 140, the second housing 120 may be formed of a material having a predetermined rigidity. In an embodiment, a portion of the second housing 120 that faces the first housing 110 may include a depression, at least part of which has a predetermined curvature such that the hinge housing 130 is disposed therein.

In various embodiments, the second housing 120 may include a second decorative member 123 surrounding the periphery of the display 140 and a second back cover 129 facing the second plate 121 and forming a surface of the electronic device 100. For example, the second decorative member 123 may be disposed to cover the peripheral portion of the second area 142 of the display 140 and the periphery of part of the folding area 143. For example, in an unfolded state (e.g., refer to FIG. 2A), the second back cover 129 may form the rear surface of the electronic device 100, and the display 140 may form the front surface of the electronic device.

In various embodiments, the electronic device 100 may further include a lattice structure (not illustrated) (e.g., reinforcing plates 194 and 195 of FIGS. 25, 26A, and 26B) and/or a bracket (not illustrated) disposed between the display 140 and the adhesive layers. The lattice structure may include a slit area including a plurality of slits at least partially overlapping the folding area 143. The plurality of slits may extend in the extension direction (e.g., the y-axis) of the folding area 143. The plurality of slits may support the folding area 143 that is flat in an unfolded state (e.g., refer to FIG. 2A) and may support deformation of the folding area 143 in a folding motion or an unfolding motion. In various embodiments, only part of the lattice structure or the bracket may be stacked on the display 140.

In an embodiment, the hinge housing 130 may be disposed in the depressions of the first housing 110 and the second housing 120. The hinge housing 130 may have a form extending in the y-axis direction as a whole. Bosses for fixing the hinge structure 200 may be disposed on partial areas of the inside surface of the hinge housing 130.

In an embodiment, at least part of the display 140 may have flexibility. For example, the display 140 may include the first area 141 disposed on the first housing 110, the second area 142 disposed on the second housing 120, and the folding area 143 located between the first area 141 and the second area 142. In an embodiment, the first area 141 and the second area 142 may be formed to be flat, and the folding area 143 may be formed such that at least part thereof is deformable to be flat or curved.

According to various embodiments, the hinge structure 200 may include the first rotary member 220 connected to the first housing 110 and the second rotary member 230 connected to the second housing 120. The hinge structure 200 may be configured such that the first rotary member 220 and the second rotary member 230 are rotatable about axes of rotation thereof (e.g., axes parallel to the y-axis direction). For example, when the first housing 110 and the second housing 120 are folded or unfolded, the first rotary member 220 and the second rotary member 230 may rotate about the axes of rotation thereof.

Figure 2A:
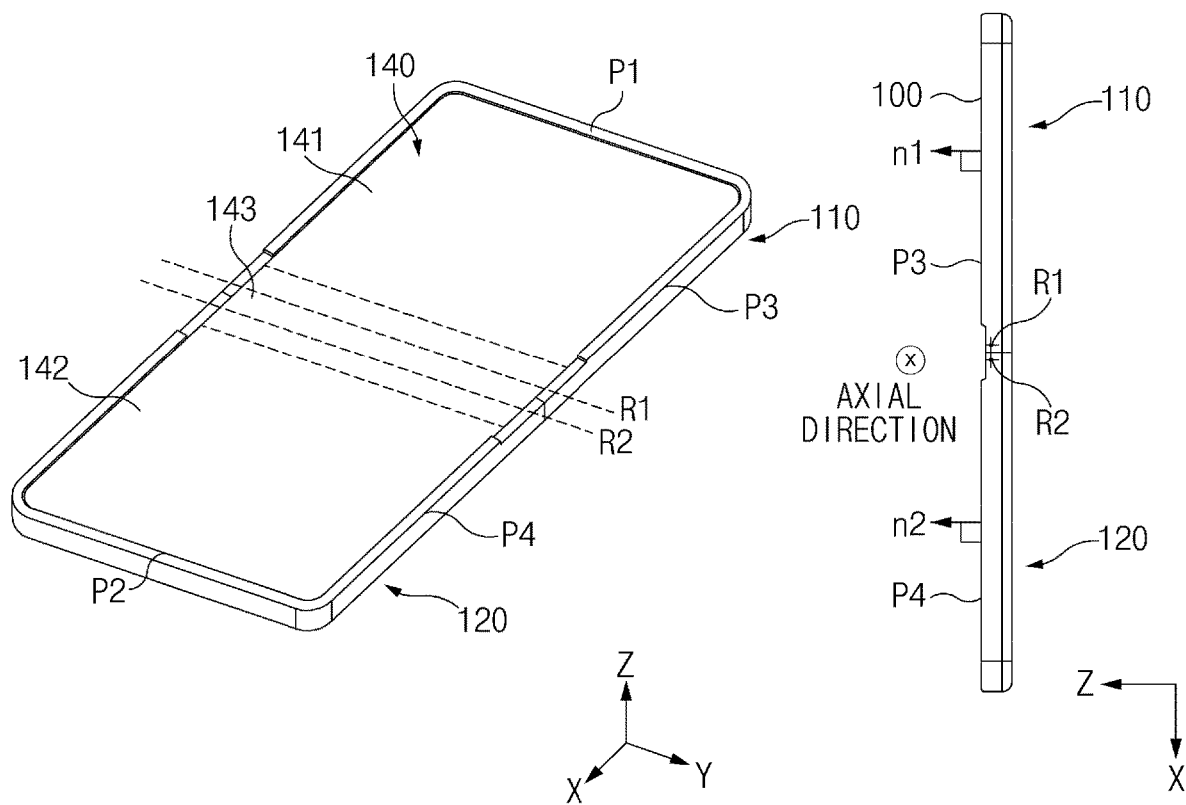
FIG. 2A is a view illustrating an unfolded state of an electronic device according to an embodiment of the disclosure.

FIG. 2A is a view illustrating an unfolded state of an electronic device according to an embodiment of the disclosure.

Figure 2B:
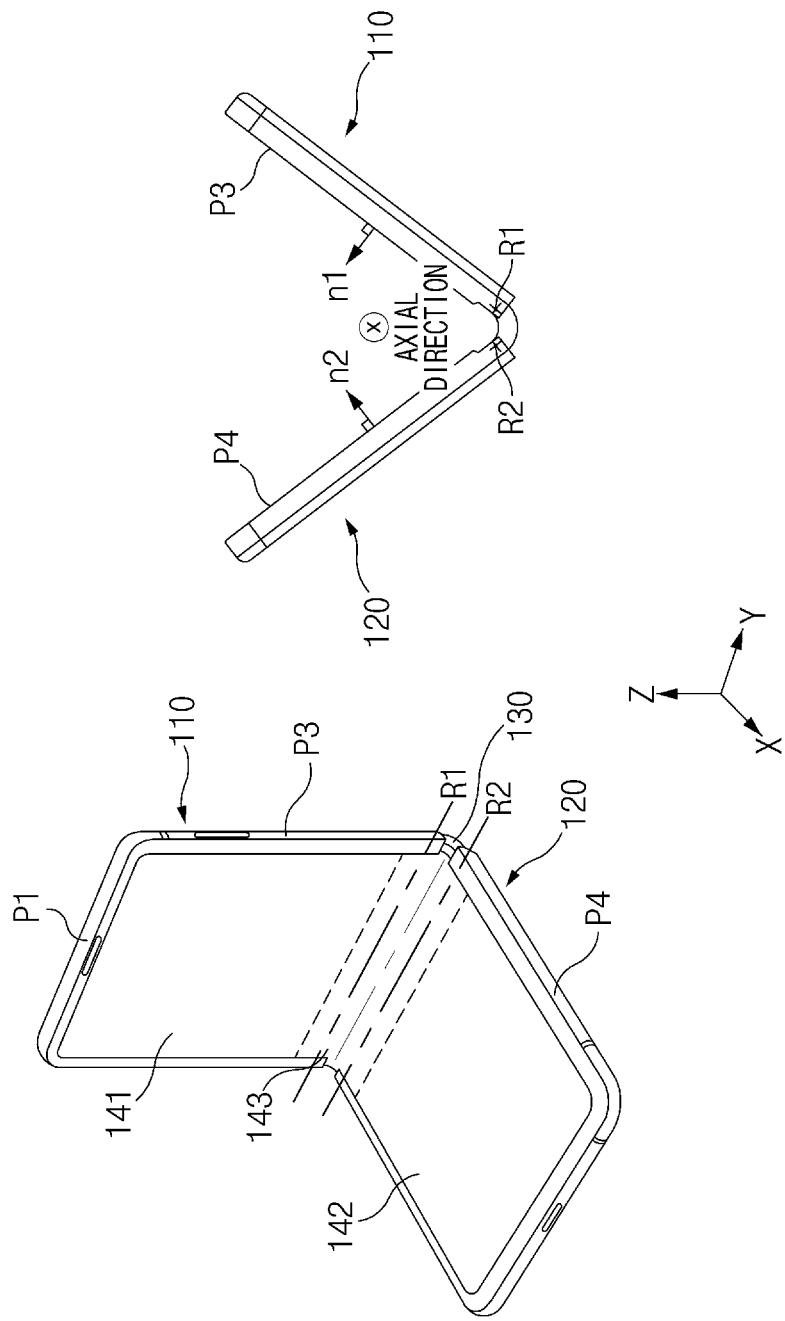
FIG. 2B is a view illustrating an intermediate folded state of an electronic device according to an embodiment of the disclosure.

FIG. 2B is a view illustrating an intermediate folded state of an electronic device according to an embodiment of the disclosure.

Figure 2C:
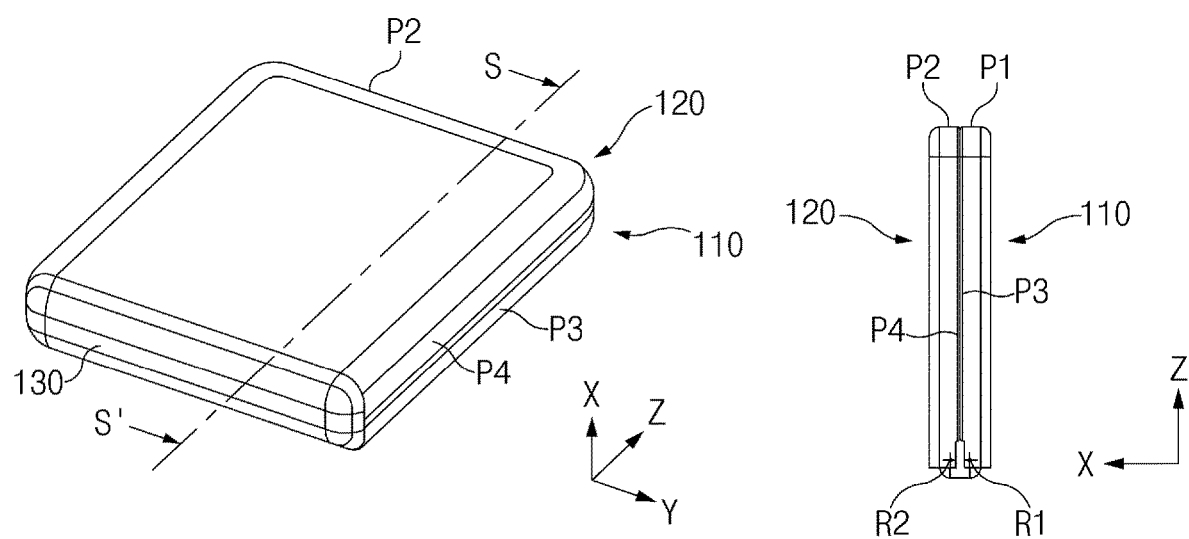
FIG. 2C is a view illustrating a fully folded state of an electronic device according to an embodiment of the disclosure.

FIG. 2C is a view illustrating a fully folded state of an electronic device according to an embodiment of the disclosure.

Referring to FIGS. 2A, 2B, and 2C, the electronic device 100 according to an embodiment may be configured such that the first housing 110 and the second housing 120 rotate about axes of rotation R1 and R2 in opposite directions. For example, in a folding motion performed in the unfolded state (the state of FIG. 2A), based on the drawing, the first housing 110 may rotate in the counterclockwise direction, and the second housing 120 may rotate in the clockwise direction.

In an embodiment, an axial direction parallel to the axes of rotation of the first housing 110 and the second housing 120 may be defined. The axial direction may be defined as the extension direction of the folding area 143 of the display 140. For example, the axial direction may be defined as the direction of the long sides of the folding area 143. For example, the axial direction may refer to the direction parallel to the y-axis.

To describe a state of the electronic device 100 according to an embodiment of the disclosure, a first edge P1 of the electronic device 100 and a second edge P2 of the electronic device 100 that are parallel to the axial direction may be defined. To describe a state of the electronic device 100, a third edge P3 of the electronic device 100 and a fourth edge P4 of the electronic device 100 that are perpendicular to the axial direction may be defined. For example, the first edge P1 and the third edge P3 may include part of the first frame (e.g., the first frame 112 of FIG. 1) of the first housing 110. For example, the second edge P2 and the fourth edge P4 may include part of the second frame (e.g., the second frame 122 of FIG. 1) of the second housing 120.

The unfolded state of the electronic device 100 will be described below with reference to FIG. 2A.

For example, the unfolded state may include the state in which the folding area 143 of the display 140 is flat. For example, the unfolded state may include the state in which the first area 141 and the second area 142 of the display 140 face the same direction. For example, the unfolded state may include the state in which a first normal vector n1 of the first area 141 and a second normal vector n2 of the second area 142 of the display 140 are parallel to each other. For example, the unfolded state may include the state in which the third edge P3 and the fourth edge P4 form substantially one straight line. For example, the unfolded state may include the state in which the third edge P3 and the fourth edge P4 form an angle of 180 degrees.

The intermediate folded state of the electronic device 100 will be described below with reference to FIG. 2B.

For example, the intermediate folded state (or, the intermediate state) may include the state in which the folding area 143 of the display 140 is curved. For example, the intermediate folded state may include the state in which the first normal vector n1 of the first area 141 and the second normal vector n2 of the second area 142 form a certain angle rather than 180 degrees. For example, the intermediate folded state may include the state in which the third edge P3 and the fourth edge P4 form a certain angle rather than 180 degrees.

The substantially fully folded state of the electronic device 100 will be described below with reference to FIG. 2C.

For example, the substantially fully folded state may refer to the state in which the first edge P1 and the second edge P2 substantially make contact with each other, among folded states. For example, the substantially fully folded state may refer to the state in which the third edge P3 and the fourth edge P4 substantially make contact with each other. For example, in the substantially fully folded state, the third edge P3 and the fourth edge P4 may face each other in parallel. For example, the substantially fully folded state may include the state in which the third edge P3 and the fourth edge P4 form an angle of about 0 degrees. For example, the folding area 143 in the substantially fully folded state may be curved with a curvature greater than that of the folding area 143 in the intermediate folded state.

In various embodiments, the intermediate folded state of the electronic device 100 may be construed as including any states defined between the unfolded state and the substantially fully folded state. For example, the intermediate folded state may include states in which the included angle between the third edge P3 and the fourth edge P4 is more than 0 degrees and less than 180 degrees.

Referring to FIGS. 2B and 2C, in the intermediate folded state and the fully folded state, at least part of the hinge housing 130 may form the exterior (or, a surface) of the electronic device 100. For example, the hinge housing 130 may be visually exposed between the first housing 110 and the second housing 120 when the electronic device 100 is in the intermediate folded state or the fully folded state.

Figure 3:
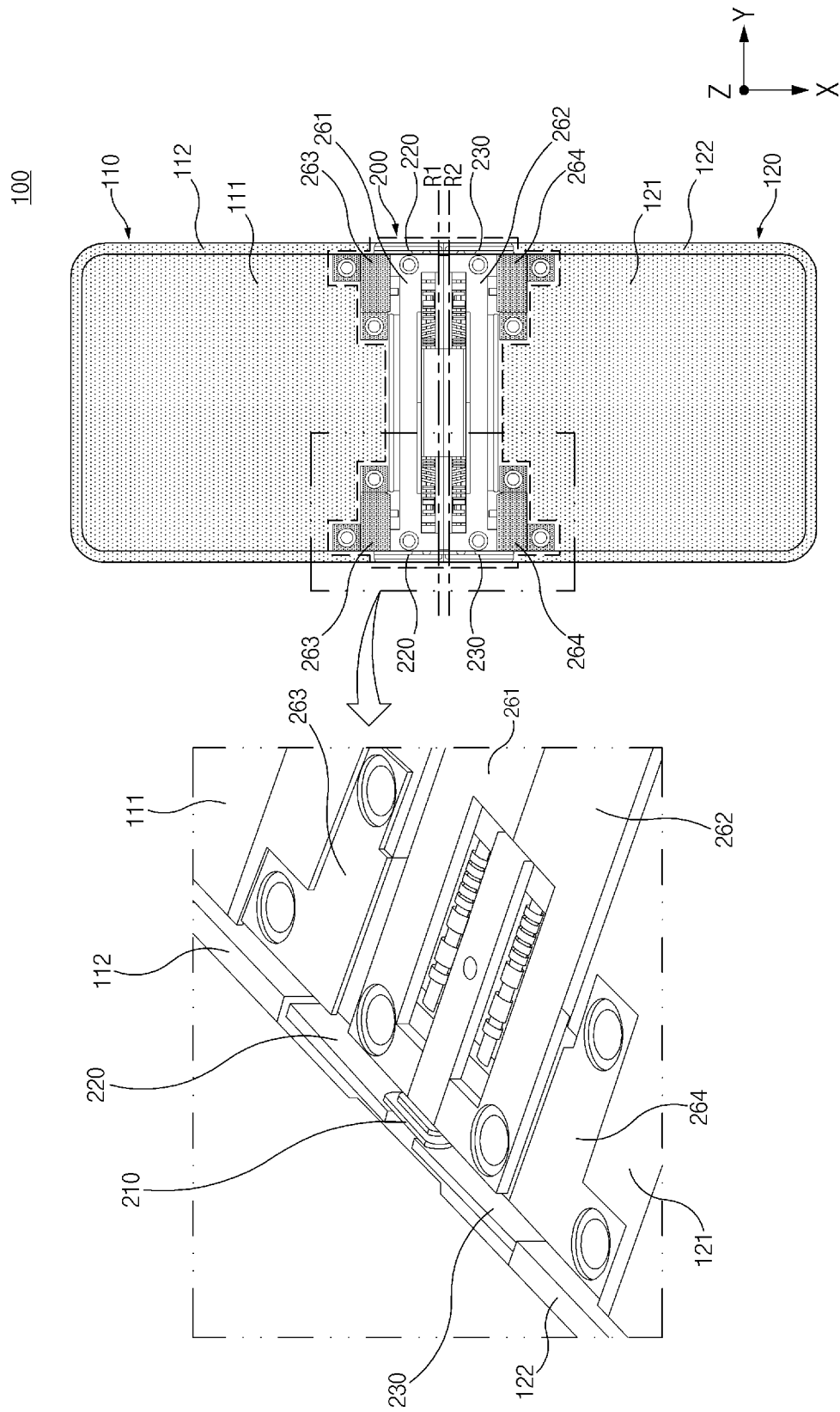
FIG. 3 is a view illustrating part of an electronic device according to an embodiment of the disclosure.

FIG. 3 is a view illustrating part of an electronic device according to an embodiment of the disclosure.

Referring to FIG. 3, the electronic device 100 according to an embodiment may include the first housing 110, the second housing 120, and the hinge structure 200. The hinge structure 200 may rotatably connect the first housing 110 and the second housing 120.

FIG. 3 may be a view in which the display 140 is omitted from the electronic device 100 of FIG. 1 to represent a coupling structure between the housings 110 and 120 and the hinge structure 200.

In an embodiment, the hinge structure 200 may include a fixed member 210, the first rotary member 220, the second rotary member 230, a first rotary plate 261, a second rotary plate 262, a first fixed plate 263, and a second fixed plate 264.

In an embodiment, the fixed member 210 may be fixed between the first housing 110 and the second housing 120. For example, the fixed member 210 may be fixedly disposed in the hinge housing (e.g., the hinge housing 130 of FIGS. 1, 2B, and 2C) that is disposed in the depressions of the first housing 110 and the second housing 120. The first rotary member 220 and the second rotary member 230 may be coupled to the fixed member 210 so as to be rotatable about the axes of rotation R1 and R2.

In an embodiment, the first rotary member 220 may be coupled to the fixed member 210 so as to be rotatable about the first axis of rotation R1. The first rotary member 220 may be connected to the first plate 111 to rotate together with the first housing 110. For example, when the electronic device 100 is folded or unfolded, the first rotary member 220 may rotate about the first axis of rotation R1 together with the first housing 110.

In an embodiment, the second rotary member 230 may be coupled to the fixed member 210 so as to be rotatable about the second axis of rotation R2. The second rotary member 230 may be connected to the second plate 121 to rotate together with the second housing 120. For example, when the electronic device 100 is folded or unfolded, the second rotary member 230 may rotate about the second axis of rotation R2 together with the second housing 120.

In an embodiment, the first axis of rotation R1 of the first rotary member 220 and the second axis of rotation R2 of the second rotary member 230 may be parallel to each other. For example, part of the first rotary member 220 may be rotatably coupled to part of the fixed member 210 by a connecting member (or, a rivet) (e.g., a first connecting shaft 211 of FIGS. 4 to 7), and the first axis of rotation R1 may be formed by the connecting member. For example, part of the second rotary member 230 may be rotatably coupled to another part of the fixed member 210 by a connecting member (e.g., a second connecting shaft 212 of FIGS. 4 to 7), and the second axis of rotation R2 may be formed by the connecting member.

In an embodiment, the first rotary plate 261 may be connected to the first rotary member 220. For example, the first rotary plate 261 may be connected so as to be rotatable relative to the first rotary member 220. The first rotary plate 261 may support at least a partial area of the display (e.g., the display 140 of FIG. 1). For example, when the electronic device 100 is folded or unfolded, the first rotary plate 261 may support the display 140 while rotating relative to the first rotary member 220. Although not illustrated, the first rotary plate 261 may be configured to rotate about a virtual third axis of rotation (not illustrated) relative to the first rotary member 220. For example, the virtual third axis of rotation may be parallel to the first axis of rotation R1 and may be spaced apart from the first axis of rotation R1 in a direction (e.g., the −x-axis direction) toward the first plate 111 when the first plate 111 is viewed from above.

In an embodiment, the second rotary plate 262 may be connected to the second rotary member 230. For example, the second rotary plate 262 may be connected so as to be rotatable relative to the second rotary member 230. The second rotary plate 262 may support at least a partial area of the display 140. For example, when the electronic device 100 is folded or unfolded, the second rotary plate 262 may support the display 140 while rotating relative to the second rotary member 230. Although not illustrated, the second rotary plate 262 may be configured to rotate about a virtual fourth axis of rotation (not illustrated) relative to the second rotary member 230. For example, the virtual fourth axis of rotation may be parallel to the second axis of rotation R2 and may be spaced apart from the second axis of rotation R2 in a direction (e.g., the +x-axis direction) toward the second plate 121 when the second plate 121 is viewed from above.

In an embodiment, the first fixed plate 263 may be coupled to a partial area of the first plate 111 of the first housing 110. The first fixed plate 263 may form substantially the same plane as the first plate 111. For example, the first fixed plate 263, together with the first plate 111 and the first rotary plate 261, may support a partial area (e.g., the first area 141) of the display 140. For example, at least part of the display 140 may be attached to the first fixed plate 263. For example, an adhesive layer (not illustrated) may be disposed between a partial area of the display 140 and the first fixed plate 263.

In an embodiment, the second fixed plate 264 may be coupled to a partial area of the second plate 121 of the second housing 120. The second fixed plate 264 may form substantially the same plane as the second plate 121. For example, the second fixed plate 264, together with the second plate 121 and the second rotary plate 262, may support a partial area (e.g., the second area 142) of the display 140. For example, at least part of the display 140 may be attached to the second fixed plate 264. For example, an adhesive layer (not illustrated) may be disposed between a partial area of the display 140 and the second fixed plate 264.

In an embodiment, the electronic device 100 may be configured such that the frames 112 and 122 of the housings 110 and 120 protrude above the plates 111 and 121. For example, the first frame 112 may protrude from the periphery of the first plate 111 to a specified height in a direction (e.g., the +z-axis direction) substantially perpendicular to the first plate 111. For example, the second frame 122 may protrude from the periphery of the second plate 121 to a specified height in a direction (e.g., the +z-axis direction) substantially perpendicular to the second plate 121. The first frame 112 and the second frame 122 may protrude above the display 140 when the display 140 is disposed on the first plate 111 and the second plate 121. For example, when the first frame 112 and the second frame 122 make contact with each other in a fully folded state, the first plate 111 and the second plate 121 may be spaced apart from each other at a specified interval, and the display 140 may be configured such that the first area (e.g., the first area 141 of FIG. 1) and the second area (e.g., the second area 142 of FIG. 1) are spaced apart from each other.

Figure 4:
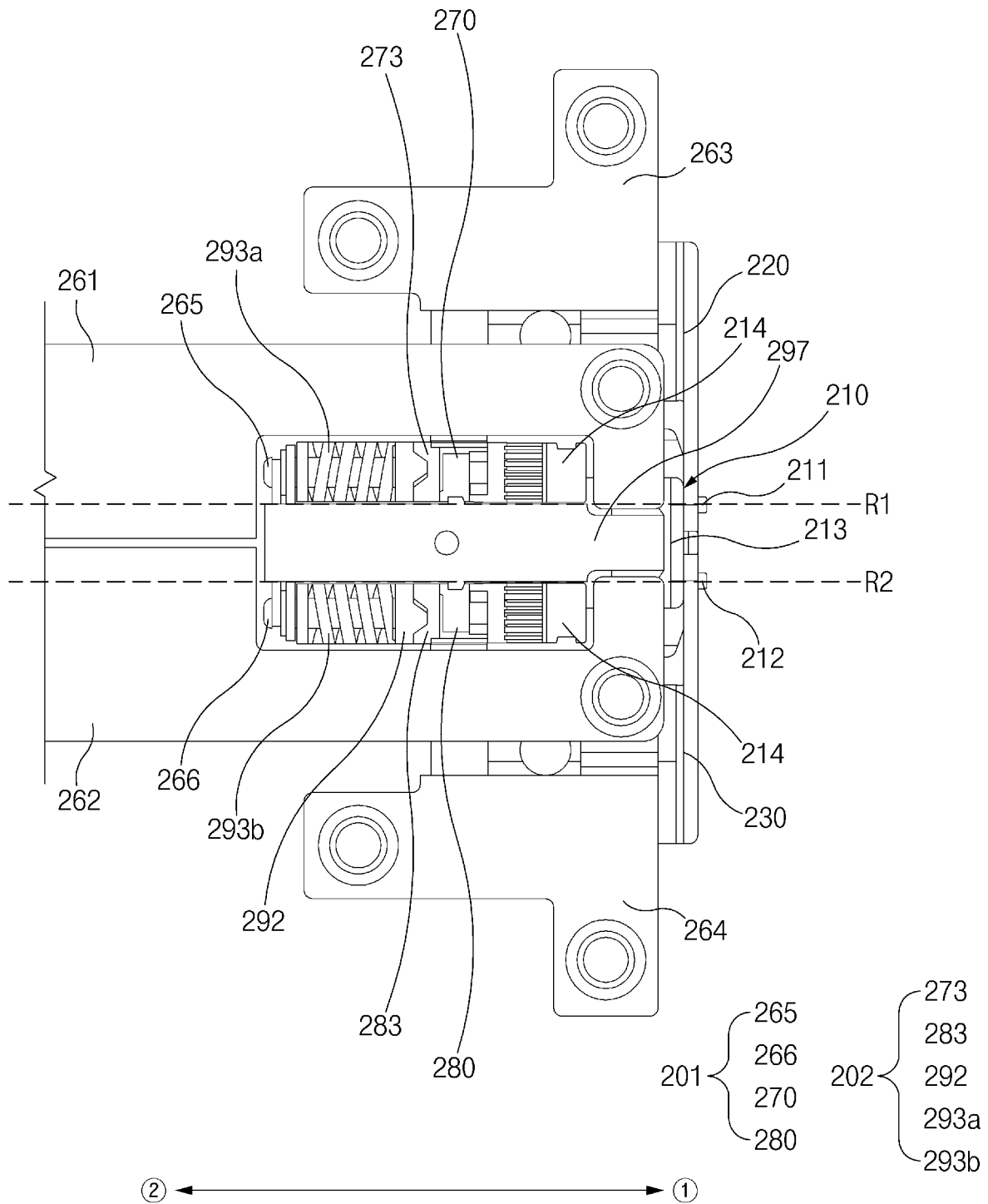
FIG. 4 is a view illustrating a hinge structure according to an embodiment of the disclosure.

FIG. 4 is a view illustrating a hinge structure according to an embodiment of the disclosure.

Figure 5:
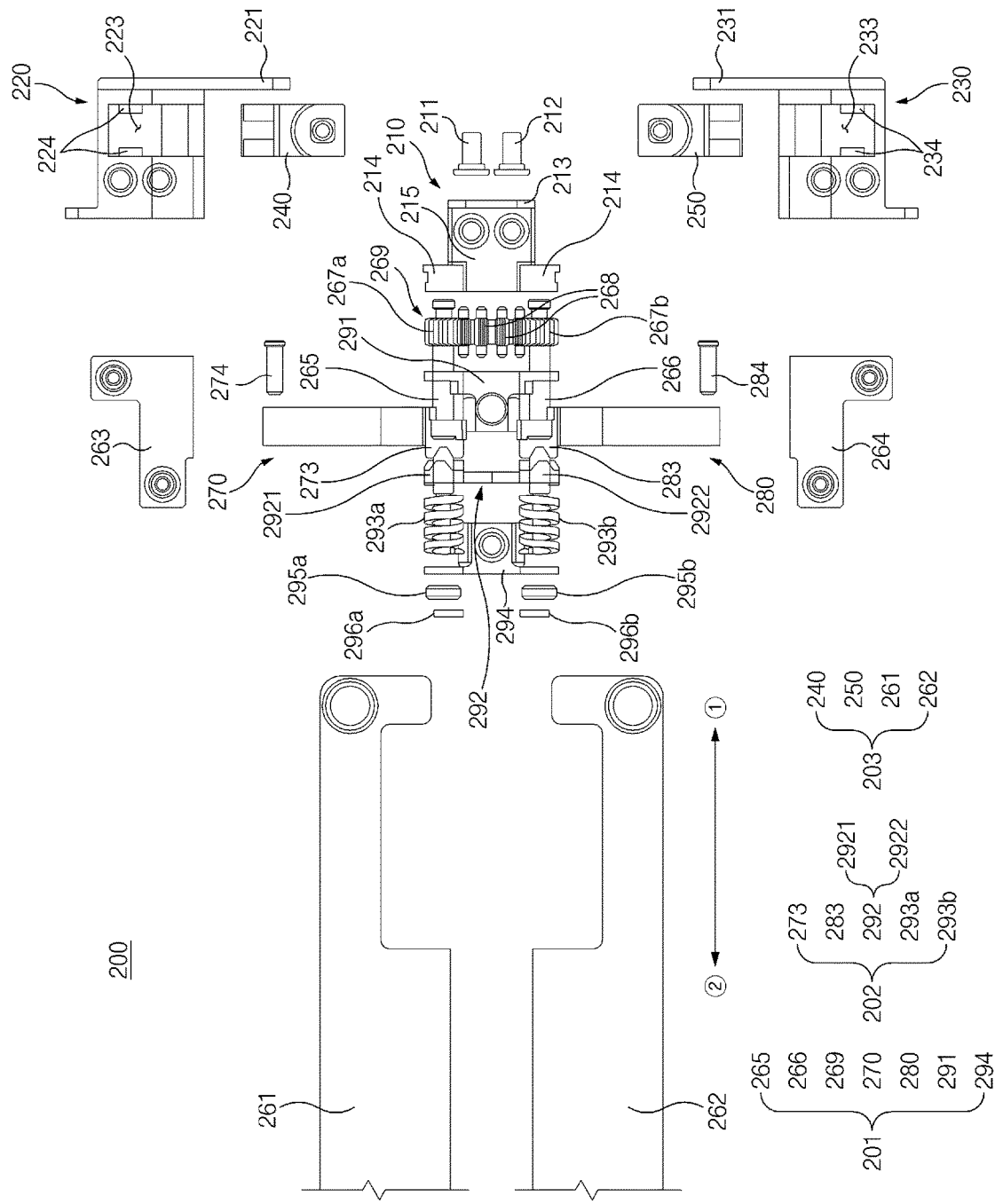
FIG. 5 is a view illustrating a hinge structure according to an embodiment of the disclosure.

FIG. 5 is a view illustrating a hinge structure according to an embodiment of the disclosure.

Figure 6:
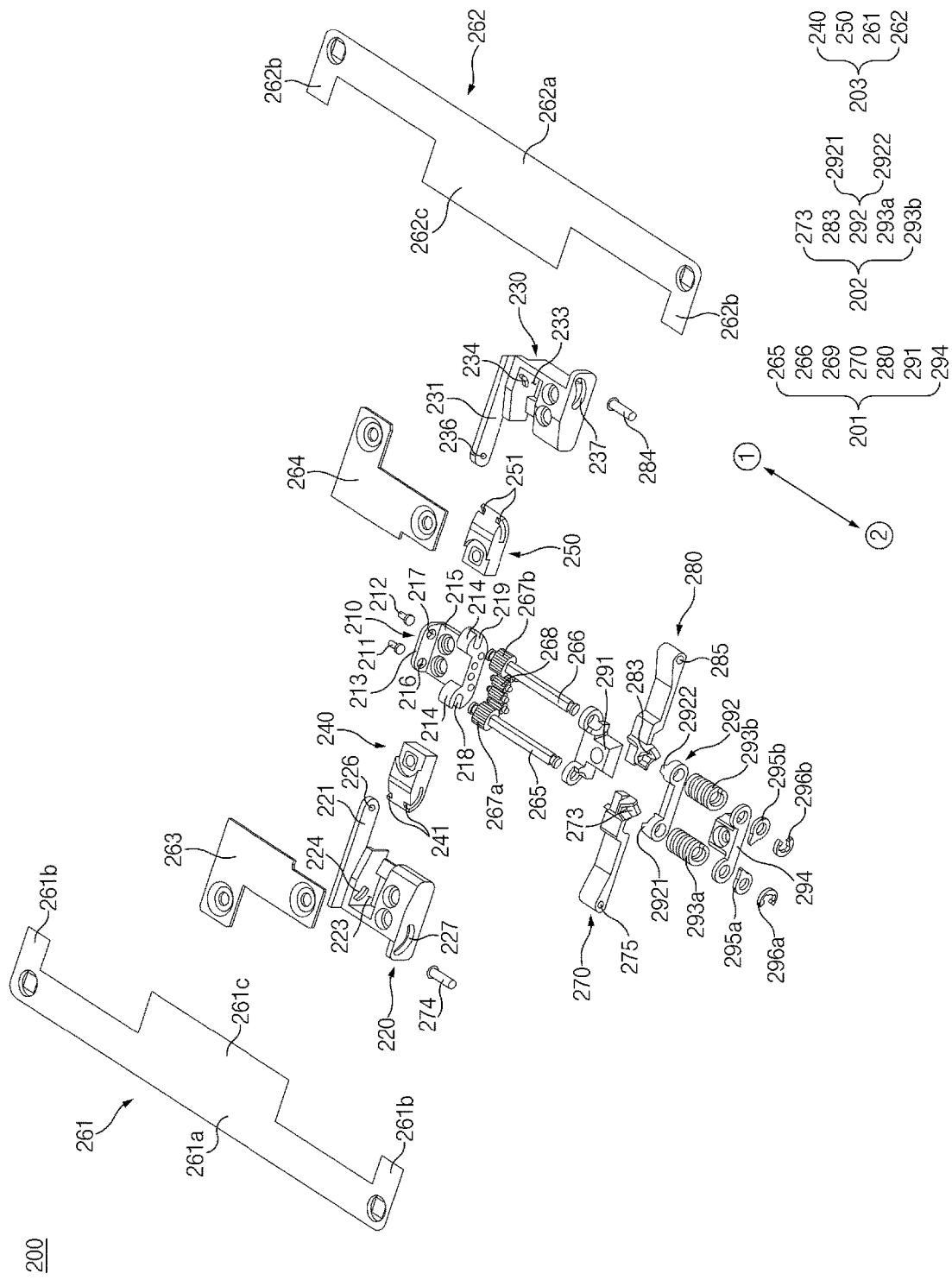
FIG. 6 is a view illustrating a hinge structure according to an embodiment of the disclosure.

FIG. 6 is a view illustrating a hinge structure according to an embodiment of the disclosure.

Referring to FIGS. 4 to 6, the hinge structure 200 according to an embodiment may include the fixed member 210, the first rotary member 220, the second rotary member 230, an interlocking structure 201, a friction structure 202, a support structure 203, the first fixed plate 263, and the second fixed plate 264.

As illustrated in FIGS. 4 to 6, axial directions may be defined in the hinge structure 200. The axial directions may be parallel to the extension direction of the first axis of rotation R1 and the second axis of rotation R2. A first axial direction ① may a direction toward the fixed member 210, and a second axial direction ② may be a direction opposite to the first axial direction ① (or, a direction toward a shaft bracket 294).

In an embodiment, at least part of the fixed member 210 may be fixedly disposed in the hinge housing (e.g., the hinge housing 130 of FIG. 1). The first rotary member 220 and the second rotary member 230 may be rotatably coupled to one portion (e.g., a first coupling portion 213) of the fixed member 210. A first arm shaft 265 and a second arm shaft 266 may be rotatably coupled to another portion (e.g., a second coupling portion 214) of the fixed member 210.

In an embodiment, the fixed member 210 may include the first coupling portion 213 to which the first rotary member 220 and the second rotary member 230 are coupled. For example, a first extension 221 of the first rotary member 220 may be rotatably coupled to part of the first coupling portion 213 through the first connecting shaft 211. A second extension 231 of the second rotary member 230 may be rotatably coupled to another part of the first coupling portion 213 through the second connecting shaft 212.

In an embodiment, the first coupling portion 213 of the fixed member 210 may have a first through-hole 216 formed therein into which the first connecting shaft 211 is inserted. The first through-hole 216 may be formed through a partial area of the first coupling portion 213 in the axial directions. The first connecting shaft 211 may be inserted into the first through-hole 216 of the first coupling portion 213 and a third through-hole 226 of the first rotary member 220 to rotatably couple the first rotary member 220 to the fixed member 210. For example, the first connecting shaft 211 may be fixed to the fixed member 210, or may be inserted into the first through-hole 216 so as to be rotatable. The first connecting shaft 211 may be fixed to the first rotary member 220, or may be inserted into the third through-hole 226 so as to be rotatable. For example, the first connecting shaft 211 may include a rivet.

In an embodiment, the first coupling portion 213 of the fixed member 210 may have a second through-hole 217 formed therein into which the second connecting shaft 212 is inserted. The second through-hole 217 may be formed through a partial area of the first coupling portion 213 in the axial directions. For example, the second through-hole 217 may be spaced apart from the first through-hole 216 in a direction perpendicular to the axial directions. The second connecting shaft 212 may be inserted into the second through-hole 217 of the first coupling portion 213 and a fourth through-hole 236 of the second rotary member 230 to rotatably couple the second rotary member 230 to the fixed member 210. For example, the second connecting shaft 212 may be fixed to the fixed member 210, or may be inserted into the second through-hole 217 so as to be rotatable. The second connecting shaft 212 may be fixed to the second rotary member 230, or may be inserted into the fourth through-hole 236 so as to be rotatable. For example, the second connecting shaft 212 may include various coupling members (or, fastening members) including a rivet, a bolt, or a pin.

In an embodiment, the fixed member 210 may include the second coupling portion 214 to which the first arm shaft 265 and the second arm shaft 266 are coupled. The second coupling portion 214 may face the first coupling portion 213 in the axial directions. The first arm shaft 265 and the second arm shaft 266 may be rotatably coupled to the second coupling portion 214. For example, a first opening 218 may be formed in part of the second coupling portion 214, and the first arm shaft 265 may be inserted into the first opening 218 so as to be rotatable. A second opening 219 may be formed in another part of the second coupling portion 214, and the second arm shaft 266 may be inserted into the second opening 219 so as to be rotatable. In various embodiments, the openings 218 and 219 may be formed in a groove or hole shape such that at least parts of the arm shafts 265 and 266 are inserted into or accommodated in the openings 218 and 219.

In an embodiment, the first rotary member 220 may be configured to rotate about the first axis of rotation R1 relative to the fixed member 210, which is fixed to the hinge housing 130, when the first housing (e.g., the first housing 110 of FIGS. 1, 2A, 2B, 2C, and 3) is folded or unfolded. For example, the first rotary member 220 may be coupled to the fixed member 210 through the first connecting shaft 211 and may rotate about the first connecting shaft 211 relative to the fixed member 210. The first axis of rotation R1 of the first rotary member 220 may be formed by the first connecting shaft 211. For example, the first axis of rotation R1 may be defined as a virtual straight line extending in the axial directions to pass through the center of the first connecting shaft 211.

In an embodiment, the first rotary member 220 may include the first extension 221 rotatably coupled to the fixed member 210. For example, the first extension 221 may have the third through-hole 226 formed therein into which the first connecting shaft 211 is inserted. In an embodiment, a first guide member 240 may be coupled to the first rotary member 220 so as to be rotatable along a predetermined path. The first rotary member 220 may include first guide protrusions 224 for guiding the rotational path of the first guide member 240. For example, the first rotary member 220 may have a first opening area 223 formed therein in which the first guide member 240 is accommodated, and the first guide protrusions 224 may be formed on inside surfaces of the first opening area 223.

In an embodiment, the second rotary member 230 may be configured to rotate about the second axis of rotation R2 relative to the fixed member 210, which is fixed to the hinge housing 130, when the second housing (e.g., the second housing 120 of FIGS. 1, 2A, 2B, 2C, and 3) is folded or unfolded. For example, the second rotary member 230 may be coupled to the fixed member 210 through the second connecting shaft 212 and may rotate about the second connecting shaft 212 relative to the fixed member 210. The second axis of rotation R2 of the second rotary member 230 may be formed by the second connecting shaft 212. For example, the second axis of rotation R2 may be defined as a virtual straight line extending in the axial directions to pass through the center of the second connecting shaft 212.

In an embodiment, the second rotary member 230 may include the second extension 231 rotatably coupled to the fixed member 210. For example, the second extension 231 may have the fourth through-hole 236 formed therein into which the second connecting shaft 212 is inserted. In an embodiment, a second guide member 250 may be coupled to the second rotary member 230 so as to be rotatable along a predetermined path. The second rotary member 230 may include second guide protrusions 234 for guiding the rotational path of the second guide member 250. For example, the second rotary member 230 may have a second opening area 233 formed therein in which the second guide member 250 is accommodated, and the second guide protrusions 234 may be formed on inside surfaces of the second opening area 233.

In an embodiment, the interlocking structure 201 may include the first arm shaft 265, the second arm shaft 266, a first arm 270, a second arm 280, a gear member 269, the shaft bracket 294, and a stopper 291. For example, when the electronic device 100 is folded or unfolded, the interlocking structure 201 may interlock the first rotary member 220 and the second rotary member 230 such that the first rotary member 220 and the second rotary member 230 rotate in opposite directions by the same angle.

In an embodiment, the first arm shaft 265 may be rotatably coupled to the fixed member 210. For example, at least part of one end portion (e.g., an end portion facing the first axial direction ①) of the first arm shaft 265 may be rotatably inserted into the first opening 218 formed in the second coupling portion 214.

In an embodiment, a first fixing ring 296*a* may be coupled to an opposite end portion (e.g., an end portion facing the second axial direction ②) of the first arm shaft 265. The first fixing ring 296*a* may fix the shaft bracket 294 such that the shaft bracket 294 is not separated from the first arm shaft 265 in the axial directions (e.g., the second axial direction ②). A first support ring 259*a* may be coupled to the end portion of the first arm shaft 265 that faces the second axial direction ②. The first support ring 295*a*, together with the first arm shaft 265, may rotate in the same direction as the rotational direction of the first arm shaft 265, and in an unfolded state, the first support ring 295*a* may support a center bar 297. For example, the fixed member 210, the stopper 291, the first arm 270, a cam member 292, a first elastic member 293*a*, the shaft bracket 294, the first support ring 295*a*, and the first fixing ring 296*a* may be coupled to the first arm shaft 265 in the second axial direction ②.

In an embodiment, the first arm 270 may be coupled to the first arm shaft 265 so as to rotate about the first arm shaft 265. The first arm 270 may be coupled to the first rotary member 220 to rotate about the first arm shaft 265 while sliding relative to the first rotary member 220 when the first rotary member 220 rotates. For example, the first arm 270 may be slidably coupled to the first rotary member 220 through a first sliding pin 274. For example, the first sliding pin 274 may be inserted into a first sliding groove 227 of the first rotary member 220 and a first pin hole 275 of the first arm 270 and may slidably connect the first arm 270 to the first rotary member 220.

In an embodiment, the second arm shaft 266 may be rotatably coupled to the fixed member 210. For example, at least part of one end portion (e.g., an end portion facing the first axial direction ①) of the second arm shaft 266 may be rotatably coupled to the second coupling portion 214 of the fixed member 210. For example, the end portion of the second arm shaft 266 that faces the first axial direction ① may be rotatably inserted into the second opening 219 formed in the second coupling portion 214.

In an embodiment, a second fixing ring 296*b* may be coupled to an opposite end portion (e.g., an end portion facing the second axial direction ②) of the second arm shaft 266. The second fixing ring 296*b* may fix the shaft bracket 294 such that the shaft bracket 294 is not separated from the second arm shaft 266 in the axial directions (e.g., the second axial direction ②). A second support ring 295*b* may be coupled to the end portion of the second arm shaft 266 that faces the second axial direction ②. The second support ring 295*b*, together with the second arm shaft 266, may rotate in the same direction as the rotational direction of the second arm shaft 266, and in an unfolded state, the second support ring 295*b* may support the center bar 297 together with the first support ring 295*a*. For example, the fixed member 210, the stopper 291, the second arm 280, the cam member 292, a second elastic member 293*b*, the shaft bracket 294, the second support ring 295*b*, and the second fixing ring 296*b* may be coupled to the second arm shaft 266 in the second axial direction ②.

In an embodiment, the second arm 280 may be coupled to the second arm shaft 266 so as to rotate about the second arm shaft 266. The second arm 280 may be coupled to the second rotary member 230 to rotate about the second arm shaft 266 while sliding relative to the second rotary member 230 when the second rotary member 230 rotates. For example, the second arm 280 may be slidably coupled to the second rotary member 230 through a second sliding pin 284. For example, the second sliding pin 284 may be inserted into a second sliding groove 237 of the second rotary member 230 and a second pin hole 285 of the second arm 280 and may slidably connect the second arm 280 to the second rotary member 230.

In an embodiment, the gear member 269 may include a first gear 267a disposed on the outer circumferential surface of the first arm shaft 265, a second gear 267b disposed on the outer circumferential surface of the second arm shaft 266, and a connecting gear 268 connecting the first gear 267a and the second gear 267b such that the first gear 267a and the second gear 267b operate in conjunction with each other. The gear member 269 may allow the first arm shaft 265 and the second arm shaft 266 to operate in conjunction with each other such that the first arm shaft 265 and the second arm shaft 266 rotate in opposite directions by the same angle. For example, when one of the first arm shaft 265 and the second arm shaft 266 rotates in a first direction by a first angle, the gear member 269 may rotate the other one of the first arm shaft 265 and the second arm shaft 266 in the direction opposite to the first direction by the first angle. For example, the connecting gear 268 may include an even number of gears for interworking between the first arm shaft 265 and the second arm shaft 266.

In an embodiment, the shaft bracket 294 may be fixedly disposed in the hinge housing 130. The shaft bracket 294 may be disposed on the end portions of the first arm shaft 265 and the second arm shaft 266 that face the second axial direction ②. The shaft bracket 294 may be configured to support rotation of the first arm shaft 265 and the second arm shaft 266 together with the fixed member 210. For example, the opposite end portions of each of the first arm shaft 265 and the second arm shaft 266 may be supported by the shaft bracket 294 and the second coupling portion 214.

In an embodiment, the shaft bracket 294 may support an end portion of the first elastic member 293a and an end portion of the second elastic member 293b that face the second axial direction ②. For example, as the end portions of the first elastic member 293a and the second elastic member 293b that face the second axial direction ② are supported by the shaft bracket 294, the first elastic member 293a and the second elastic member 293b may be compressed when pressed in the second axial direction ②. In an embodiment, the shaft bracket 294 may have, in at least parts thereof, through-holes (not illustrated) into which the first arm shaft 265 and the second arm shaft 266 are inserted.

In an embodiment, the stopper 291 may be fixedly disposed in the hinge housing 130. The stopper 291 may limit the range of rotation of the first arm 270 and the second arm 280. For example, at least part of the stopper 291 may be located between the first arm 270 and the second arm 280. In an embodiment, the stopper 291 may have, in at least parts thereof, through-holes (not illustrated) into which the first arm shaft 265 and the second arm shaft 266 are inserted.

In an embodiment, the friction structure 202 may be configured to provide torque corresponding to a restoring force of the display 140. For example, in an intermediate folded state (e.g., FIG. 2B) or a fully folded state (e.g., FIG. 2C) in which a partial area of the display 140 is curved, the restoring force of the display 140 may act on the first rotary member 220 and the second rotary member 230. For example, the restoring force of the display 140 may refer to a force by which a curved portion returns to a flat state. For example, the restoring force of the display 140 may be proportional to the size of the display 140. The hinge structure 200 according to an embodiment may include the friction structure 202 that provides torque capable of canceling out the restoring force.

In an embodiment, the friction structure 202 may include a first cam 273, a second cam 283, the cam member 292, the first elastic member 293a, and the second elastic member 293b. The friction structure 202 according to an embodiment may be configured such that some of the structures coupled to the first arm shaft 265 and the second arm shaft 266 rotate together with the arm shafts 265 and 266 or linearly move in the axial directions along the arm shaft 265 and 266 and the other structures are fixed to the arm shafts 265 and 266 to provide torque.

For example, when the first arm shaft 265 rotates, the first arm 270 may rotate together with the first arm shaft 265 and may not linearly move in the axial directions. When the second arm shaft 266 rotates, the second arm 280 may rotate together with the second arm shaft 266 and may not linearly move in the axial directions. For example, the first arm 270 and the second arm 280 may rotate in the state in which the axial positions thereof on the first arm shaft 265 and the second arm shaft 266 are fixed.

For example, when the first arm shaft 265 and the second arm shaft 266 rotate, the cam member 292 may not rotate together with the first arm shaft 265 and the second arm shaft 266 and may linearly move in the axial directions along the first arm shaft 265 and the second arm shaft 266. For example, when the first arm shaft 265 rotates, the first elastic member 293a may be compressed or uncompressed in the axial directions by the axial movement of the cam member 292. When the second arm shaft 266 rotates, the second elastic member 293b may be compressed or uncompressed by the axial movement of the cam member 292.

For example, when the first arm shaft 265 rotates, the first fixing ring 296a may not move in the axial directions and may or may not rotate together with the first arm shaft 265. When the second arm shaft 266 rotates, the second fixing ring 296b may not move in the axial directions and may or may not rotate together with the second arm shaft 266. For example, when the first arm shaft 265 rotates, the first support ring 295a may not move in the axial directions and may rotate together with the first arm shaft 265. When the second arm shaft 266 rotates, the second support ring 295b may not move in the axial directions and may rotate together with the second arm shaft 266.

In an embodiment, the first cam 273 may be formed on the first arm 270. For example, the first cam 273 may be formed on the first arm 270 to surround the outer circumferential surface of the first arm shaft 265. The first cam 273 may be engaged with a third cam 2921 of the cam member 292. When the first arm shaft 265 rotates, the first cam 273 may not move in the axial directions and may rotate together with the first arm shaft 265. For example, the first cam 273 may rotate relative to the third cam 2921 by rotation of the first arm shaft 265.

In an embodiment, the second cam 283 may be formed on the second arm 280. For example, the second cam 283 may be formed on the second arm 280 to surround the outer circumferential surface of the second arm shaft 266. The second cam 283 may be engaged with a fourth cam 2922 of the cam member 292. When the second arm shaft 266 rotates, the second cam 283 may not move in the axial directions and may rotate together with the second arm shaft 266. For example, the second cam 283 may rotate relative to the fourth cam 2922 by rotation of the second arm shaft 266.

In an embodiment, the cam member 292 may be configured such that the first arm shaft 265 and the second arm shaft 266 pass through at least parts of the cam member 292. When the first arm shaft 265 and the second arm shaft 266 rotate, the cam member 292 may not rotate together with the arm shafts 265 and 266 and may move in the axial directions.

In an embodiment, the cam member 292 may include the third cam 2921 engaged with the first cam 273 of the first arm 270 and the fourth cam 2922 engaged with the second cam 283 of the second arm 280. For example, the third cam 2921 may be formed on one portion (e.g., a first portion 292a of FIGS. 10A, 10B, and 10C) of the cam member 292 to surround the first arm shaft 265. The fourth cam 2922 may be formed on another portion (e.g., a second portion 292b of FIGS. 10A, 10B, and 10C) of the cam member 292 to surround the second arm shaft 266.

In an embodiment, the cam member 292 may compress the first elastic member 293a and the second elastic member 293b while moving in the second axial direction ② by rotation of the first cam 273 and the second cam 283, or may be compressed in the first axial direction ① by elastic forces of the first elastic member 293a and the second elastic member 293b. For example, when the first cam 273 and the second cam 283 rotate relative to the third cam 2921 and the fourth cam 2922 in the state in which protrusions of the first cam 273 and the second cam 283 are located in depressions of the third cam 2921 and the fourth cam 2922, the protrusions of the first cam 273 and the protrusions of the second cam 283 may make contact with protrusions of the third cam 2921 and protrusions of the fourth cam 2922, respectively, to move the cam 292 in the second axial direction ②.

In an embodiment, the first elastic member 293a may be disposed between the cam member 292 and the shaft bracket 294. The first elastic member 293a may be coupled to the first arm shaft 265. For example, the first elastic member 293a may include a coil spring that can be axially compressed or uncompressed. The first elastic member 293a may be compressed or uncompressed in response to rotation of the first arm 270. For example, the first elastic member 293a may be compressed when the cam member 292 moves in the second axial direction ②, and the compressed first elastic member 293a may press the cam member 292 in the first axial direction ①. According to an embodiment, an elastic force may be applied to the cam member 292 in the first axial direction ① by the compressed first elastic member 293a, and thus a frictional force between the first cam 273 of the first arm 270 and the third cam 2921 of the cam member 292 may be increased.

In an embodiment, the second elastic member 293b may be disposed between the cam member 292 and the shaft bracket 294. The second elastic member 293b may be coupled to the second arm shaft 266. For example, the second elastic member 293b may include a coil spring that can be axially compressed or uncompressed. The second elastic member 293b may be compressed or uncompressed in response to rotation of the second arm 280. For example, the second elastic member 293b may be compressed when the cam member 292 moves in the second axial direction ②, and the compressed second elastic member 293b may press the cam member 292 in the first axial direction ①. According to an embodiment, an elastic force may be applied to the cam member 292 in the first axial direction ① by the compressed second elastic member 293b, and thus a frictional force between the second cam 283 of the second arm 280 and the fourth cam 2922 of the cam member 292 may be increased.

In an embodiment, when the electronic device 100 is in a fully folded state, the support structure 203 may support the display 140 such that the display 140 forms a predetermined shape. For example, the support structure 203 may be configured to rotate about an axis of rotation (e.g., axes of rotation R3 and R4 of FIGS. 18A, 18B, and 19) by a specified range relative to the rotary members 220 and 230 by the restoring force of the display 140 in a folding motion. In an embodiment, the support structure 203 may include the first guide member 240, the second guide member 250, the first rotary plate 261, and the second rotary plate 262.

In an embodiment, the first guide member 240 may be coupled to the first rotary member 220 so as to be rotatable along a predetermined path. The first guide member 240 may be disposed in the first opening area 223 of the first rotary member 220. For example, the first guide member 240 may include first guide grooves 241 in which the first guide protrusions 224 of the first rotary member 220 are accommodated.

In an embodiment, the second guide member 250 may be coupled to the second rotary member 230 so as to be rotatable along a predetermined path. The second guide member 250 may be disposed in the second opening area 233 of the second rotary member 230. For example, the second guide member 250 may include second guide grooves 251 in which the second guide protrusions 234 of the second rotary member 230 are accommodated.

In an embodiment, the first rotary plate 261 may be coupled to the first guide member 240. For example, the first rotary plate 261, together with the first guide member 240, may rotate along a predetermined path relative to the first rotary member 220. The first rotary plate 261 may be brought into contact with at least a partial area of the display 140, and in a folding motion, the restoring force of the display 140 may act on at least part of the first rotary plate 261. For example, the first rotary plate 261 and the first guide member 240 may be configured to rotate relative to the first rotary member 220 by the restoring force of the display 140 applied to the first rotary plate 261.

In an embodiment, the first rotary plate 261 may include a first support portion 261a extending in the axial directions, second support portions 261b extending from opposite axial end portions of the first support portion 261a in a direction perpendicular to the axial directions, and a third support portion 261c extending from the first support portion 261a in the direction perpendicular to the axial directions so as to be located between the second support portions 261b. A first opening (not illustrated) may be formed between the second support portion 261b and the third support portion 261c. Some components of the hinge structure 200 may be exposed through the first opening when the first rotary plate 261 is viewed from above. As the first opening is formed in the first rotary plate 261, the first rotary plate 261 may not interfere and/or collide with other components of the hinge structure 200 when the first rotary plate 261 rotates.

In an embodiment, the second support portion 261b may be disposed between the first coupling portion 213 and the second coupling portion 214 of the fixed member 210 (e.g., refer to FIG. 4). For example, when the first rotary plate 261 rotates, the second support portion 261b may rotate between the first coupling portion 213 and the second coupling portion 214. For example, the fixed member 210 may include a third coupling portion 215 coupled to the hinge housing 130, and the first coupling portion 213 and the second coupling portion 214 may protrude from the third coupling portion 215. Accordingly, a space in which the second support portion 261b of the first rotary plate 261 is rotatable may be secured between the first coupling portion 213 and the second coupling portion 214. For example, when the hinge structure 200 is viewed from above, the second support portion 261b may be located between the first coupling portion 213 and the second coupling portion 214 and may overlap the third coupling portion 215.

In an embodiment, the second rotary plate 262 may be coupled to the second guide member 250. For example, the second rotary plate 262, together with the second guide member 250, may rotate along a predetermined path relative to the second rotary member 230. The second rotary plate 262 may be brought into contact with at least a partial area of the display 140, and in a folding motion, the restoring force of the display 140 may act on at least part of the second rotary plate 262. For example, the second rotary plate 262 and the second guide member 250 may be configured to rotate relative to the second rotary member 230 by the restoring force of the display 140 applied to the second rotary plate 262.

In an embodiment, the second rotary plate 262 may include a fourth support portion 262a extending in the axial directions, fifth support portions 262b extending from opposite axial end portions of the fourth support portion 262a in a direction perpendicular to the axial directions, and a sixth support portion 262c extending from the fourth support portion 262a in the direction perpendicular to the axial directions so as to be located between the fifth support portions 262b. A second opening (not illustrated) may be formed between the fifth support portion 262b and the sixth support portion 262c. Some components of the hinge structure 200 may be exposed through the second opening when the second rotary plate 262 is viewed from above. As the second opening is formed in the second rotary plate 262, the second rotary plate 262 may not interfere and/or collide with other components of the hinge structure 200 when the second rotary plate 262 rotates.

In an embodiment, the fifth support portion 262b may be disposed between the first coupling portion 213 and the second coupling portion 214 of the fixed member 210 (e.g., refer to FIG. 4). For example, when the second rotary plate 262 rotates, the fifth support portion 262b may rotate between the first coupling portion 213 and the second coupling portion 214. For example, when the hinge structure 200 is viewed from above, the fifth support portion 262b may be located between the first coupling portion 213 and the second coupling portion 214 and may overlap the third coupling portion 215.

Components for forming axes of rotation (or, rotational paths) of the guide members 240 and 250 and the rotary plates 261 and 262 and a rotary motion of the guide members 240 and 250 and the rotary plates 261 and 262 will be described below with reference to FIGS. 13, 14, 15, 16A, 16B, 17, 18A, 18B, 19, 20, 21A, and 21B.

In an embodiment, the first fixed plate 263 may be coupled to the first housing 110 (e.g., the first housing 110 of FIG. 3). The first fixed plate 263 may be spaced apart from the first rotary plate 261 at a specified interval. For example, the first fixed plate 263 may be spaced apart from the first rotary plate 261 by the specified interval in a direction (e.g., the −x-axis direction) perpendicular to the axial directions. The first fixed plate 263 may form substantially the same plane as the first rotary plate 261 and may at least partially overlap other components (e.g., the first rotary member 220, the first arm 270, and the first guide member 240) of the hinge structure 200.

In an embodiment, the second fixed plate 264 may be coupled to the second housing 120 (e.g., the second housing 120 of FIG. 3). The second fixed plate 264 may be spaced apart from the second rotary plate 262 at a specified interval. For example, the second fixed plate 264 may be spaced apart from the second rotary plate 262 by the specified interval in a direction (e.g., the +x-axis direction) perpendicular to the axial directions. The second fixed plate 264 may form substantially the same plane as the second rotary plate 262 and may at least partially overlap other components (e.g., the second rotary member 230, the second arm 280, and the second guide member 250) of the hinge structure 200.

In an embodiment, the hinge structure 200 may include center bar 297. The center bar 297 may extend a predetermined length in the axial directions. The center bar 297 may be disposed between the first arm shaft 265 and the second arm shaft 266. The center bar 297 may be configured to move in a direction perpendicular to the axial directions depending on rotation of the first arm 270 and the second arm 280. For example, the center bar 297 may move in the +z-axis direction or the −z-axis direction when the first arm 270 and the second arm 280 rotate. For example, in an unfolded state, the center bar 297 may move in the +z-axis direction to support the display 140, and in a folding motion, the center bar 297 may move in the −z-axis direction by a predetermined distance to secure a specified separation space between the center bar 297 and the display 140 such that the display 140 is not damaged.

Figure 7:
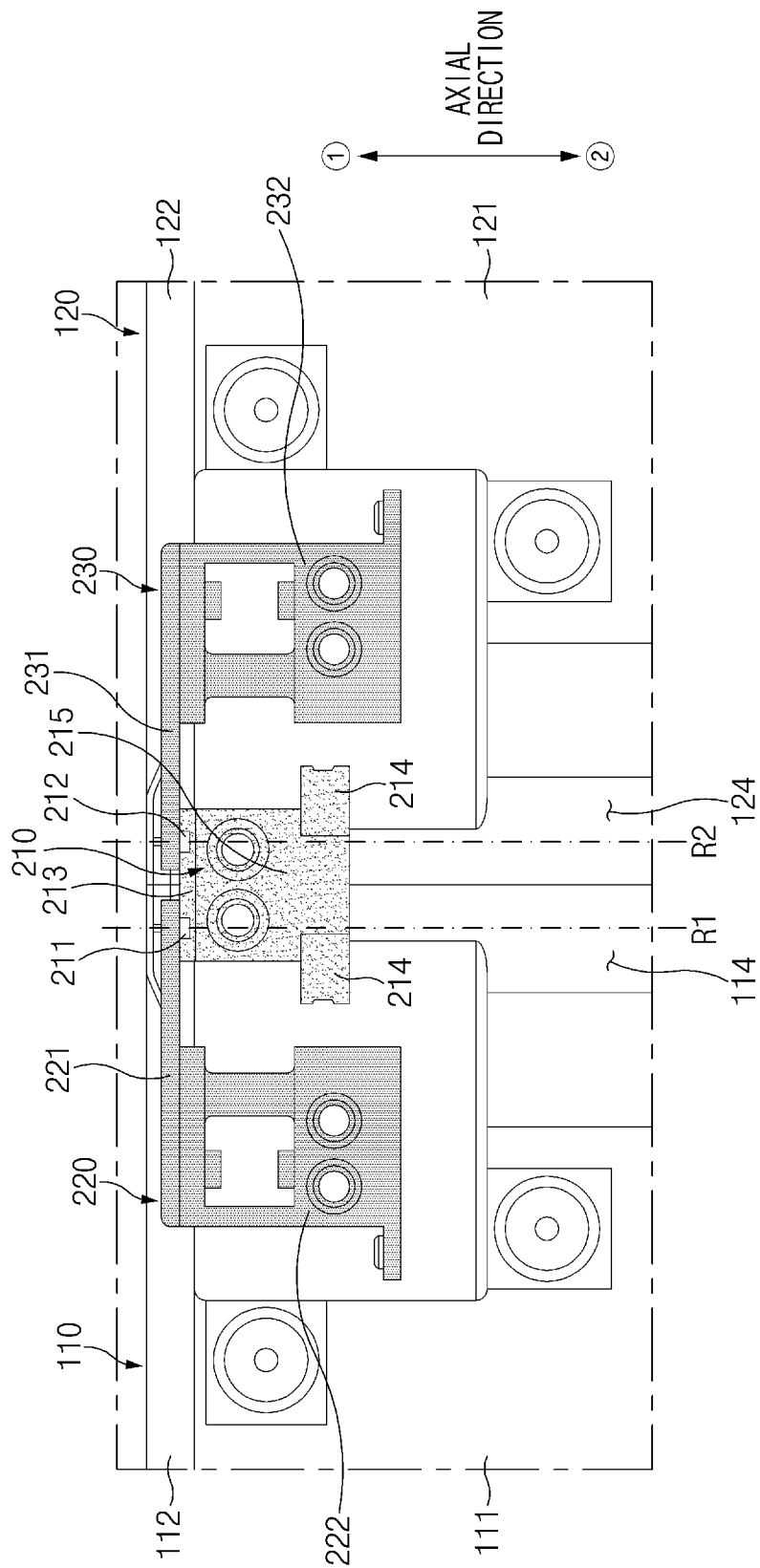
FIG. 7 is a view illustrating a coupling structure of housings, rotary members, and a fixed member of an electronic device according to an embodiment of the disclosure.

FIG. 7 is a view illustrating a coupling structure of the housings, the rotary members, and the fixed member of the electronic device according to an embodiment of the disclosure.

Referring to FIG. 7, the electronic device 100 according to an embodiment may include the first housing 110, the second housing 120, the fixed member 210, the first rotary member 220, and the second rotary member 230. Some of the components of the electronic device 100 illustrated in FIG. 7 are identical or similar to the components of the electronic device 100 illustrated in FIGS. 3 to 6, and therefore repetitive descriptions will hereinafter be omitted.

In an embodiment, the first housing 110 may be coupled with the first rotary member 220. For example, at least part (e.g., a first base portion 222) of the first rotary member 220 may be fixed to a partial area of the first plate 111 of the first housing 110 through screw coupling. The second housing 120 may be coupled with the second rotary member 230. For example, at least part (e.g., a second base portion 232) of the second rotary member 230 may be fixed to a partial area of the second plate 121 of the second housing 120 through screw coupling.

In an embodiment, the first housing 110 and the second housing 120 may have depressions 114 and 124 (e.g., refer to the depressions 114 and 124 of FIG. 1) in which the hinge housing (e.g., the hinge housing 130 of FIG. 1) is disposed. For example, the first depression area 114 having a specified curvature may be formed on a portion of the first housing 110 that faces the second housing 120, and the second depression area 124 having a specified curvature may be formed on the second housing 120 to correspond to the first depression area 114 of the first housing 110. The depressions 114 and 124 may be formed by the depression areas of the first housing 110 and the second housing 120, respectively. The hinge housing 130 may be disposed in the depressions 114 and 114, and at least part of the hinge housing 130 may be located between the depressions 114 and 124 and the fixed member 210. FIG. 7 may be a view in which the hinge housing 130 is omitted. However, in the case where the hinge housing 130 is disposed, at least part of the hinge housing 130 may overlap the fixed member 210 when the plates 111 and 121 of the housings 110 and 120 are viewed from above. For example, when the electronic device 100 is in an unfolded state (e.g., refer to FIG. 2A) as illustrated in FIG. 7, the hinge housing 130 may be hidden by the depressions 114 and 124 and may not be exposed on the exterior of the electronic device 100.

In an embodiment, the fixed member 210 may be coupled to the hinge housing 130 disposed in the depressions 114 and 124. For example, the fixed member 210 may be fixedly coupled to the hinge housing 130 through screw coupling. The fixed member 210 may be coupled with the first rotary member 220 and the second rotary member 230. For example, the first rotary member 220 and the second rotary member 230 may be coupled to the fixed member 210 so as to be rotatable about the first connecting shaft 211 and the second connecting shaft 212, respectively. According to an embodiment, when the first housing 110 is folded or unfolded, the first housing 110 and the first rotary member 220 may rotate about the first connecting shaft 211 (or, the first axis of rotation R1) relative to the fixed member 210 fixed to the hinge housing 130. When the second housing 120 is folded or unfolded, the second housing 120 and the second rotary member 230 may rotate about the second connecting shaft 212 (or, the second axis of rotation R2) relative to the fixed member 210 fixed to the hinge housing 130.

In an embodiment, the fixed member 210 may include the first coupling portion 213 coupled to the rotary member 220 and the second rotary member 230 and the third coupling portion 215 coupled to the hinge housing 130. For example, the first coupling portion 213 may have through-holes formed therein (e.g., the first through-hole 216 and the second through-hole 217 of FIG. 6) into which the first connecting shaft 211 and the second connecting shaft 212 are inserted. For example, the third coupling portion 215 may have a fastening hole (not illustrated) for screw coupling with the hinge housing 130.

In an embodiment, the first rotary member 220 may include the first base portion 222 coupled to the first housing 110 and the first extension 221 rotatably coupled to the fixed member 210. The first base portion 222 may be coupled to the first plate 111 of the first housing 110. The first extension 221 may extend from a portion of the first base portion 222 toward the fixed member 210. For example, the first extension 221 may extend from the first base portion 222 toward the fixed member 210 in a direction perpendicular to the axial directions by a specified length.

In an embodiment, at least part of the first extension 221 may be disposed between the first frame 112 of the first housing 110 and the first coupling portion 213 of the fixed member 210. The first connecting shaft 211 may pass through at least part of the first coupling portion 213 and at least part of the first extension 221 in the axial directions. For example, the first extension 221 may be coupled to the first coupling portion 213 through the first connecting shaft 211, and thus the first rotary member 220 may rotate about the first connecting shaft 211 (or, the first axis of rotation R1) relative to the fixed member 210. Referring to FIG. 7, the first extension 221 of the first rotary member 220 may overlap at least part of the first frame 112 when a portion of the first frame 112 of the first housing 110 that faces the axial directions is viewed.

In an embodiment, the second rotary member 230 may include the second base portion 232 coupled to the second housing 120 and the second extension 231 rotatably coupled to the fixed member 210. The second base portion 232 may be coupled to the second plate 121 of the second housing 120. The second extension 231 may extend from a portion of the second base portion 232 toward the fixed member 210. For example, the second extension 231 may extend from the second base portion 232 toward the fixed member 210 in a direction perpendicular to the axial directions by a specified length.

In an embodiment, at least part of the second extension 231 may be disposed between the second frame 122 of the second housing 120 and the first coupling portion 213 of the fixed member 210. The second connecting shaft 212 may pass through at least part of the first coupling portion 213 and at least part of the second extension 231 in the axial directions. For example, the second extension 231 may be coupled to the first coupling portion 213 through the second connecting shaft 212, and thus the second rotary member 230 may rotate about the second connecting shaft 212 (or, the second axis of rotation R2) relative to the fixed member 210. Referring to FIG. 7, the second extension 231 of the second rotary member 230 may overlap at least part of the second frame 122 when a portion of the second frame 122 of the second housing 120 that faces the axial directions is viewed.

Figure 8:
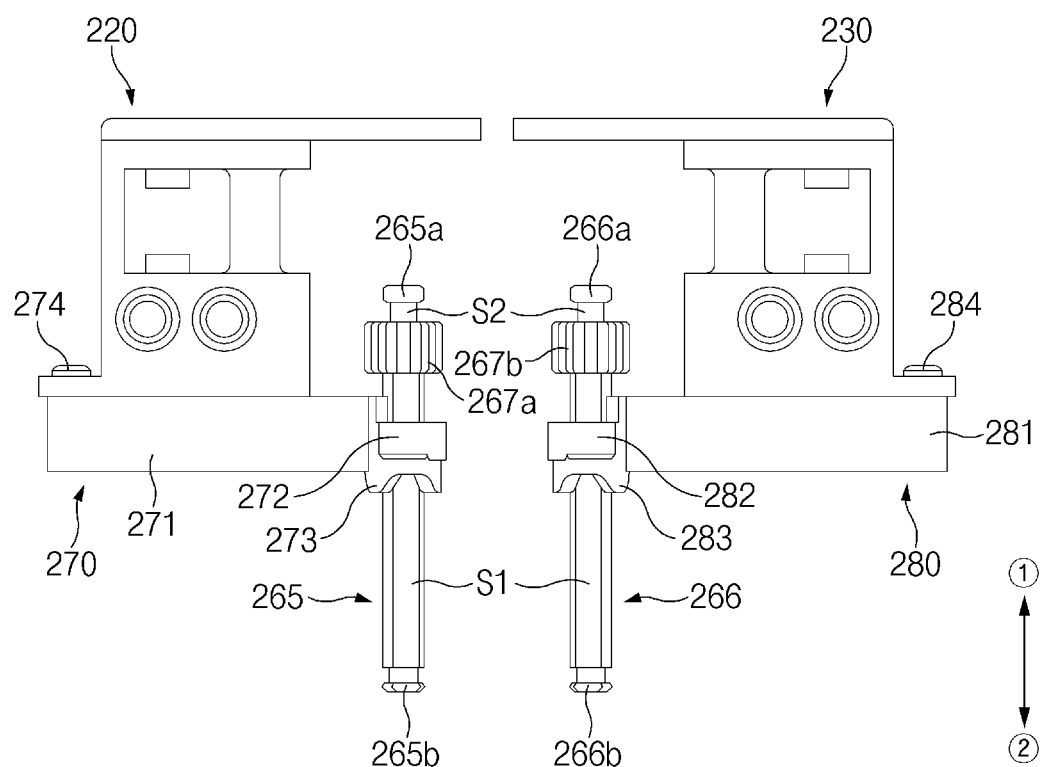
FIG. 8 is a view illustrating a coupling structure of rotary members, arm shafts, and arms of a hinge structure according to an embodiment of the disclosure.

FIG. 8 is a view illustrating a coupling structure of rotary members, arm shafts, and arms of a hinge structure according to an embodiment of the disclosure.

Figure 9A:
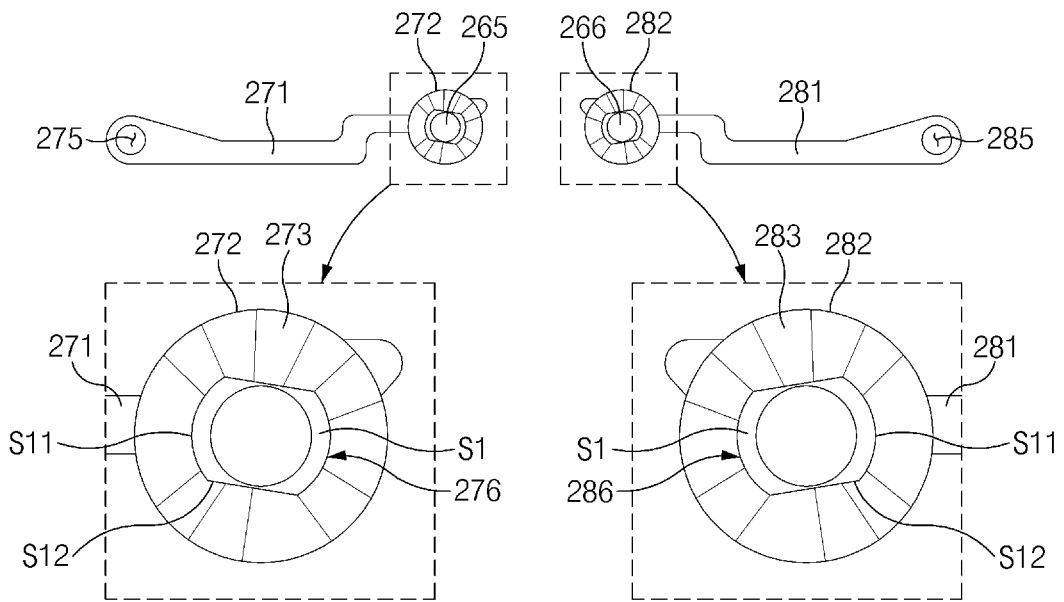
FIG. 9A is a view illustrating a coupling structure of rotary members, arm shafts, and arms of a hinge structure according to an embodiment of the disclosure.
Figure 9B:
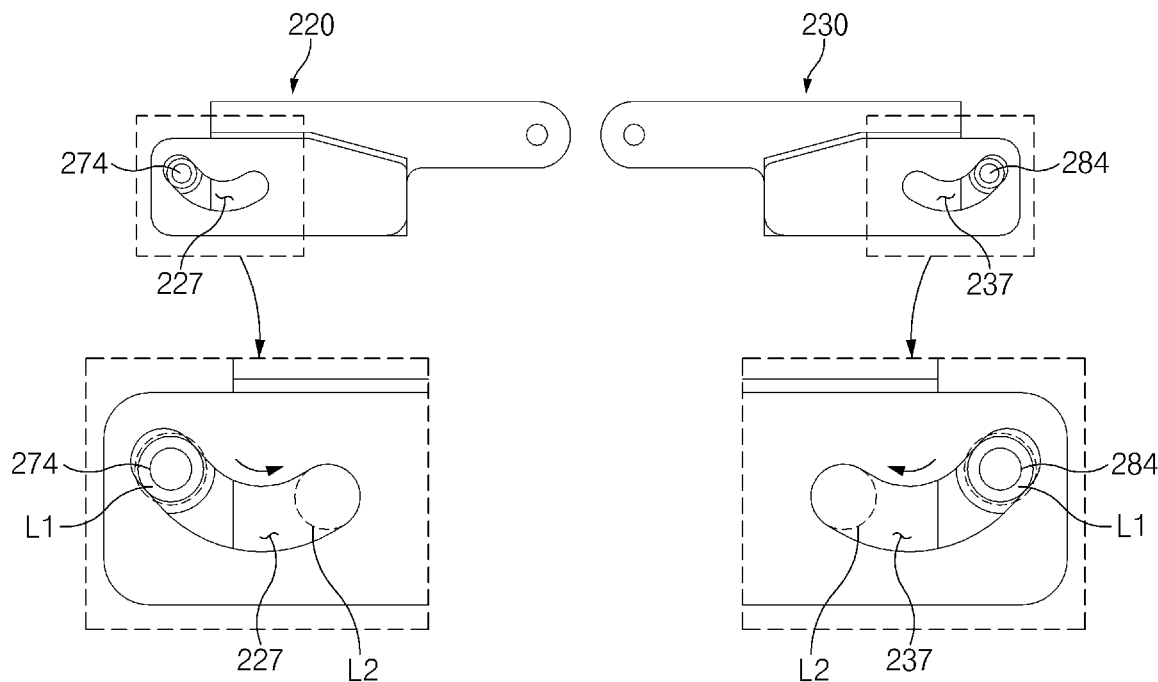
FIG. 9B is a view illustrating a coupling structure of rotary members, arm shafts, and arms of a hinge structure according to an embodiment of the disclosure.

FIGS. 9A and 9B are a view illustrating a coupling structure of rotary members, arm shafts, and arms of a hinge structure according to various embodiments of the disclosure.

FIGS. 9A and 9B are a view of the hinge structure of FIG. 8 as viewed in a first rotational axis direction. For example, FIG. 9A may be a view in which the rotary members of FIG. 8 are omitted. FIG. 9B may be a view in which the arm shafts and the arms of FIG. 8 are omitted.

Referring to FIGS. 8, 9A, and 9B, the hinge structure 200 according to an embodiment may include the first rotary member 220, the second rotary member 230, the first arm shaft 265, the second arm shaft 266, the first arm 270, and the second arm 280.

In an embodiment, the hinge structure 200 may be configured such that the arms 270 and 280 are coupled to the arm shafts 265 and 266 to rotate together with the arm shafts 265 and 266 and the rotary members 220 and 230 are coupled to the arms 270 and 280 to rotate together with the arms 270 and 280 and slide relative to the arms 270 and 280. In various embodiments, as the arms 270 and 280 and the rotary members 220 and 230 of the hinge structure 200 are coupled to slide relative to each other, the arm shafts 265 and 266, which are the centers of rotation of the arms 270 and 280, and the axes of rotation (e.g., the connecting shafts 211 and 212 of FIGS. 4 to 6) of the rotary members 220 and 230 may be implemented to be different from each other. For example, the arm shafts 265 and 266 may be located under the display (e.g., the display 140 of FIG. 1) to maximize torque, and the rotary shafts 211 and 212 of the rotary members 220 and 230 may be located over the display 140 when the display 140 is viewed in the cross-section (e.g., refer to FIG. 12). For example, the arms 270 and 280 and the rotary members 220 and 230 may be connected (or, interlocked) to rotate together, but may rotate about different axes of rotation while sliding relative to each other.

In an embodiment, the first arm shaft 265, when viewed in the axial directions, may include a first end portion 265a that faces the first axial direction ① and a second end portion 265b that faces the second axial direction ②. The first end portion 265a may be rotatably inserted into an opening (e.g., the first opening 218 of FIG. 6) of the fixed member (e.g., the fixed member 210 of FIG. 6). The first gear 267a may be disposed on an outer circumferential surface of the first arm shaft 265 that is adjacent to the first end portion 265a and may rotate together with the first arm shaft 265. For example, the first gear 267a may be coupled to the first arm shaft 265, or may be integrally formed with the first arm shaft 265. A fixing groove (not illustrated) into which the first fixing ring 296a is inserted may be formed on the second end portion 265b.

In an embodiment, the first arm shaft 265 may include a first shaft portion S1 that is located between the first end portion 265a and the second end portion 265b and that has a non-circular (or, polygonal) cross-section and a second shaft portion S2 that is located between the first shaft portion S1 and the first end portion 265a and that has a circular cross-section. For example, when the first arm shaft 265 is viewed in cross-sections perpendicular to the axial directions, the first shaft portion S1 and the second shaft portion S2 may be formed in different shapes. For example, referring to the drawings, the first shaft portion S1 may have a larger cross-section than the second shaft portion S2. In another example, the first shaft portion S1 may have a smaller cross-section than the second shaft portion S2, or may have substantially the same cross-section as the second shaft portion S2. The first arm 270 and the cam member (e.g., the first portion 292a of the cam member 292 of FIGS. 10A, 10B, and 10C) may be coupled to the first shaft portion S1 of the first arm shaft 265. In various embodiments, the first shaft portion S1 may include flat areas S12 that are substantially flat and round areas S11 that are substantially curved.

In an embodiment, the first arm 270 may include a first portion 272 coupled to the first arm shaft 265 and a second portion 271 that extends from the first portion 272 and that is slidably coupled to the first rotary member 220. For example, the second portion 271 may extend from the first portion 272 in a direction substantially perpendicular to the axial directions. The first sliding pin 274 may be disposed in the second portion 271, and the second portion 271 may be slidably coupled to the first rotary member 220 through the first sliding pin 274.

In an embodiment, the first portion 272 of the first arm 270 may have a through-hole 276 formed therein into which the first arm shaft 265 is inserted. The through-hole 276 may be formed in a shape substantially corresponding to the first shaft portion S1 of the first arm shaft 265 such that the first arm 270 rotates together with the first arm shaft 265. Referring to FIG. 9A, the first shaft portion S1 of the first arm shaft 265 may be press-fit into the through-hole 276 of the first arm 270. For example, the first shaft portion S1 of the first arm shaft 265 may be formed to be larger than the through-hole 276 so as to be press-fit into the through-hole 276. For example, the first shaft portion S1 may be press-fit into the through-hole 276 such that the flat areas S12 and the round areas S11 are brought into close contact with the inner surfaces of the through-hole 276. Accordingly, the first arm 270 may rotate together with the first arm shaft 265 and may not move in the axial directions. For example, the first arm 270 may be axially fixed in a specified position on the first shaft portion S1 of the first arm shaft 265.

In an embodiment, the first cam 273 may be formed on the first portion 272 of the first arm 270. The first cam 273 may be formed around the through-hole 276 to surround the first arm shaft 265. The first cam 273 may be formed on a surface of the first portion 272 of the first arm 270 that faces the second axial direction ②, or may be formed on a surface of the first portion 272 that faces toward the second end portion 265b of the first arm shaft 265. The first cam 273 may be engaged with the third cam (e.g., the third cam 2921 of the cam member 292 of FIGS. 4 to 6) of the cam member.

In an embodiment, the second portion 271 of the first arm 270 may have the first pin hole 275 formed therein into which the first sliding pin 274 is inserted. The first sliding pin 274 may be coupled to the first arm 270 so as to move together with the first arm 270. For example, the first sliding pin 274 may be press-fit into the first pin hole 275 of the first arm 270. At least part of the first sliding pin 274 may be accommodated in the first sliding groove 227 of the first rotary member 220. For example, the first sliding pin 274 may be accommodated in the first sliding groove 227 so as to slide along the first sliding groove 227 when the first arm 270 rotates. The first sliding pin 274 may move along the first sliding groove 227 in the state of being press-fit into the first pin hole 275 of the first arm 270. Accordingly, the first arm 270 may be slidably coupled to the first rotary member 220. For example, when the first rotary member 220 rotates, the first arm 270 may slide relative to the first rotary member 220 while rotating about the first arm shaft 265.

Referring to FIG. 9B, when the electronic device 100 is in an unfolded state, the first sliding pin 274 may be located in a first position L1 in the first sliding groove 227, and when the electronic device 100 is in a fully folded state, the first sliding pin 274 may move along the first sliding groove 227 so as to be located in a second position L2. For example, the first position L1 may correspond to one end portion of the first sliding groove 227, and the second position L2 may correspond to an opposite end portion of the first sliding groove 227. The first arm 270 may slide relative to the first rotary member 220 as the first sliding pin 274 moves along the first sliding groove 227. The sliding motion of the first arm 270 and the first sliding pin 274 will be described below with reference to FIG. 12.

In an embodiment, the second arm shaft 266, when viewed in the axial directions, may include a first end portion 266a that faces the first axial direction ① and a second end portion 266b that faces the second axial direction ②. The first end portion 266a may be rotatably inserted into an opening (e.g., the second opening 219 of FIG. 6) of the fixed member (e.g., the fixed member 210 of FIG. 6). The second gear 267b may be disposed on an outer circumferential surface of the second arm shaft 266 that is adjacent to the first end portion 266a and may rotate together with the second arm shaft 266. For example, the second gear 267b may be coupled to the second arm shaft 266, or may be integrally formed with the second arm shaft 266. A fixing groove (not illustrated) into which the second fixing ring 296b is inserted may be formed on the second end portion 266b.

In an embodiment, the second arm shaft 266 may include a first shaft portion S1 that is located between the first end portion 266a and the second end portion 266b and that has a non-circular (or, polygonal) cross-section and a second shaft portion S2 that is located between the first shaft portion S1 and the first end portion 266a and that has a circular cross-section. For example, when the second arm shaft 266 is viewed in cross-sections perpendicular to the axial directions, the first shaft portion S1 and the second shaft portion S2 may be formed in different shapes. For example, referring to the drawings, the first shaft portion S1 may have a larger cross-section than the second shaft portion S2. In another example, the first shaft portion S1 may have a smaller cross-section than the second shaft portion S2. The second arm 280 and the cam member (e.g., the second portion 292b of the cam member 292 of FIGS. 10A, 10B, and 10C) may be coupled to the first shaft portion S1 of the second arm shaft 266. In various embodiments, the first shaft portion S1 may include flat areas S12 that are substantially flat and round areas S11 that are substantially curved.

In an embodiment, the second arm 280 may include a first portion 282 coupled to the second arm shaft 266 and a second portion 281 that extends from the first portion 282 and that is slidably coupled to the second rotary member 230. For example, the second portion 281 may extend from the first portion 282 in a direction substantially perpendicular to the axial directions. The second sliding pin 284 may be disposed in the second portion 281, and the second portion 281 may be slidably coupled to the second rotary member 230 through the second sliding pin 284.

In an embodiment, the first portion 282 of the second arm 280 may have a through-hole 286 formed therein into which the second arm shaft 266 is inserted. The through-hole 286 may be formed in a shape substantially corresponding to the first shaft portion S1 of the second arm shaft 266 such that the second arm 280 rotates together with the second arm shaft 266. Referring to FIG. 9A, the first shaft portion S1 of the second arm shaft 266 may be press-fit into the through-hole 286 of the second arm 280. For example, the first shaft portion S1 of the second arm shaft 266 may be formed to be larger than the through-hole 286 so as to be press-fit into the through-hole 286. For example, the first shaft portion S1 may be press-fit into the through-hole 286 such that the flat areas S12 and the round areas S11 are brought into close contact with the inner surfaces of the through-hole 286. Accordingly, the second arm 280 may rotate together with the second arm shaft 266 and may not move in the axial directions. For example, the second arm 280 may be axially fixed in a specified position on the first shaft portion S1 of the second arm shaft 266.

In an embodiment, the second cam 283 may be formed on the first portion 282 of the second arm 280. The second cam 283 may be formed around the through-hole 286 to surround the second arm shaft 266. The second cam 283 may be formed on a surface of the first portion 282 of the second arm 280 that faces the second axial direction ②, or may be formed on a surface of the first portion 282 that faces toward the second end portion 266b of the second arm shaft 266. The second cam 283 may be engaged with the fourth cam (e.g., the fourth cam 2922 of the cam member 292 of FIGS. 4 to 6) of the cam member.

In an embodiment, the second portion 281 of the second arm 280 may have the second pin hole 285 formed therein into which the second sliding pin 284 is inserted. The second sliding pin 284 may be coupled to the second arm 280 so as to move together with the second arm 280. For example, the second sliding pin 284 may be press-fit into the second pin hole 285 of the second arm 280. At least part of the second sliding pin 284 may be accommodated in the second sliding groove 237 of the second rotary member 230. For example, the second sliding pin 284 may be accommodated in the second sliding groove 237 so as to slide along the second sliding groove 237 when the second arm 280 rotates. The second sliding pin 284 may move along the second sliding groove 237 in the state of being press-fit into the second pin hole 285 of the second arm 280. Accordingly, the second arm 280 may be slidably coupled to the second rotary member 230. For example, when the second rotary member 230 rotates, the second arm 280 may slide relative to the second rotary member 230 while rotating about the second arm shaft 266.

Referring to FIG. 9B, when the electronic device 100 is in an unfolded state, the second sliding pin 284 may be located in a first position L1 in the second sliding groove 237, and when the electronic device 100 is in a fully folded state, the second sliding pin 284 may move along the second sliding groove 237 so as to be located in a second position L2. For example, the first position L1 may correspond to one end portion of the second sliding groove 237, and the second position L2 may correspond to an opposite end portion of the second sliding groove 237. The second arm 280 may slide relative to the second rotary member 230 as the second sliding pin 284 moves along the second sliding groove 237. The sliding motion of the second arm 280 and the second sliding pin 284 will be described below with reference to FIG. 12.

Figure 10A:
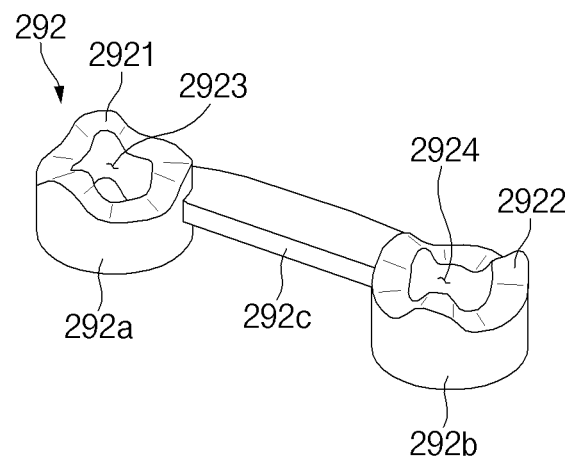
FIG. 10A is a view illustrating a cam member of a hinge structure according to an embodiment of the disclosure.

FIG. 10A is a view illustrating a cam member of the hinge structure according to an embodiment of the disclosure.

Figure 10B:
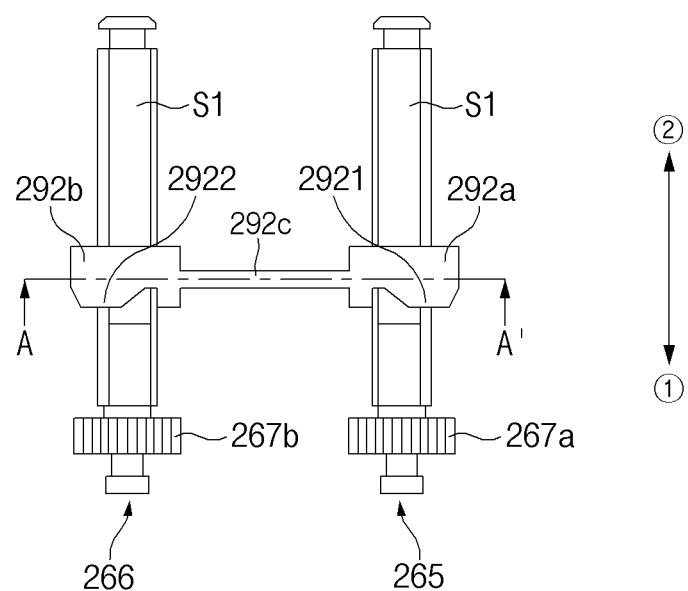
FIG. 10B is a view illustrating a coupling structure of arm shafts and a cam member of the hinge structure according to an embodiment of the disclosure.

FIG. 10B is a view illustrating a coupling structure of arm shafts and a cam member of a hinge structure according to an embodiment of the disclosure.

Figure 10C:
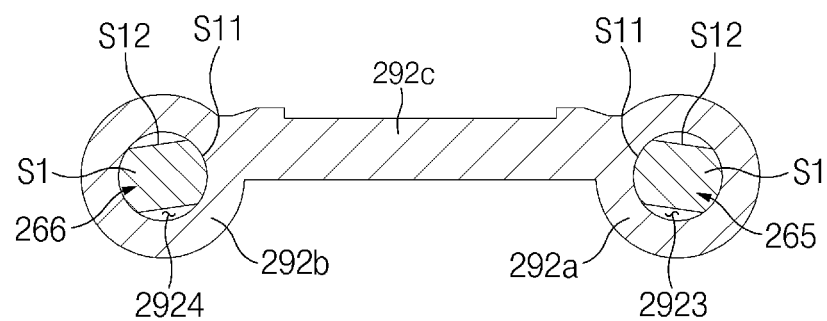
FIG. 10C is a view illustrating a coupling structure of arm shafts and a cam member of a hinge structure according to an embodiment of the disclosure.

FIG. 10C is a view illustrating a coupling structure of arm shafts and a cam member of a hinge structure according to an embodiment of the disclosure.

FIG. 10A illustrates a perspective view of the cam member. FIG. 10B illustrates a coupling of the arm shafts and the cam member. FIG. 10C illustrates a sectional view taken along line A-A' illustrated in FIG. 10B.

Referring to FIGS. 10A, 10B, and 10C the hinge structure 200 according to an embodiment may include the cam member 292, the first arm shaft 265, and the second arm shaft 266. The first arm shaft 265 and the second arm shaft 266 may pass through at least parts of the cam member 292.

In an embodiment, the cam member 292 may include the first portion 292a through which the first arm shaft 265 passes, the second portion 292b through which the second arm shaft 266 passes, and a third portion 292c connecting the first portion 292a and the second portion 292b. The third cam 2921 and the fourth cam 2922 engaged with the cams (e.g., the first cam 273 and the second cam 283 of FIGS. 8, 9A, and 9B) formed on the arms 270 and 280 may be formed on at least parts (e.g., the first portion 292a and the second portion 292b) of the cam member 292.

In an embodiment, the first portion 292a may include the third cam 2921 formed to surround the first arm shaft 265. For example, the third cam 2921 may be formed on a surface of the first portion 292a that faces the first axial direction ①. The third cam 2921 may be engaged with the first cam (e.g., the first cam 273 of FIGS. 8, 9A, and 9B) of the first arm (e.g., the first arm 270 of FIGS. 8, 9A, and 9B). Although the first arm 270 is not illustrated in FIGS. 10A, 10B, and 10C, the first arm 270 may be coupled to the first arm shaft 265 such that the first cam 273 is located between the first gear 267a and the first portion 292a.

In an embodiment, the second portion 292b may include the fourth cam 2922 formed to surround the second arm shaft 266. For example, the fourth cam 2922 may be formed on a surface of the second portion 292b that faces the first axial direction ①. The fourth cam 2922 may be engaged with the second cam (e.g., the second cam 283 of FIGS. 8, 9A, and 9B) of the second arm (e.g., the second arm 280 of FIGS. 8, 9A, and 9B). Although the second arm 280 is not illustrated in FIGS. 10A, 10B, and 10C, the second arm 280 may be coupled to the second arm shaft 266 such that the second cam 283 is located between the second gear 267b and the second portion 292b.

In an embodiment, the third portion 292c may connect the first portion 292a and the second portion 292b such that the cam member 292 moves along the first arm shaft 265 and the second arm shaft 266 in the axial directions. For example, the third portion 292c may extend from part of the first portion 292a to the second portion 292b in a direction perpendicular to the axial directions. For example, when the arms 270 and 280 coupled to the arm shafts 265 and 266 rotate, the cams (e.g., the first cam 273 and the second cam 283) of the arms 270 and 280 and the cams (e.g., the third cam 2921 and the fourth cam 2922) of the cam member 292 may move toward, or away from, each other in the axial directions. The third portion 292c may connect the first portion 292a and the second portion 292b such that the first portion 292a and the second portion 292b of the cam member 292 linearly move in the axial directions without rotating about the first arm shaft 265 and the second arm shaft 266.

In an embodiment, the cam member 292 may be coupled to the arm shafts 265 and 266 to linearly move in the axial directions without rotating together with the arm shafts 265 and 266 when the arm shafts 265 and 266 rotate. For example, the first portion 292a of the cam member 292 may have a first hole 2923 formed therein into which the first arm shaft 265 is inserted. The second portion 292b of the cam member 292 may have a second hole 2924 formed therein into which the second arm shaft 266 is inserted. The cam member 292 may be configured such that the arm shafts 265 and 266 rotate in the first hole 2923 and the second hole 2924 independently of the cam member 292.

In an embodiment, the first shaft portion S1 of the first arm shaft 265 may be inserted into the first hole 2923. The first hole 2923 may be formed to be larger than the first shaft portion S1. For example, the first shaft portion S1 may be formed to have a non-circular cross-section, and the first hole 2923 may be formed in a circular shape so as to be separated from rotation of the first shaft portion S1. The first hole 2923 may be formed to be larger than the non-circular cross-section of the first shaft portion S1 such that the first shaft portion S1 rotates in the first hole 2923 independently of the first portion 292a. For example, the inner surface of the first hole 2923 may make contact with the round areas S11 of the first shaft portion S1, but may not make contact with the flat areas S12 of the first shaft portion S1.

In an embodiment, the first shaft portion S1 of the second arm shaft 266 may be inserted into the second hole 2924. The second hole 2924 may be formed to be larger than the first shaft portion S1. For example, the first shaft portion S1 may be formed to have a non-circular cross-section, and the second hole 2924 may be formed in a circular shape so as to be separated from rotation of the first shaft portion S1. The second hole 2924 may be formed to be larger than the non-circular cross-section of the first shaft portion S1 such that the first shaft portion S1 rotates in the second hole 2924 independently of the second portion 292b. For example, the inner surface of the second hole 2924 may make contact with the round areas S11 of the first shaft portion S1, but may not make contact with the flat areas S12 of the first shaft portion S1.

In an embodiment, as the first arm shaft 265 is inserted into the first hole 2923 and the second arm shaft 266 is inserted into the second hole 2924, the cam member 292 may be guided to move along the arm shafts 265 and 266 in the axial directions. For example, the third cam 2921 of the cam member 292 may be engaged with the first cam of the first arm (e.g., the first cam 273 of the first arm 270 of FIG. 8), and the fourth cam 2922 of the cam member 292 may be engaged with the second cam of the second arm (e.g., the second cam 283 of the second arm 280 of FIG. 8). When the arms 270 and 280 rotate together with the arm shafts 265 and 266, the cams 273 and 283 of the arms 270 and 280 may rotate relative to the cams 2921 and 2922 of the cam member 292, and therefore the positions of the cams 2921 and 2922 of the cam member 292 relative to the cams 273 and 283 of the arms 270 and 280 may be changed. The cam member 292 may move along the arm shafts 265 and 266 in the axial directions depending on the change in the positions of the cams 2921 and 2922 of the cam member 292 relative to the cams 273 and 283 of the arms 270 and 280.

Figure 11A:
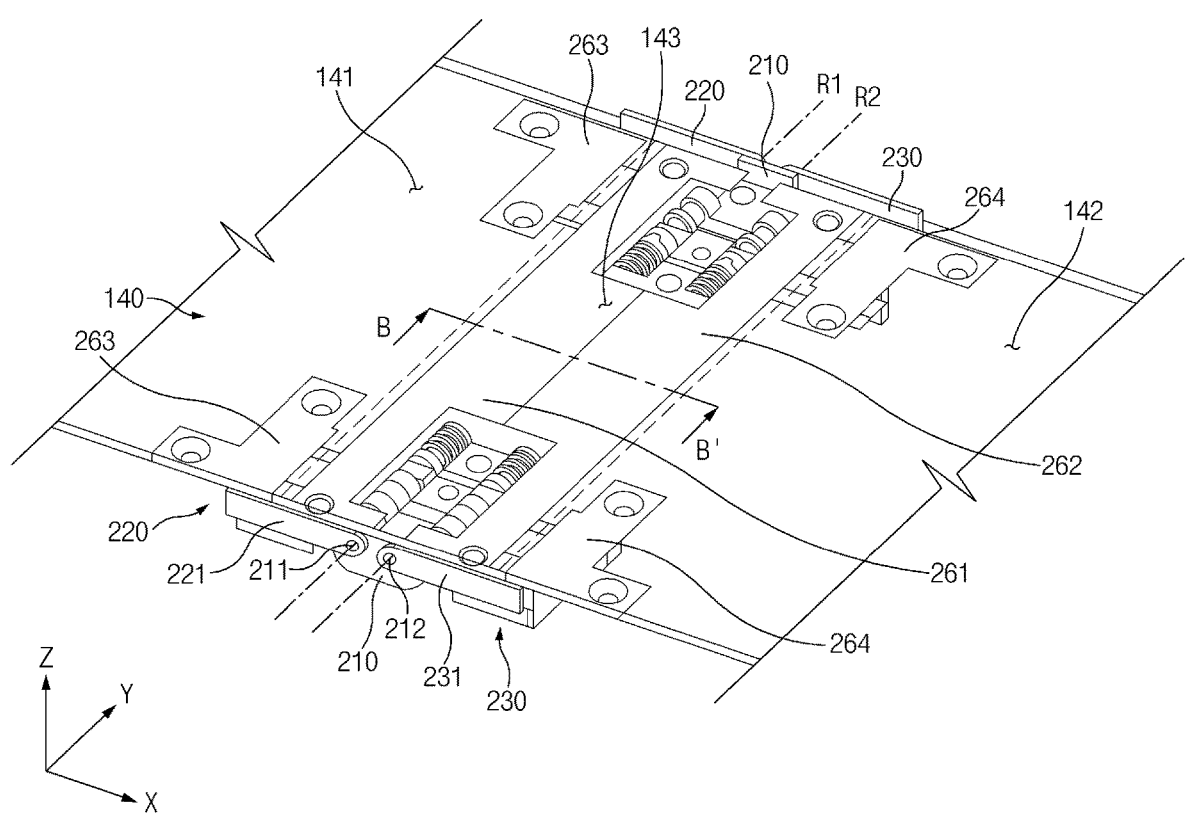
FIG. 11A is a view illustrating a hinge structure and a display in an unfolded state of an electronic device according to an embodiment of the disclosure.

FIG. 11A is a view illustrating a hinge structure and a display in an unfolded state of an electronic device according to an embodiment of the disclosure.

Figure 11B:
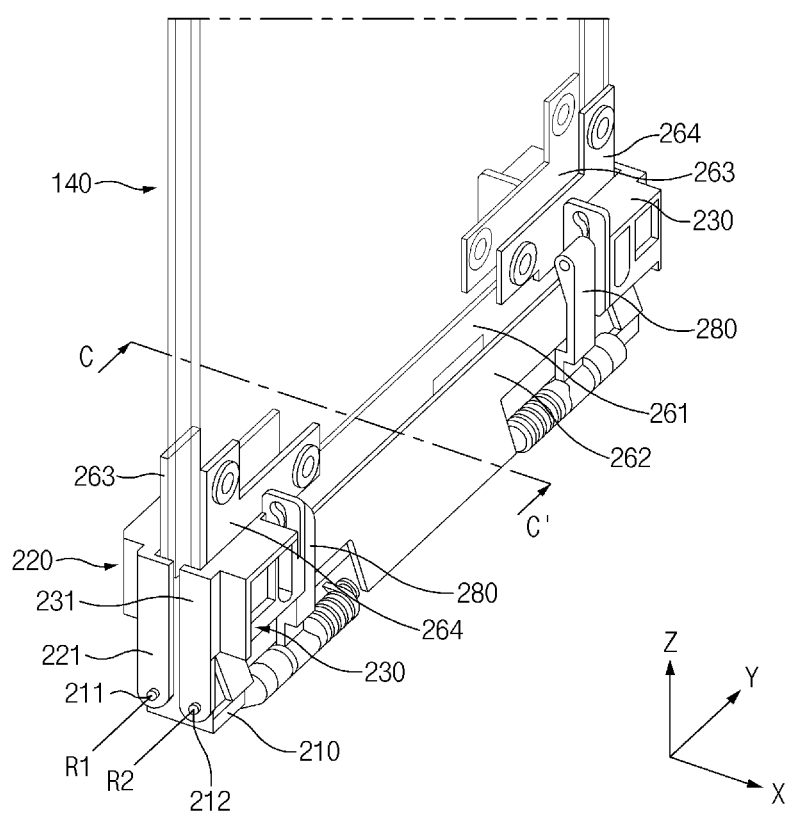
FIG. 11B is a view illustrating a hinge structure and the display in a fully folded state of an electronic device according to an embodiment of the disclosure.

FIG. 11B is a view illustrating a hinge structure and a display in a fully folded state of an electronic device according to an embodiment of the disclosure.

FIG. 12 is a view illustrating a folding motion of a hinge structure and a display according to an embodiment of the disclosure.

FIG. 11A and part 1201 of FIG. 12 are views illustrating the display and the hinge structure when the electronic device is in the unfolded state. FIG. 11B and part 1202 of FIG. 12 are views illustrating the display and the hinge structure when the electronic device is in the fully unfolded state. Part 1201 of FIG. 12 is a sectional view taken along line B-B' illustrated in FIG. 11A, and part 1201 of FIG. 12 is a sectional view taken along line C-C' illustrated in FIG. 11B.

Referring to FIGS. 11A, 11B, and 12, the electronic device 100 according to an embodiment may include the display 140 and the hinge structure 200. For example, the electronic device 100 may be configured such that at least part of the display 140 is folded or unfolded together with the housings 110 and 120 as the housings (e.g., the housings 110 and 120 of FIGS. 1 to 3) are folded or unfolded by the hinge structure 200. FIGS. 11A, 11B, and 12 may be views in which the housings 110 and 120 of the electronic device 100 are omitted. In an embodiment, the hinge structure 200 may include the fixed member 210, the rotary members 220 and 230, the arms 270 and 280, the arm shafts 265 and 266, the rotary plates 261 and 262, and the fixed plates 263 and 264.

In an embodiment, at least part of the display 140 may be supported by some components of the hinge structure 200. For example, some components of the hinge structure 200 may be configured to support the display 140 together with the plates (e.g., the first plate 111 and the second plate 121 of FIG. 3) of the housings 110 and 120. For example, the first rotary plate 261, the second rotary plate 262, the first fixed plate 263, and the second fixed plate 264 of the hinge structure 200 may each support a partial area of the rear surface (e.g., a surface facing the −z-axis direction) of the display 140.

In an embodiment, the display 140 may include the first area 141, the second area 142, and the folding area 143 defined as an area between the first area 141 and the second area 142. The first area 141 and the second area 142 may remain substantially flat in a folding motion and an unfolding motion. The folding area 143 may be partially folded or unfolded in the folding motion and the unfolding motion. According to an embodiment, in the fully folded state (part 1202 of FIG. 12), the display 140 may be supported by the support structure (e.g., the support structure 203 of FIGS. 4 to 6) such that the folding area 143 forms a specified shape. For example, referring to part 1202 of FIG. 12, the display 140 may be configured such that in the fully folded state, the folding area 143 forms an in-folding area (not illustrated) (e.g., an in-folding area 144 of FIG. 17) and out-folding areas (not illustrated) (e.g., out-folding areas 145 and 146 of FIG. 17) that extend from the in-folding area. For example, in the fully folded state, the folding area 143 may form a water-drop shape or a jar shape.

In an embodiment, in the unfolded state (e.g., part 1201 of FIG. 12), the first rotary plate 261 and the second rotary plate 262 may be disposed substantially parallel to the display 140. In the fully folded state (e.g., part 1202 of FIG. 12), the first rotary plate 261 and the second rotary plate 262 may form a specified angle with at least partial areas of the display 140. For example, the first rotary plate 261 and the second rotary plate 262 may form a specified angle with the first area 141 and the second area 142 by rotating about virtual axes of rotation (e.g., the axes of rotation R3 and R4 of FIGS. 18A, 18B, and 19) in a predetermined range by a repulsive force of the display 140 generated in a folding motion. According to an embodiment, the display 140 may be configured such that the folding area 143 forms a specified shape as the rotary plates 261 and 262 rotate together with the guide members 240 and 250 relative to the rotary members 220 and 230. An interlocking structure of the display 140 and the support structure 203 will be described below with reference to FIGS. 18A, 18B, 19, and 20.

In an embodiment, the first fixed plate 263 and the second fixed plate 264 may support partial areas of the display 140 and may move together with the display 140 in folding and unfolding motions. For example, the first fixed plate 263 and the second fixed plate 264 may be attached to the partial areas of the display 140 (e.g., refer to FIGS. 21A and 21B). For example, the first fixed plate 263 may be attached to part of the first area 141, and the second fixed plate 264 may be attached to part of the second area 142.

Hereinafter, a rotary motion of the rotary members 220 and 230 of the hinge structure 200 according to an embodiment will be described with reference to FIGS. 11A, 11B, and 12.

In an embodiment, the rotary members 220 and 230 may be coupled to the fixed member 210 so as to be rotatable about the axes of rotation R1 and R2. For example, the first rotary member 220 and the second rotary member 230 may be coupled to the fixed member 210 so as to be rotatable about the first connecting shaft 211 and the second connecting shaft 212, respectively. For example, the first rotary member 220 may be connected to part of the fixed member 210 through the first connecting shaft 211 (e.g., refer to FIG. 7). The first connecting shaft 211 may pass through the first extension 221 of the first rotary member 220 and the fixed member 210. For example, the second rotary member 230 may be connected to another part of the fixed member 210 through the second connecting shaft 212 (e.g., refer to FIG. 7). The second connecting shaft 212 may pass through the second extension 231 of the second rotary member 230 and the fixed member 210.

For example, the first connecting shaft 211 may form the first axis of rotation R1. The first axis of rotation R1 may be defined as a virtual line passing through the center of the first connecting shaft 211 and extending parallel to the axial directions. The second connecting shaft 212 may form the second axis of rotation R2. The second axis of rotation R2 may be defined as a virtual line passing through the center of the second connecting shaft 212 and extending parallel to the axial directions.

In an embodiment, the first rotary member 220 may include the first extension 221 coupled to the fixed member 210 and the first base portion 222 coupled to the first housing (e.g., the first housing 110 of FIG. 7). In an embodiment, the first extension 221 may be coupled to the fixed member 210 through the first connecting shaft 211, and thus the first rotary member 220 may rotate about the first connecting shaft 211 (e.g., the first axis of rotation R1) relative to the fixed member 210. For example, the first base portion 222 may be coupled to the first housing 110, and the first rotary member 220 may rotate about the first connecting shaft 211 together with the first housing 110 when the first housing 110 is folded or unfolded.

In an embodiment, the second rotary member 230 may include the second extension 231 coupled to the fixed member 210 and the second base portion 232 coupled to the second housing (e.g., the second housing 120 of FIG. 7). In an embodiment, the second extension 231 may be coupled to the fixed member 210 through the second connecting shaft 212, and thus the second rotary member 230 may rotate about the second connecting shaft 212 (e.g., the second axis of rotation R2) relative to the fixed member 210. For example, the second base portion 232 may be coupled to the second housing 120, and thus the second rotary member 230 may rotate about the second connecting shaft 212 together with the second housing 120 when the second housing 120 is folded or unfolded.

In an embodiment, the first axis of rotation R1 and the second axis of rotation R2 may be parallel to the axial directions of the hinge structure 200. The first axis of rotation R1 and the second axis of rotation R2 may be formed in positions spaced apart from the display 140 in the −z-axis direction. For example, the first connecting shaft 211 and the second connecting shaft 212 may be coupled to the fixed member 210 such that the centers thereof are located in lower positions in the z-axis direction than the display 140. In an embodiment, the first connecting shaft 211 may be parallel to the first arm shaft 265, but may be spaced apart from the first arm shaft 265 so as not to form the same axis as the first arm shaft 265. The second connecting shaft 212 may be parallel to the second arm shaft 266, but may be spaced apart from the second arm shaft 266 so as not to form the same axis as the second arm shaft 266.

In an embodiment, in a folding motion of the electronic device 100, the first rotary member 220 may rotate about the first connecting shaft 211 in a first rotational direction (e.g., the clockwise direction, based on FIGS. 11A, 11B, and 12), and the second rotary member 230 may rotate about the second connecting shaft 212 in the direction opposite to the first rotational direction (e.g., the counterclockwise direction, based on FIGS. 11A, 11B, and 12).

In an embodiment, in the unfolded state, the first extension 221 of the first rotary member 220 and the second extension 231 of the second rotary member 230 may be located on substantially the same straight line. For example, the first extension 221 and the second extension 231 may form an angle of 180 degrees. In the fully unfolded state, the first extension 221 of the first rotary member 220 and the second extension 231 of the second rotary member 230 may be located to face each other in parallel. For example, the first extension 221 and the second extension 231 may form substantially 0 degrees.

Hereinafter, a rotary motion and a sliding motion of the arms 270 and 280 and the rotary members 220 and 230 of the hinge structure 200 according to an embodiment will be described with reference to FIG. 12.

In an embodiment, when the hinge structure 200 is folded or unfolded, the rotary members 220 and 230 and the arms 270 and 280 may rotate about different axes. For example, the rotary members 220 and 230 and the arms 270 and 280 may rotate along different rotational paths. As the rotational paths of the rotary members 220 and 230 and the rotational paths of the arms 270 and 270 are formed to be different from each other, the arms 270 and 280 may slide relative to the rotary members 220 and 230 when the hinge structure 200 is folded or unfolded.

In an embodiment, the first rotary member 220 may rotate about the first connecting shaft 211 (e.g., the first axis of rotation R1) in the first rotational direction. For example, in a folding motion, the first rotary member 220 may rotate in the first rotational direction (e.g., the clockwise direction). For example, based on the unfolded state, the point where the first sliding pin 274 is located in the first rotary member 220 may be defined as a first point A1. The first point A1 of the first rotary member 220 may move along a first rotational path RP1 in response to a folding motion and an unfolding motion of the electronic device 100.

In an embodiment, the first arm 270 and the first sliding pin 274 may rotate about the first arm shaft 265. For example, in a folding motion, the first arm 270 and the first sliding pin 274 may rotate together with the first rotary member 220 in the first rotational direction (e.g., the clockwise direction). For example, in the unfolded state, the first sliding pin 274 may be located at the first point A1 of the first rotary member 220 (e.g., the first position L1 of FIGS. 9A and 9B), and in the fully folded state, the first sliding pin 274 may move along the first sliding groove 227 and may be located in a position (e.g., the second position L2 of FIGS. 9A and 9B) spaced apart from the first point A1 in the direction perpendicular to the axial directions. The first sliding pin 274 may move along a second rotational path RP2 in response to a folding motion and an unfolding motion of the electronic device 100.

According to an embodiment, in a folding motion and an unfolding motion of the electronic device 100, the first arm 270 and the first sliding pin 274 may slide relative to the first rotary member 220. The first sliding pin 274 may be slidably accommodated in the first sliding groove 227 of the first rotary member 220 in the state of passing through part of the first arm 270, and thus the sliding motion of the first arm 270 and the first sliding pin 274 may be guided (e.g., refer to FIG. 9B). For example, the first sliding groove 227 may be formed in an arc shape having a predetermined curvature. Accordingly, the sliding motion between the first arm 270 and the first rotary member 220 may be smoothly performed. In an embodiment, when a folding motion is performed in the unfolded state, the distance between the first sliding pin 274 and the first point A1 may increase. When an unfolding motion is performed in the fully folded state, the distance between the first sliding pin 274 and the first point A1 may decrease.

In an embodiment, the first rotational path RP1 and the second rotational path RP2 may differ from each other. For example, the first connecting shaft 211 (e.g., the first axis of rotation R1) and the first arm shaft 265 may be parallel to each other, but may not be located on the same line. For example, when the hinge structure 200 is viewed in the cross-section, the first arm shaft 265 may be disposed so as not to overlap the first connecting shaft 211.

In an embodiment, the second rotary member 230 may rotate about the second connecting shaft 212 (e.g., the second axis of rotation R2) in a second rotational direction. For example, in a folding motion, the second rotary member 230 may rotate in the second rotational direction (e.g., the counterclockwise direction, based on FIG. 12) that is opposite to the rotational direction of the first rotary member 220 (e.g., the clockwise direction, based on FIG. 12). For example, based on the unfolded state, the point where the second sliding pin 284 is located in the second rotary member 230 may be defined as a second point A2. The second point A2 of the second rotary member 230 may move along a third rotational path RP3 in response to a folding motion and an unfolding motion of the electronic device 100.

In an embodiment, the second arm 280 and the second sliding pin 284 may rotate about the second arm shaft 266. For example, in a folding motion, the second arm 280 and the second sliding pin 284 may rotate together with the second rotary member 230 in the second rotational direction (e.g., the counterclockwise direction, based on FIG. 12). For example, in the unfolded state, the second sliding pin 284 may be located at the second point A2 of the second rotary member 230 (e.g., the first position L1 of FIGS. 9A and 9B), and in the fully folded state, the second sliding pin 284 may move along the second sliding groove 237 and may be located in a position (e.g., the second position L2 of FIGS. 9A and 9B) spaced apart from the second point A2 in the direction perpendicular to the axial directions. The second sliding pin 284 may move along a fourth rotational path RP4 in response to a folding motion and an unfolding motion of the electronic device 100.

According to an embodiment, in a folding motion and an unfolding motion of the electronic device 100, the second arm 280 and the second sliding pin 284 may slide relative to the second rotary member 230. The second sliding pin 284 may be slidably accommodated in the second sliding groove 237 of the second rotary member 230 in the state of passing through part of the second arm 280, and thus the sliding motion of the second arm 280 and the second sliding pin 284 may be guided (e.g., refer to FIG. 9B). For example, the second sliding groove 237 may be formed in an arc shape having a predetermined curvature. Accordingly, the sliding motion between the second arm 280 and the second rotary member 230 may be smoothly performed. In an embodiment, when a folding motion is performed in the unfolded state, the distance between the second sliding pin 284 and the second point A2 may increase. When an unfolding motion is performed in the fully folded state, the distance between the second sliding pin 284 and the second point A2 may decrease.

In various embodiments, the third rotational path RP3 and the fourth rotational path RP4 may differ from each other. For example, the second connecting shaft 212 (e.g., the second axis of rotation R2) and the second arm shaft 266 may be parallel to each other, but may not be located on the same line. For example, when the hinge structure 200 is viewed in the cross-section, the second arm shaft 266 may be disposed so as not to overlap the second connecting shaft 212.

Hereinafter, components of the support structure 203 of the hinge structure 200 and a coupling relationship therebetween according to an embodiment will be described with reference to FIGS. 13, 14, 15, 16A, and 16B. The support structure 203 may include the guide members 240 and 250 and the rotary plates 261 and 262.

Figure 13:
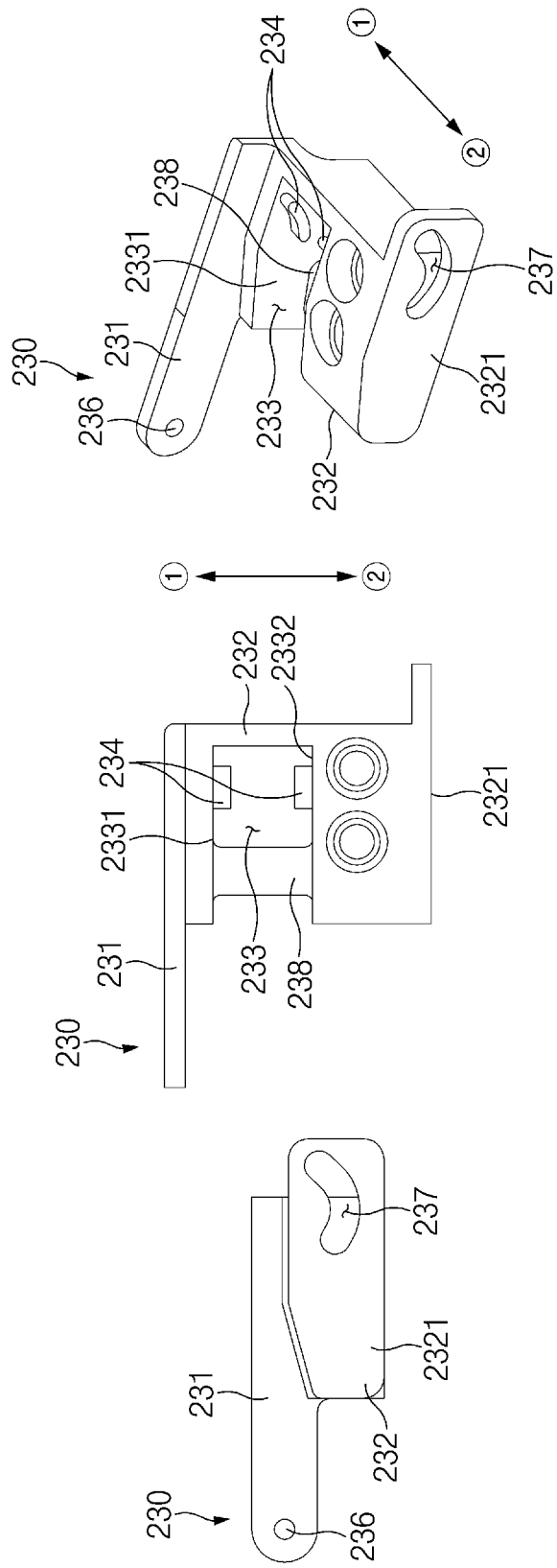
FIG. 13 is a view illustrating a rotary member of a hinge structure according to an embodiment of the disclosure.

FIG. 13 is a view illustrating a rotary member of a hinge structure according to an embodiment of the disclosure.

Figure 14:
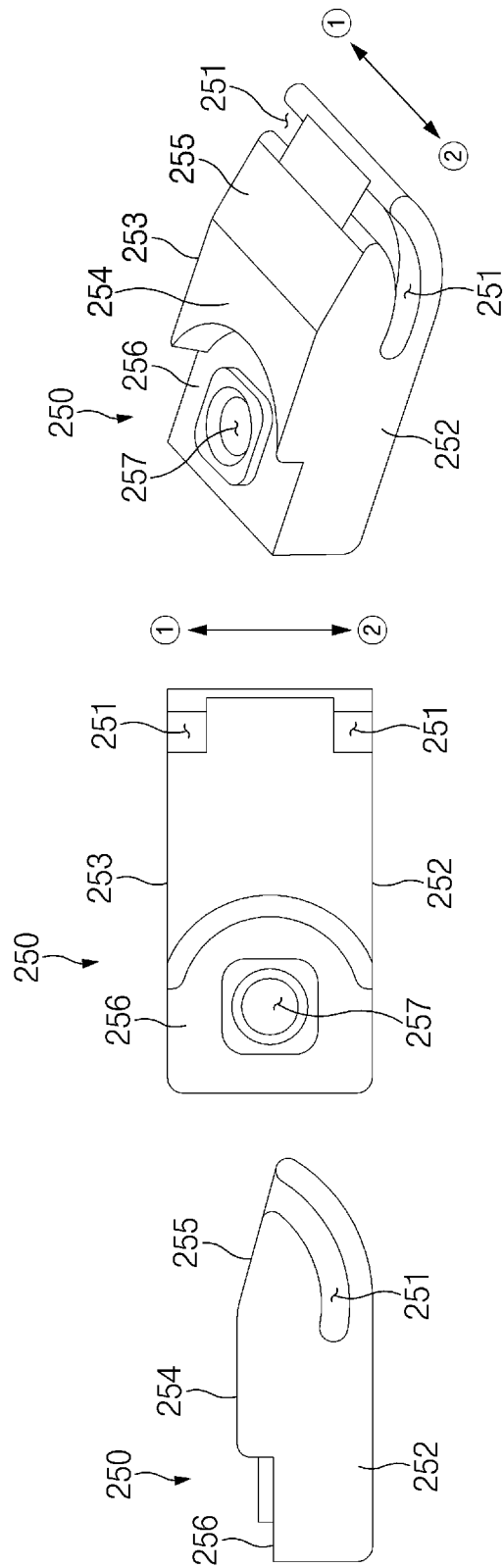
FIG. 14 is a view illustrating a guide member of a hinge structure according to an embodiment of the disclosure.

FIG. 14 is a view illustrating a guide member of a hinge structure according to an embodiment of the disclosure.

Figure 15:
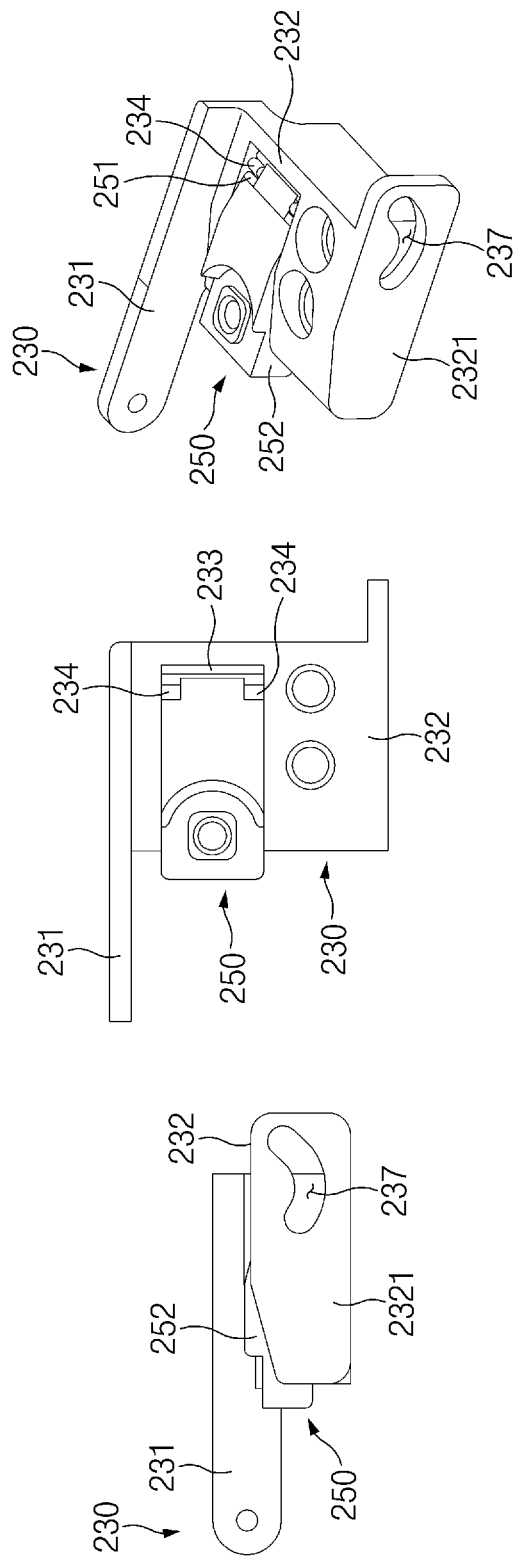
FIG. 15 is a view illustrating a coupling structure of a rotary member and a guide member of a hinge structure according to an embodiment of the disclosure.

FIG. 15 is a view illustrating a coupling structure of a rotary member and a guide member of a hinge structure according to an embodiment of the disclosure.

Referring to FIGS. 13 to 15, the hinge structure 200 according to an embodiment may include the rotary member 230 and the guide member 250, and the guide member 250 may be rotatably coupled to the rotary member 230.

The rotary member 230 and the guide member 250 illustrated in FIGS. 13 to 15 may be referred to as the second rotary member 230 and the second guide member 250 of FIGS. 3, 4, 5, 6, 7, 8, 9A, and 9B. However, contents to be described below with reference to FIGS. 13 to 15 may be identically applied to the first rotary member 220 and the first guide member 240.

Referring to FIG. 13, the rotary member 230 according to an embodiment may include a base portion 232 coupled to a housing (e.g., the housing 110 or 120 of FIG. 7) and an extension 231 that extends from the base portion 232 and that is rotatably coupled to a fixed member (e.g., the fixed member 210 of FIG. 7). For example, the base portion 232 may have, on a first surface 2321 thereof, a sliding groove 237 in which a sliding pin (e.g., the sliding pin 274 or 284 of FIGS. 8, 9A, and 9B) is accommodated. For example, the extension 231 may have a through-hole 236 formed therein in which a connecting shaft (e.g., the connecting shaft 211 or 212 of FIG. 7) is accommodated.

In an embodiment, the rotary member 230 may include an opening area 233 in which the guide member 250 is disposed. For example, the opening area 233 may be formed in at least part of the base portion 232. The guide member 250 may be rotatably coupled to the inside of the opening area 233. The guide member 250 may be configured to rotate about a virtual axis of rotation (e.g., the axis of rotation R3 or R4 of FIGS. 18A, 18B, and 19) relative to the rotary member 230 along a predetermined path in the opening area 233. For example, the opening area 233 may be formed between the first surface 2321 of the base portion 232 and the extension 231. Accordingly, the guide member 250 may be disposed between the extension 231 of the rotary member 230 and the arm 270 or 280 (e.g., refer to FIGS. 4 and 5).

In an embodiment, the rotary member 230 may include guide protrusions 234 for guiding rotation of the guide member 250. For example, the guide protrusions 234 may be accommodated in guide grooves 251 of the guide member 250 and may move along the guide grooves 251 to guide a rotational path of the guide member 250. According to the illustrated embodiment, the guide protrusions 234 may be formed in an arc shape to correspond to the guide grooves 251 formed in an arc shape. For example, the guide protrusions 234 may be formed in the shape of an arc shorter than the arcs of the guide grooves 251. However, the shape of the guide protrusions 234 is not limited to the illustrated embodiment. In another embodiment, the guide protrusions 234 may be formed in various shapes capable of moving in the guide grooves 251 along the arcs of the guide grooves 251. For example, the guide protrusions 234 may be formed in a circular protrusion shape having a size that can be accommodated in the guide grooves 251.

In an embodiment, the guide protrusions 234 may be formed on the inside of the opening area 233 so as to be accommodated in the guide grooves 251 of the guide member 250. For example, the guide protrusions 234 may be formed on sidewalls 2331 and 2332 of the opening area 233. The guide protrusions 234 may be formed on the first sidewall 2331 and/or the second sidewall 2332 facing the axial directions among sidewalls of the opening area 233. For example, the first sidewall 2331 and the second sidewall 2332 of the opening area 233 may be defined as sidewalls substantially perpendicular to the axial directions. For example, the first sidewall 2331 and the second sidewall 2332 may face each other with the opening area 233 therebetween. For example, the guide protrusions 234 may protrude from the first sidewall 2331 toward the second sidewall 2332, or may protrude from the second sidewall 2332 toward the first sidewall 2331. According to the illustrated embodiment, the guide protrusions 234 may be formed on the first sidewall 2331 and the second sidewall 2332, respectively. However, in various embodiments, the guide protrusions 234 may be formed on only one of the first sidewall 2331 and the second sidewall 2332.

In an embodiment, the rotary member 230 may include a stopper 238 for limiting the range of rotation of the guide member 250. For example, the stopper 238 may axially extend from the first sidewall 2331 to the second sidewall 2332 of the opening area 233. The stopper 238 may be brought into contact with, or spaced apart from, the guide member 250 as the guide member 250 rotates. For example, when rotating in one direction along a predetermined path, the guide member 250 may be rotatable only until the guide member 250 makes contact with the stopper 238. In various embodiments, the rotary member 230 may not include the stopper 238.

Referring to FIG. 14, the guide member 250 according to an embodiment may include the guide grooves 251 in which the guide protrusions 234 of the rotary member 230 are accommodated. For example, at least parts of the guide protrusions 234 may be accommodated in the guide grooves 251 so as to be movable along the guide grooves 251. The guide grooves 251, together with the guide protrusions 234, may guide a rotational path of the guide member 250.

In an embodiment, the guide grooves 251 may be formed in an arc shape. For example, as the guide protrusions 234 move along the guide grooves 251 having an arc shape, the guide member 250 may rotate about the center of the arc relative to the rotary member 230. In an embodiment, the guide member 250 may rotate about a virtual axis of rotation R3 or R4 relative to the rotary member 230, and the virtual axis of rotation may be defined as the center of the arcs of the guide grooves 251. In various embodiments, the center of the arcs of the guide grooves 251 may overlap at least part of the display 140 when the display 140 is viewed in the axial directions. A relative positional relationship between the axis of rotation of the guide member 250 and the display 140 will be described below with reference to FIG. 20.

In an embodiment, the guide grooves 251 may be formed on at least some side surfaces of the guide member 250 so as to face the axial directions. For example, the guide grooves 251 may be formed on side surfaces 252 and 253 of the guide member 250 that face the axial directions. The guide member 250 may include the first side surface 252 facing the first axial direction ① and the second side surface 253 facing the second axial direction ②. For example, the first side surface 252 and the second side surface 253 of the guide member 250 may be defined as side surfaces substantially perpendicular to the axial directions. For example, the second side surface 253 may be a side surface facing away from the first side surface 252. The guide grooves 251 may be recessed from the first side surface 252 toward the second side surface 253, or may be recessed from the second side surface 253 toward the first side surface 252. The guide grooves 251 may be formed in a form in which one end portion is open.

In an embodiment, the guide member 250 may include a seating surface 254 that connects the first side surface 252 and the second side surface 253 and on which a rotary plate (e.g., the rotary plate 261 or 262 of FIGS. 16A and 16B) is seated, and an inclined surface 255 obliquely extending from the seating surface 254. In an embodiment, a coupling area 256 to which the rotary plate 261 or 262 is coupled may be formed in one area of the seating surface 254. The coupling area 256 may be recessed from another area of the seating surface 254. For example, a coupling hole 257 for fixedly coupling the rotary plate 261 or 262 may be formed in the coupling area 256. In an embodiment, the inclined surface 255 may extend from the seating surface 254 so as to be downwardly inclined, and the open end portions of the guide grooves 251 may be formed in at least partial areas of the inclined surface 255. For example, the guide grooves 251 may extend in an arc shape from the partial areas of the inclined surface 255 to partial areas of the side surfaces 252 and 253 of the guide member 250.

Referring to FIG. 15, the guide member 250 may be coupled to the inside of the opening area 233 of the rotary member 230 such that the guide protrusions 234 are accommodated in the guide grooves 251. Accordingly, the guide member 250 may rotate relative to the rotary member 230 along an arc-shaped rotational path formed by the guide protrusions 234 and the guide grooves 251. In the state in which the guide member 250 is accommodated in the opening area 233 of the rotary member 230, the first side surface 252 of the guide member 250 may face the first sidewall 2331 of the opening area 233, and the second side surface 253 of the guide member 250 may face the second sidewall 2332 of the opening area 233. For example, the guide protrusion 234 formed on the first sidewall 2331 may be accommodated in the guide groove 251 formed on the first side surface 252, and the guide protrusion 234 formed on the second sidewall 2332 may be accommodated in the guide groove 251 formed on the second side surface 253.

Figure 16A:
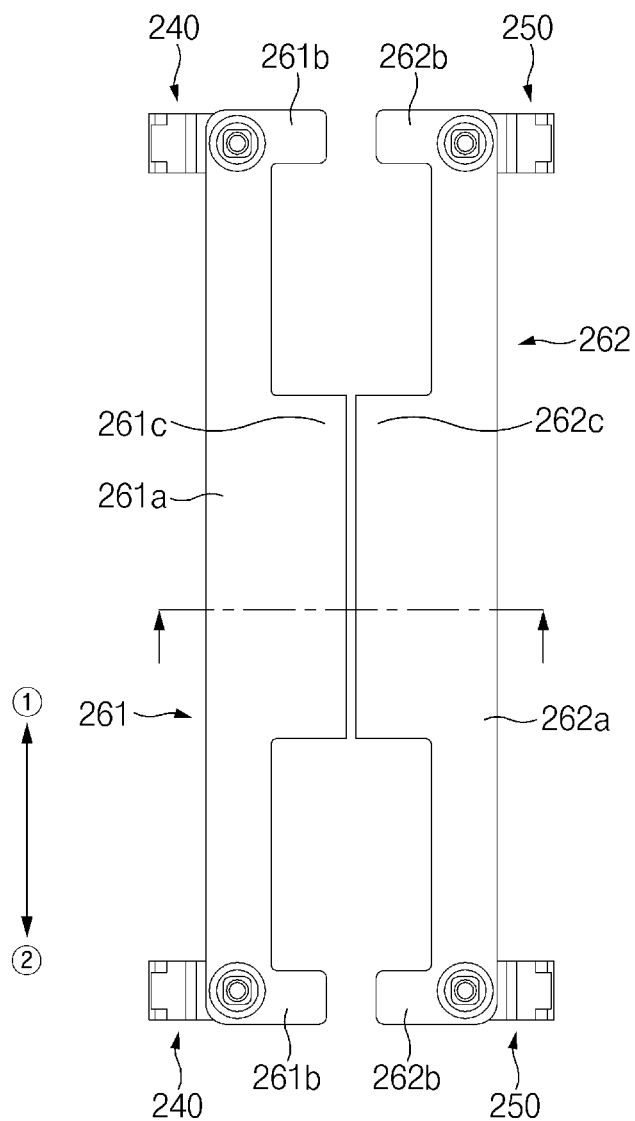
FIG. 16A is a view illustrating a coupling structure of guide members and rotary plates of a hinge structure according to an embodiment of the disclosure.

FIG. 16A is a view illustrating a coupling structure of guide members and rotary plates of a hinge structure according to an embodiment of the disclosure.

Figure 16B:
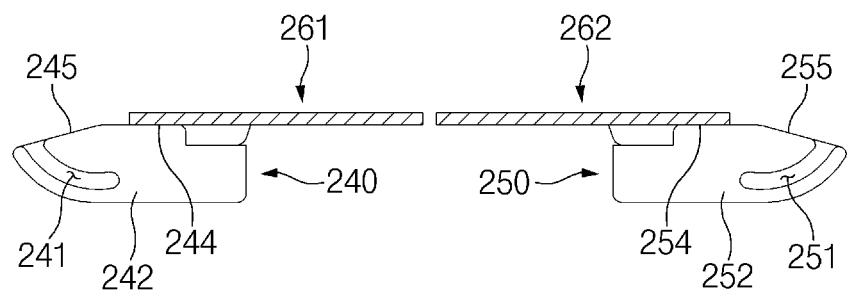
FIG. 16B is a view illustrating a coupling structure of guide members and rotary plates of a hinge structure according to an embodiment of the disclosure.

FIG. 16B is a view illustrating a coupling structure of guide members and rotary plates of a hinge structure according to an embodiment of the disclosure.

FIG. 16A is a plan view of the guide members and the rotary plates. FIG. 16B is a view of the guide members and the rotary plates of FIG. 16A as viewed in the first axial direction.

Referring to FIGS. 16A and 16B, the hinge structure 200 according to an embodiment may include the first guide member 240, the second guide member 250, the first rotary plate 261, and the second rotary plate 262.

In an embodiment, the first guide member 240 may be coupled to at least a partial area of the first rotary plate 261 such that the first rotary plate 261 moves (or, rotates) together with the first guide member 240 when the first guide member 240 rotates relative to the first rotary member (e.g., the first rotary member 220 of FIGS. 5 and 6). For example, the first guide member 240 and the first rotary plate 261 may be configured to integrally move through screw coupling.

In an embodiment, the first guide member 240 may include a first seating surface 244 to which the first rotary plate 261 is coupled and a first inclined surface 245 obliquely extending from the first seating surface 244. For example, at least part of the first rotary plate 261 may be coupled to the first seating surface 244. Referring to FIGS. 16A and 16B, when the first rotary plate 261 is viewed from above, at least part of the first seating surface 244 may overlap the first rotary plate 261, and the first inclined surface 245 may not overlap the first rotary plate 261.

In an embodiment, the first guide grooves 241 having an arc shape may be formed on side surfaces 242 of the first guide member 240. For example, the center of the arcs of the first guide grooves 241 may be defined as an axis of rotation of a rotary motion of the first guide member 240 and the first rotary plate 261.

In an embodiment, the second guide member 250 may be coupled to at least a partial area of the second rotary plate 262 such that the second rotary plate 262 moves (or, rotates) together with the second guide member 250 when the second guide member 250 rotates relative to the second rotary member (e.g., the second rotary member 230 of FIGS. 5 and 6). For example, the second guide member 250 and the second rotary plate 262 may be configured to integrally move through screw coupling.

In an embodiment, the second guide member 250 may include a second seating surface 254 to which the second rotary plate 262 is coupled and a second inclined surface 255 obliquely extending from the second seating surface 254. For example, at least part of the second rotary plate 262 may be coupled to the second seating surface 254. Referring to FIGS. 16A and 16B, when the second rotary plate 262 is viewed from above, at least part of the second seating surface 254 may overlap the second rotary plate 262, and the second inclined surface 255 may not overlap the second rotary plate 262.

In an embodiment, the second guide grooves 251 having an arc shape may be formed on side surfaces 252 of the second guide member 250. For example, the center of the arcs of the second guide grooves 251 may be defined as an axis of rotation of a rotary motion of the second guide member 250 and the second rotary plate 262.

In an embodiment, the first rotary plate 261 may include the first support portion 261a extending in the axial directions, and the second support portions 261b and the third support portion 261c that extend from the first support portion 261a in the direction perpendicular to the axial directions and that are spaced apart from each other in the axial directions. For example, the second support portions 261b may extend from the opposite axial end portions of the first support portion 261a, and the third support portion 261c may extend from one area of the first support portion 261a so as to be located between the second support portions 261b. For example, the first guide members 240 may be coupled to the opposite axial end portions of the first support portion 261a. For example, openings (not illustrated) for screw coupling may be formed in the opposite axial end portions of the first support portion 261a. The openings may overlap coupling holes (e.g., the coupling hole 257 in the coupling area 256 of FIG. 14) that are formed in the first seating surfaces 244.

In an embodiment, the second rotary plate 262 may include the fourth support portion 262a extending in the axial directions, and the fifth support portions 262b and the sixth support portion 262c that extend from the fourth support portion 262a in the direction perpendicular to the axial directions and that are spaced apart from each other in the axial directions. For example, the fifth support portions 262b may extend from the opposite axial end portions of the fourth support portion 262a, and the sixth support portion 262c may extend from one area of the fourth support portion 262a so as to be located between the fifth support portions 262b. For example, the second guide members 250 may be coupled to the opposite axial end portions of the fourth support portion 262a. For example, openings (not illustrated) for screw coupling may be formed in the opposite axial end portions of the fourth support portion 262a. The openings may overlap coupling holes (e.g., the coupling hole 257 in the coupling area 256 of FIG. 14) that are formed in the second seating surfaces 254.

Hereinafter, an operation in which the guide members 240 and 250 and the rotary plates 261 and 262 rotate relative to the rotary members 220 and 230 by a repulsive force of the display 140 in a folding motion will be described with reference to FIGS. 17, 18A, 18B, 19, and 20.

Figure 17:
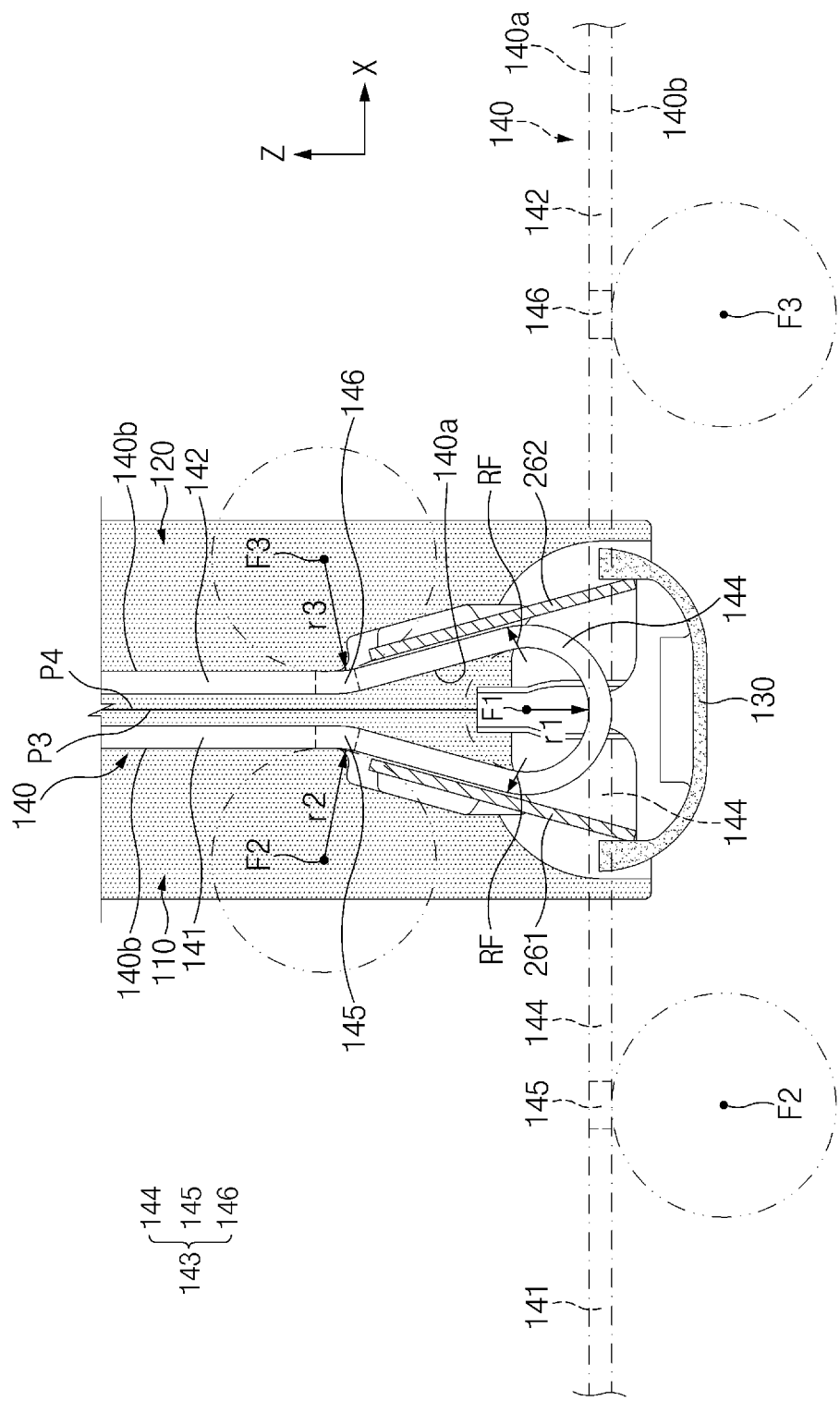
FIG. 17 is a view illustrating folding axes of a display of an electronic device according to an embodiment of the disclosure.

FIG. 17 is a view illustrating folding axes of a display of an electronic device according to an embodiment of the disclosure.

FIG. 17 illustrates the shape of the display when the electronic device is in an unfolded state or a fully folded state. For example, the display illustrated by dotted lines in FIG. 17 represents the shape of the display when the electronic device is in the unfolded state.

Referring to FIG. 17, the electronic device 100 according to an embodiment may include the first housing 110, the second housing 120, the display 140, the first rotary plate 261, and the second rotary plate 262. For example, FIG. 17 may be a sectional view of the electronic device (e.g., the electronic device 100 of FIG. 2C) taken along line S-S' illustrated in FIG. 2C, and repetitive descriptions will hereinafter be omitted.

In an embodiment, when the housings 110 and 120 are folded, the display 140 may be folded as at least partial areas of the display 140 move together with the housings 110 and 120. For example, the display 140 may include the first area 141 disposed on the first housing 110, the second area 142 disposed on the second housing 120, and the folding area 143 located between the first area 141 and the second area 142. In an embodiment, the first area 141 may be attached to at least part of the first housing 110, and the second area 142 may be attached to at least part of the second housing 120. For example, the first area 141 may move together with the first housing 110 when the first housing 110 is folded or unfolded. The second area 142 may move together with the second housing 120 when the second housing 120 is folded or unfolded. For example, the folding area 143 may partially form a curved surface or a flat surface as the first housing 110 and the second housing 120 are folded or unfolded.

Figure 20:
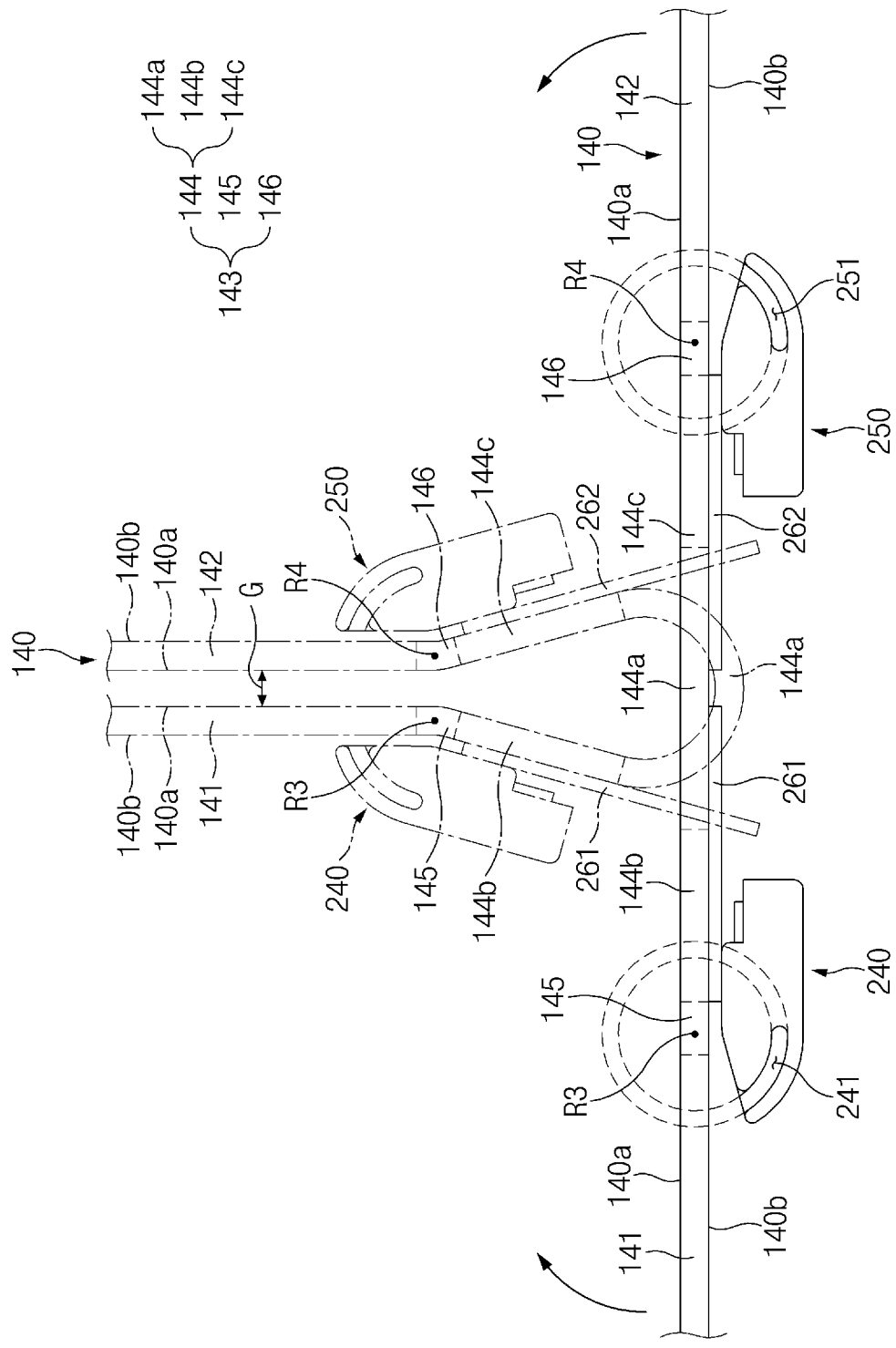
FIG. 20 is a view illustrating axes of rotation of guide members and rotary plates of a hinge structure according to an embodiment of the disclosure.

In an embodiment, the folding area 143 of the display may include a portion (e.g., a variable area 144a of the in-folding area 144 or the out-folding area 145 and 146 of FIG. 20) that deforms to be curved or flat while being folded when the first housing 110 and the second housing 120 are folded or unfolded, and a portion (e.g., non-variable areas 144b and 144c of the in-folding area 144 of FIG. 20) that remains substantially flat without being folded. The variable area 144a and the non-variable areas 144b and 144c of the in-folding area 144 will be described below with reference to FIG. 20.

In an embodiment, the display 140 may generate a repulsive force RF in a folding motion. For example, the repulsive force RF may be generated from the folding area 143 as the folding area 143 forms a curved surface when the folding motion is performed. In an embodiment, the repulsive force RF may act on the first rotary plate 261 and the second rotary plate 262. For example, the repulsive force RF may push the first rotary plate 261 and the second rotary plate 262 in opposite directions. The first rotary plate 261 and the second rotary plate 262 may rotate along arc-shaped rotational paths by the repulsive force RF (e.g., refer to FIGS. 18A and 18B) and may thus support the display 140 such that the display 140 forms a specific shape (e.g., a water-drop shape or a jar shape).

In an embodiment, as illustrated in FIG. 17, in the fully folded state, the display 140 may be supported by the rotary plates 261 and 262 such that the display 140 pushes the rotary plates 261 and 262 by the repulsive force RF to form a specific shape. For example, in the fully folded state, different regions of the folding area 143 of the display 140 may be partially curved.

In an embodiment, the folding area 143 of the display 140 may include the in-folding area 144, the first out-folding area 145 located between the first area 141 and the in-folding area 144, and the second out-folding area 146 located between the second area 142 and the in-folding area 144. For example, the folding area 143 may be configured such that in the unfolded state, the in-folding area 144 and the out-folding areas 145 and 146 form substantially the same plane as the first area 141 and the second area 142. For example, the folding area 143 may be configured such that in a folded state, the in-folding area 144 and the out-folding areas 145 and 146 are partially curved. Referring to FIG. 17, in the fully folded state, the in-folding area 144 and the out-folding areas 145 and 146 may be folded so that the display 140 may be formed in a water-drop shape or a jar shape.

In an embodiment, the display 140 may include a first surface 140a forming the outer surface (or, the front surface) of the electronic device 100 in the unfolded state and a second surface 140b facing away from the first surface 140a. For example, the first surface 140a may refer to the surface exposed outside the electronic device 100 in the unfolded state, and the second surface 140b may refer to the rear surface of the display 140. For example, the second surface 140b may refer to the surface to which the first housing 110, the second housing 120, the first rotary plate 261, and the second rotary plate 262 are attached.

In an embodiment, the in-folding area 144 may refer to the area where the display 140 is folded inward, and the out-folding areas 145 and 146 may refer to the areas where the display 140 is folded outward. For example, the in-folding area 144 may be defined as an area where one area and another area of the first surface 140a are folded toward each other. The out-folding areas 145 and 146 may be defined as areas where one area and another area of the second surface 140b are folded toward each other.

In an embodiment, in the fully folded state, at least part of the in-folding area 144 may form a curved surface whose center of curvature coincides with a first folding axis F1. In an embodiment, in the fully folded state, at least part of the first out-folding area 145 may form a curved surface whose center of curvature coincides with a second folding axis F2. In an embodiment, in the fully folded state, at least part of the second out-folding area 146 may form a curved surface whose center of curvature coincides with a third folding axis F3. For example, in the fully folded state, the curvature of the curved surface of the in-folding area 144 may be greater than the curvatures of the curved surfaces of the out-folding areas 145 and 146.

As illustrated in FIG. 17, in the fully folded state, the distance r1 between the curved surface of the in-folding area 144 and the first folding axis F1 may be the minimum radius of curvature of the in-folding area 144. In the fully folded state, the distance r2 between the curved surface of the first out-folding area 145 and the second folding axis F2 may be the minimum radius of curvature of the first out-folding area 145. In the fully folded state, the distance r3 between the curved surface of the second out-folding area 146 and the third folding axis F3 may be the minimum radius of curvature of the second out-folding area 146. For example, the minimum radius of curvature r1 of the in-folding area 144 may be smaller than the minimum radii of curvature r2 and r3 of the out-folding areas 145 and 146. The minimum radius of curvature r2 of the first out-folding area 145 may be substantially the same as the minimum radius of curvature r3 of the second out-folding area 146.

In an embodiment, the first folding axis F1 may be located in the direction toward the first surface 140a with respect to the display 140, and the second folding axis F2 and the third folding axis F3 may be located in the direction toward the second surface 140b with respect to the display 140. For example, when the electronic device 100 is in the unfolded state, the display 140 may be configured such that the first folding axis F1 is located in the +z-axis direction from the first surface 140a and the second folding axis F2 and the third folding axis F3 are located in the −z-axis direction from the second surface 140b. For example, the distance by which the first folding axis F1 is spaced apart from the first surface 140a in the +z-axis direction may be smaller than the distances by which the second folding axis F2 and the third folding axis F3 are spaced apart from the second surface 140b in the −z-axis direction.

According to the embodiment illustrated in FIG. 17, in the fully folded state, the first area 141 and the second area 142 of the display 140 may be disposed to face each other in parallel. For example, in the fully folded state, the first area 141 and the second area 142 may extend parallel to each other in the z-axis direction from the opposite end portions of the folding area 143. For example, the first area 141 and the second area 142 may extend parallel to each other in the state of being spaced apart from each other by a specified gap (e.g., gap G of FIG. 20) in the direction perpendicular to the edges P3 and P4 of the housings 110 and 120.

The electronic device 100 according to an embodiment may be configured such that in the fully folded state, the in-folding area 144 and the out-folding areas 145 and 146 of the display 140 are folded about the folding axes F1, F2, and F3, respectively, and the first area 141 and the second area 142 extend parallel to each other. Accordingly, in the fully folded state, the curvature of the folding area 143 may be made smaller than a specified value so that a fold in the folding area 143 may be improved, and as the first area 141 and the second area 142 extend parallel to each other, the third edge P3 of the first housing 110 and the fourth edge P4 of the second housing 120 may completely make contact with each other such that a gap is not generated therebetween.

Figure 18A:
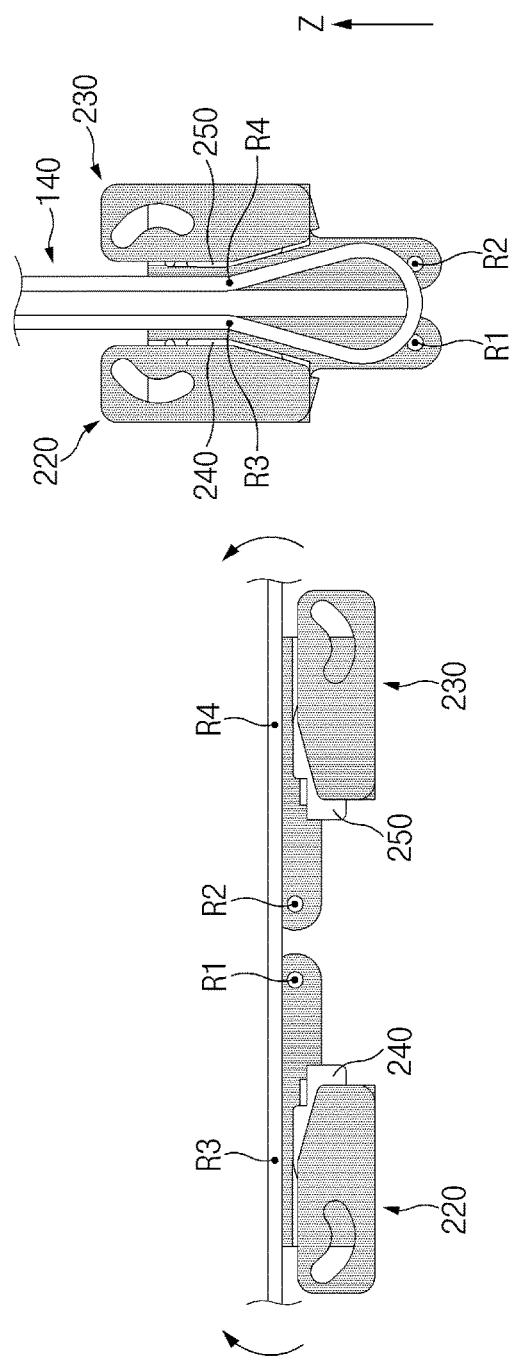
FIG. 18A is a view illustrating the display, rotary members, guide members, and rotary plates of an electronic device according to an embodiment of the disclosure.

FIG. 18A is a view illustrating a display, rotary members, guide members, and rotary plates of an electronic device according to an embodiment of the disclosure.

Figure 18B:
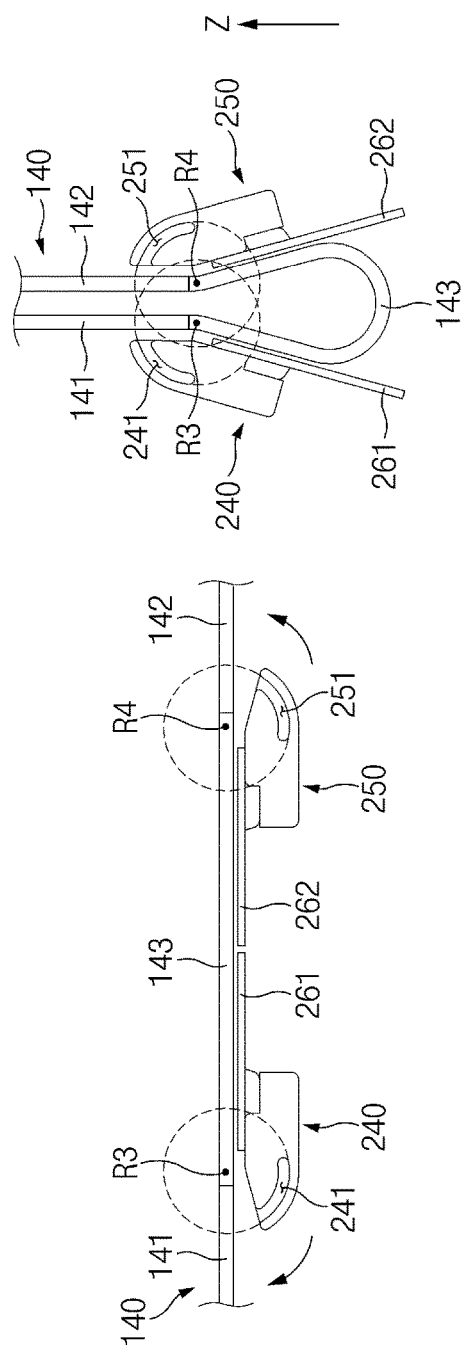
FIG. 18B is a view illustrating a display, rotary members, guide members, and rotary plates of an electronic device according to an embodiment of the disclosure.

FIG. 18B is a view illustrating a display, rotary members, guide members, and rotary plates of an electronic device according to an embodiment of the disclosure.

Figure 19:
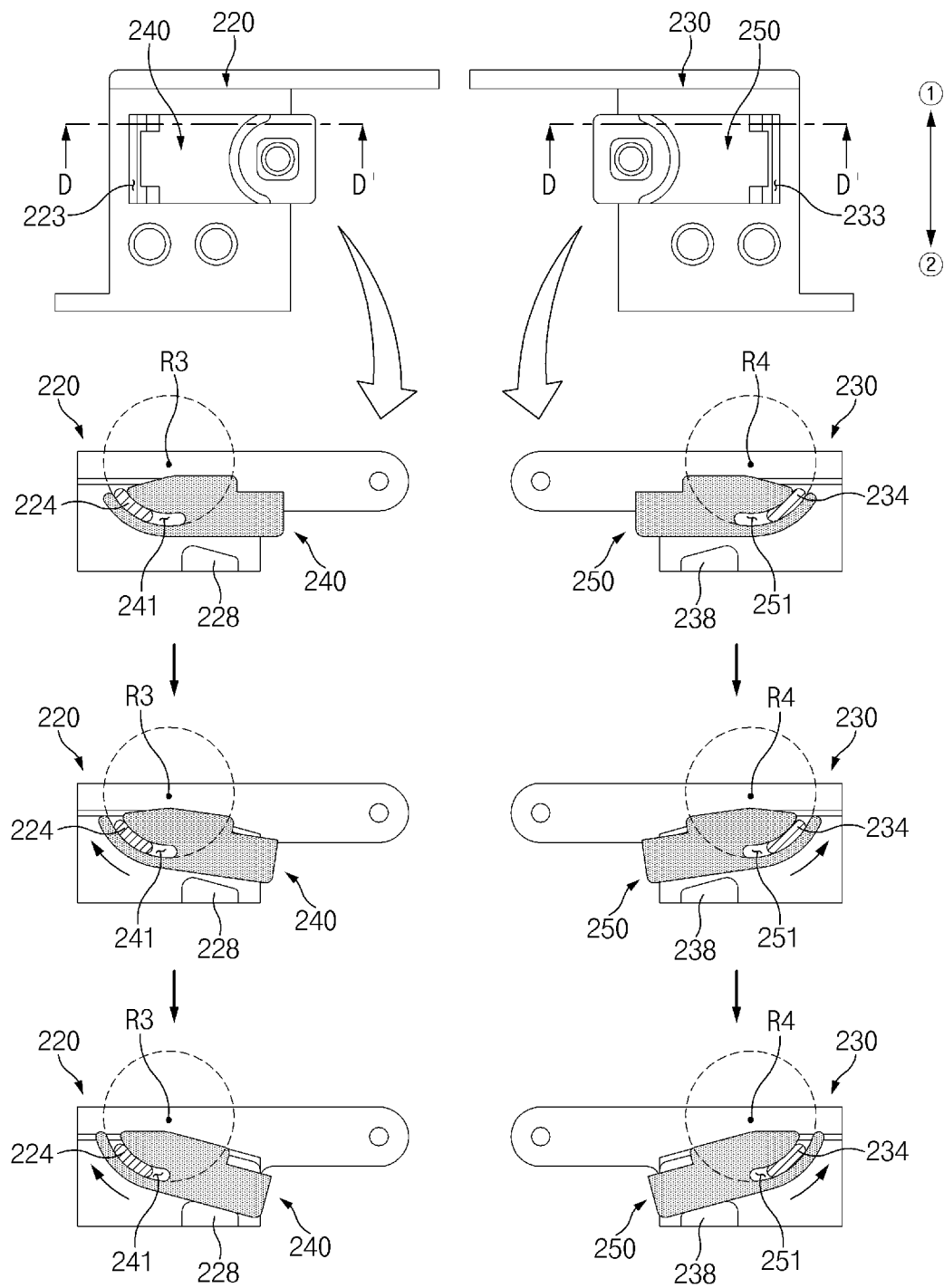
FIG. 19 is a view illustrating a rotary motion of guide members of a hinge structure according to an embodiment of the disclosure.

FIG. 19 is a view illustrating a rotary motion of guide members of a hinge structure according to an embodiment of the disclosure.

FIGS. 18A and 18B illustrate an operation in which in a folding motion, the rotary plates and the guide members are rotated by a repulsive force of the display. FIG. 19 illustrates an operation in which in the folding motion, the guide protrusions of the guide members rotate along specified paths in the guide grooves of the rotary members.

FIG. 18A illustrates an operation in which the guide members rotate relative to the rotary members when the rotary members rotate and may be a view in which the rotary plates are omitted. FIG. 18B illustrates a rotary motion of the guide members and the rotary plates and may be a view in which the rotary members are omitted. The sectional views of the rotary members and the guide members illustrated in FIG. 19 may be sectional views taken along lines D-D' in FIG. 19.

Referring to FIGS. 18A, 18B, and 19, the hinge structure 200 according to an embodiment may include the first rotary member 220, the second rotary member 230, the first guide member 240, the second guide member 250, the first rotary plate 261, and the second rotary plate 262.

In an embodiment, the first guide member 240 and the first rotary plate 261 may be configured to rotate about the third axis of rotation R3 by the repulsive force (e.g., the repulsive force RF of FIG. 17) of the display 140. In an embodiment, the second guide member 250 and the second rotary plate 262 may be configured to rotate about the fourth axis of rotation R4 by the repulsive force of the display 140.

In an embodiment, in the folding motion of the electronic device 100, the first rotary member 220 may rotate about the first axis of rotation R1 in the first rotational direction (e.g., the clockwise direction, based on FIGS. 18A and 18B). In the folding motion, the first rotary plate 261 and the first guide member 240 may rotate about the third axis of rotation R3 in the first rotational direction by the repulsive force of the display 140. For example, a repulsive force generated from the folding area 143 as the folding area 143 is folded in the folding motion may be transmitted to the first rotary plate 261. The first rotary plate 261 may be coupled to integrally move together with the first guide member 240 (e.g., refer to FIGS. 16A and 16B), and the first guide member 240 may rotate about the third axis of rotation R3 along a specified path relative to the first rotary member 220 by the repulsive force transmitted to the first rotary plate 261.

In an embodiment, the third axis of rotation R3 and/or the rotational path of the first guide member 240 may be formed by the first guide grooves 241 of the first guide member 240. In an embodiment, the first guide grooves 241 may be formed in a substantially arc shape. The center of the arcs of the first guide grooves 241 may form the third axis of rotation R3 of the first guide member 240. For example, the third axis of rotation R3 may be parallel to the first axis of rotation R1.

In an embodiment, the third axis of rotation R3 may be located on the display 140. For example, the third axis of rotation R3 may be located in at least a partial area of the display 140 when the electronic device 100 is viewed in the axial directions. For example, the third axis of rotation R3 may be located between the opposite surfaces of the display 140 in the thickness direction. Based on FIGS. 18A and 18B, the third axis of rotation R3 may be located between a first surface (e.g., the front surface, the upper surface, or the first surface 140a of FIG. 20) and a second surface (e.g., the rear surface, the lower surface, or the second surface 140b of FIG. 20) of the display 140. For example, the third axis of rotation R3 may pass through at least part of the display 140 in the axial directions. For example, the third axis of rotation R3 may overlap the display 140 when the cross-section of the display 140 is viewed. For example, in an unfolded state, the third axis of rotation R3 may be located in the +z-axis direction with respect to the first rotary plate 261. For example, in the unfolded state, the third axis of rotation R3 may be located in a higher position in the +z-axis direction than the first axis of rotation R1.

In an embodiment, in the folding motion of the electronic device 100, the second rotary member 230 may rotate about the second axis of rotation R2 in the second rotational direction (e.g., the counterclockwise direction, based on FIGS. 18A and 18B). In the folding motion, the second rotary plate 262 and the second guide member 250 may rotate about the fourth axis of rotation R4 in the second rotational direction by the repulsive force of the display 140. For example, the repulsive force generated from the folding area 143 as the folding area 143 is folded in the folding motion may be transmitted to the second rotary plate 262. The second rotary plate 262 may be coupled to integrally move together with the second guide member 250 (e.g., refer to FIGS. 16A and 16B), and the second guide member 250 may rotate about the fourth axis of rotation R4 in the second rotational direction (e.g., the counterclockwise direction) relative to the second rotary member 230 by the repulsive force transmitted to the second rotary plate 262.

In an embodiment, the fourth axis of rotation R4 and/or the rotational path of the second guide member 250 may be formed by the second guide grooves 251 of the second guide member 250. In an embodiment, the second guide grooves 251 may be formed in a substantially arc shape. The center of the arcs of the second guide grooves 251 may form the fourth axis of rotation R4 of the second guide member 250. For example, the fourth axis of rotation R4 may be parallel to the second axis of rotation R2.

In an embodiment, the fourth axis of rotation R4 may be located on the display 140. For example, the fourth axis of rotation R4 may be located in at least a partial area of the display 140 when the electronic device 100 is viewed in the axial directions. For example, the fourth axis of rotation R4 may be located between the opposite surfaces of the display 140 in the thickness direction. Based on FIGS. 18A and 18B, the fourth axis of rotation R4 may be located between the first surface (e.g., the front surface, the upper surface, or the first surface 140a of FIG. 20) and the second surface (e.g., the rear surface, the lower surface, or the second surface 140b of FIG. 20) of the display 140. For example, the fourth axis of rotation R4 may pass through at least part of the display 140 in the axial directions. For example, the fourth axis of rotation R4 may overlap the display 140 when the cross-section of the display 140 is viewed. For example, in the unfolded state, the fourth axis of rotation R4 may be located in the +z-axis direction with respect to the second rotary plate 262. For example, in the unfolded state, the fourth axis of rotation R4 may be located in a higher position in the +z-axis direction than the second axis of rotation R2.

In an embodiment, when folding and unfolding motions are performed, the rotational direction of the first rotary member 220 and the rotational direction of the second rotary member 230 may be opposite to each other. Furthermore, when the folding and unfolding motions are performed, the rotational direction of the first guide member 240 and the first rotary plate 261 and the rotational direction of the second guide member 250 and the second rotary plate 262 may be opposite to each other.

Referring to FIG. 19, the guide protrusions 224 and 234 of the rotary members 220 and 230 may relatively slide in the guide grooves 241 and 251 of the guide members 240 and 250 as the guide members 240 and 250 rotate about the axes of rotation R3 and R4. For example, the rotational paths of the rotary members 220 and 230 may be defined as paths along which the guide protrusions 224 and 234 move in the arc-shaped guide grooves 241 and 251. FIG. 19 may be a view illustrating an operation in which the guide members 240 and 250 rotate about the axes of rotation R3 and R4 in the opening areas 223 and 233.

In an embodiment, the first guide member 240 may be coupled to the first rotary member 220 so as to be rotatable about the third axis of rotation R3 in the first opening area 223. The first guide member 240 may rotate about the third axis of rotation R3 relative to the first rotary member 220 in the state in which the first guide protrusions 224 of the first rotary member 220 are accommodated in the first guide grooves 241. For example, when the display 140 is folded or unfolded, the first guide member 240 may rotate by a specified range along an arc-shaped rotational path whose center coincides with the third axis of rotation R3.

In an embodiment, when the display 140 is folded, the first guide member 240 may rotate about the third axis of rotation R3 in the first rotational direction (e.g., the clockwise direction, based on FIG. 19) (e.g., may rotate in the direction of an arrow in the left-side sectional view of FIG. 19). Accordingly, when the cross-section of the first rotary member 220 and the first guide member 240 is viewed, the first guide protrusions 224 may be seen to relatively rotate in the second rotational direction (e.g., the counterclockwise direction, based on FIG. 19) opposite to the first rotational direction in the first guide grooves 241. In an embodiment, when the display 140 is unfolded, the first guide member 240 may rotate about the third axis of rotation R3 in the second rotational direction (e.g., the counterclockwise direction, based on FIG. 19) (e.g., may operate in the direction opposite to that of the arrow in the left-side sectional view of FIG. 19).

In various embodiments, the first guide member 240 may rotate until part of the first guide member 240 makes contact with the stopper 228 of the first rotary member 220. For example, the rotation of the first guide member 240 in the first rotational direction may be limited by the contact with the stopper 228, and the first rotary plate 261, while resisting the repulsive force of the display 140, may support the display 140 such that the display 140 forms a specific shape.

In an embodiment, the second guide member 250 may be coupled to the second rotary member 230 so as to be rotatable about the fourth axis of rotation R4 in the second opening area 233. The second guide member 250 may rotate about the fourth axis of rotation R4 relative to the second rotary member 230 in the state in which the second guide protrusions 234 of the second rotary member 230 are accommodated in the second guide grooves 251. For example, when the display 140 is folded or unfolded, the second guide member 250 may rotate by a specified range along an arc-shaped rotational path whose center coincides with the fourth axis of rotation R4.

In an embodiment, when the display 140 is folded, the second guide member 250 may rotate about the fourth axis of rotation R4 in the second rotational direction (e.g., the counterclockwise direction, based on FIG. 19) (e.g., may operate in the direction of an arrow in the right-side sectional view of FIG. 19). Accordingly, when the cross-section of the second rotary member 230 and the second guide member 250 is viewed, the second guide protrusions 234 may be seen to relatively rotate in the first rotational direction (e.g., the clockwise direction, based on FIG. 19) opposite to the second rotational direction in the second guide grooves 251. In an embodiment, when the display 140 is unfolded, the second guide member 250 may rotate about the fourth axis of rotation R4 in the first rotational direction (e.g., the clockwise direction) (e.g., may operate in the direction opposite to that of the arrow in the right-side sectional view of FIG. 19).

In various embodiments, the second guide member 250 may rotate until part of the second guide member 250 makes contact with the stopper 238 of the second rotary member 230. For example, the rotation of the second guide member 250 in the second rotational direction may be limited by the contact with the stopper 238, and the second rotary plate 262, while resisting the repulsive force of the display 140, may support the display 140 such that the display 140 forms a specific shape.

According to the illustrated embodiment, the guide protrusions 224 and 234 may be formed on the rotary members 220 and 230, and the guide grooves 241 and 251 may be formed on the guide members 240 and 250. However, the positions of the guide protrusions 224 and 234 and the guide grooves 241 and 251 are not limited to the illustrated embodiment. In various embodiments, the guide protrusions 224 and 234 may be formed on the guide members 240 and 250, and the guide grooves 241 and 251 may be formed on the rotary members 220 and 230.

FIG. 20 is a view illustrating axes of rotation of guide members and rotary plates of a hinge structure according to an embodiment of the disclosure.

Referring to FIG. 20, the hinge structure 200 according to an embodiment may be configured such that the guide members 240 and 250 and the rotary plates 261 and 262 rotate about virtual axes of rotation (e.g., the third axis of rotation R3 and the fourth axis of rotation R4).

In an embodiment, the third axis of rotation R3 may be defined as the center of a rotary motion of the first guide member 240 and the first rotary plate 261. The third axis of rotation R3 may refer to a virtual axis formed by the first guide grooves 241 having an arc shape. For example, the third axis of rotation R3 may be defined as the center of the arcs of the arc-shaped first guide grooves 241. For example, the first guide member 240 and the first rotary plate 261 may rotate in a predetermined range along an arc-shaped rotational path whose center coincides with the third axis of rotation R3.

In an embodiment, the third axis of rotation R3 may be located between the opposite surfaces of the display 140 in the thickness direction. For example, the third axis of rotation R3 may be located between the first surface 140a and the second surface 140b of the display 140. In an embodiment, the third axis of rotation R3 may be formed in a position substantially overlapping the display 140. For example, when the cross-section of the display 140 is viewed, the third axis of rotation R3 may overlap at least a partial area (e.g., the folding area 143) of the display 140. For example, the third axis of rotation R3 may be seen to pass through at least a partial area of the display 140 in a direction parallel to the axial directions.

In an embodiment, the fourth axis of rotation R4 may be defined as the center of a rotary motion of the second guide member 250 and the second rotary plate 262. The fourth axis of rotation R4 may refer to a virtual axis formed by the second guide grooves 251 having an arc shape. For example, the fourth axis of rotation R4 may be defined as the center of the arcs of the arc-shaped second guide grooves 251. For example, the second guide member 250 and the second rotary plate 262 may rotate in a predetermined range along an arc-shaped rotational path whose center coincides with the fourth axis of rotation R4.

In an embodiment, the third axis of rotation R3 may be located between the opposite surfaces of the display 140 in the thickness direction. For example, the fourth axis of rotation R4 may be located between the first surface 140a and the second surface 140b of the display 140. In an embodiment, the fourth axis of rotation R4 may be formed in a position substantially overlapping the display 140. For example, when the cross-section of the display 140 is viewed, the fourth axis of rotation R4 may overlap at least a partial area (e.g., the folding area 143) of the display 140. For example, the fourth axis of rotation R4 may be seen to pass through at least a partial area of the display 140 in a direction parallel to the axial directions.

In an embodiment, the third axis of rotation R3 and the fourth axis of rotation R4 may overlap different regions of the folding area 143 of the display 140. For example, the display 140 may include the first area 141, the second area 142, and the folding area 143 located between the first area 141 and the second area 142. The folding area 143 may include the in-folding area 144, the first out-folding area 145 located between the first area 141 and the in-folding area 144, and the second out-folding area 146 located between the second area 142 and the in-folding area 144. In an embodiment, the third axis of rotation R3 may overlap at least part of the first out-folding area 145 when the cross-section of the display 140 is viewed. In an embodiment, the fourth axis of rotation R4 may overlap at least part of the second out-folding area 146 when the cross-section of the display 140 is viewed.

According to the embodiment illustrated in FIG. 20, the in-folding area 144 of the display 140 may be configured such that in folding and unfolding motions, one portion deforms to be curved or flat and the other portions remain flat.

In an embodiment, the in-folding area 144 of the display 140 may include the variable area 144a that deforms to be curved or flat in response to folding and unfolding motions, and the first non-variable area 144b and the second non-variable area 144c that extend from the opposite end portions of the variable area 144a and remain flat. For example, the first non-variable area 144b may be defined as an area between the first out-folding area 145 and the variable area 144a. For example, the second non-variable area 144c may be defined as an area between the second out-folding area 146 and the variable area 144a. The variable area 144a may form a curved surface having a predetermined curvature in a folded state and may form a flat surface in an unfolded state. The first non-variable area 144b and the second non-variable area 144c may remain flat in the folded state and the unfolded state.

In an embodiment, the variable area 144a may be spaced apart from, or brought into contact with, the first rotary plate 261 and the second rotary plate 262 depending on folding and unfolding motions. For example, in an unfolded state, the variable area 144a may be brought into contact with the first rotary plate 261 and the second rotary plate 262 and may be supported by the first rotary plate 261 and the second rotary plate 262 accordingly. For example, in a folding motion, the variable area 144a may deform to be curved while being spaced apart from the first rotary plate 261 and the second rotary plate 262. For example, the variable area 144a may not be attached to the first rotary plate 261 and the second rotary plate 262.

In an embodiment, at least part of the first rotary plate 261 may be attached to the first non-variable area 144b. For example, the first non-variable area 144b may move together with the first rotary plate 261. For example, the display 140 may be configured such that in folding and unfolding motions, the first non-variable area 144b rotates about the third axis of rotation R3 relative to the first area 141 as the third axis of rotation R3 of the first guide member 240 and the first rotary plate 261 is located in the first out-folding area 145. For example, the first non-variable area 144b may form an angle of 180 degrees with the first area 141 in an unfolded state and may form an angle of less than 180 degrees with the first area 141 in a fully folded state.

In an embodiment, at least part of the second rotary plate 262 may be attached to the second non-variable area 144c. For example, the second non-variable area 144c may move together with the second rotary plate 262. For example, the display 140 may be configured such that in folding and unfolding motions, the second non-variable area 144c rotates about the fourth axis of rotation R4 relative to the second area 142 as the fourth axis of rotation R4 of the second guide member 250 and the second rotary plate 262 is located in the second out-folding area 146. For example, the second non-variable area 144c may form an angle of 180 degrees with the second area 142 in an unfolded state and may form an angle of less than 180 degrees with the second area 142 in a fully folded state.

In an embodiment, the first out-folding area 145 may be defined between the first area 141 and the first non-variable area 144b. The first out-folding area 145 may be an area, which is the basis of relative rotation between the first area 141 and the first non-variable area 144b in folding and unfolding motions. For example, in response to rotation between the first area 141 and the first non-variable area 144b, the first out-folding area 145 may form a flat surface, or may form, in at least part thereof, a curved surface having a predetermined curvature. For example, as at least part of the first out-folding area 145 forms a curved surface, the first area 141 and the first non-variable area 144b may form an angle of less than 180 degrees. The length of the first out-folding area 145 may remain substantially the same in folding and unfolding motions.

In an embodiment, the second out-folding area 146 may be defined between the second area 142 and the second non-variable area 144c. The second out-folding area 146 may be an area, which is the basis of relative rotation between the second area 142 and the second non-variable area 144c in folding and unfolding motions. For example, in response to rotation between the second area 142 and the second non-variable area 144c, the second out-folding area 146 may form a flat surface, or may form, in at least part thereof, a curved surface having a predetermined curvature. For example, as at least part of the second out-folding area 146 forms a curved surface, the second area 142 and the second non-variable area 144c may form an angle of less than 180 degrees. The length of the second out-folding area 146 may remain substantially the same in folding and unfolding motions.

Figure 21A:
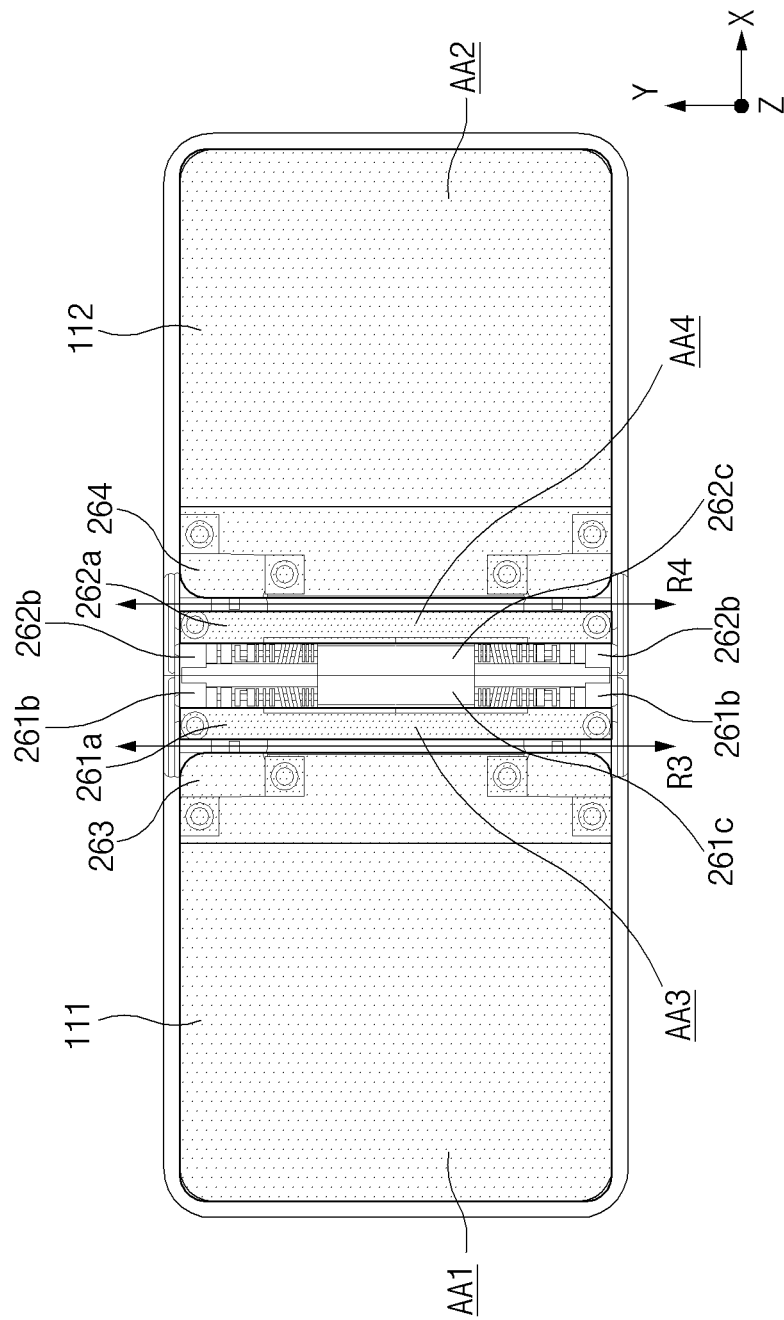
FIG. 21A is a view illustrating adhesive areas and non-adhesive areas of a display of an electronic device according to an embodiment of the disclosure.

FIG. 21A is a view illustrating adhesive areas and non-adhesive areas of a display of an electronic device according to an embodiment of the disclosure.

Figure 21B:
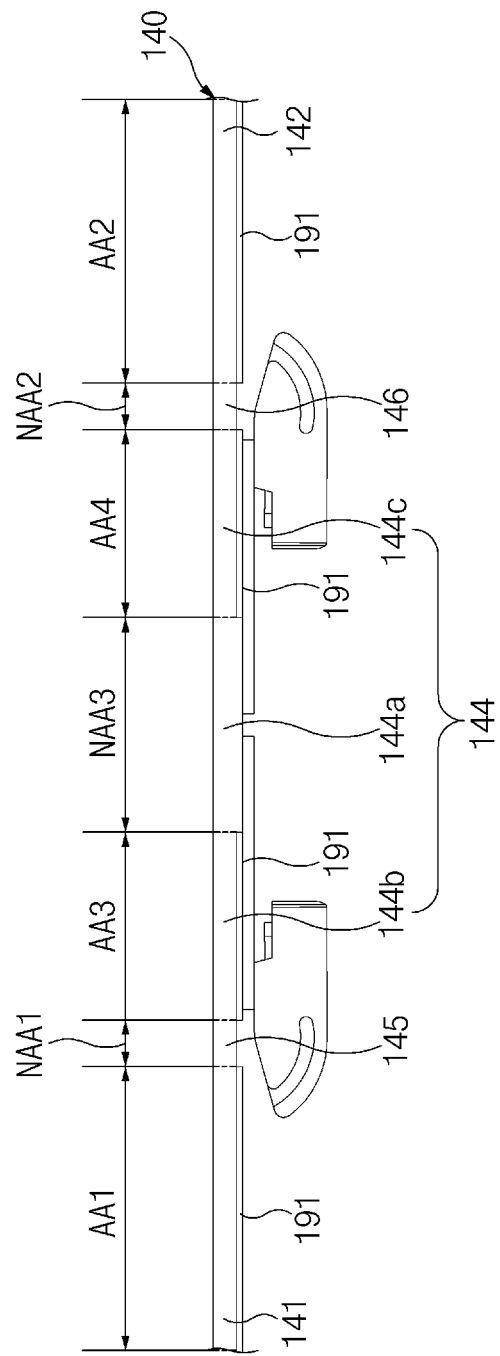
FIG. 21B is a view illustrating adhesive areas and non-adhesive areas of a display of an electronic device according to an embodiment of the disclosure.

FIG. 21B is a view illustrating adhesive areas and non-adhesive areas of a display of an electronic device according to an embodiment of the disclosure.

FIGS. 21A and 21B illustrate an area where the display is attached with other components of the electronic device, and FIG. 21A may be a view in which the display is omitted.

Referring to FIGS. 21A and 21B, the electronic device 100 according to an embodiment may be configured such that at least a partial area of the display 140 is attached to part of the housings 110 and 120 and part of the hinge structure 200. For example, the display 140 may be attached to the housings 110 and 120 and the hinge structure 200 through an adhesive member (e.g., a tape).

In an embodiment, the display 140 may be attached to the first plate 111 of the first housing 110, the second plate 121 of the second housing 120, the first support portion 261a of the first rotary plate 261, the fourth support portion 262a of the second rotary plate 262, the first fixed plate 263, and the second fixed plate 264.

In an embodiment, a plurality of adhesive areas (e.g., shaded portions in FIG. 21A) spaced apart from each other in the direction perpendicular to the axial directions may be defined in the electronic device 100. For example, an adhesive area AA may include a first adhesive area AA1 overlapping the first plate 111 and the first fixed plate 263, a second adhesive area AA2 overlapping the second plate 121 and the second fixed plate 264, a third adhesive area AA3 overlapping the first support portion 261a of the first rotary plate 261, and a fourth adhesive area AA4 overlapping the fourth support portion 262a of the second rotary plate 262. For example, the adhesive area AA may refer to the area where an adhesive member 191 is disposed.

In an embodiment, the display 140 may be attached to the first adhesive area AA1, the second adhesive area AA2, the third adhesive area AA3, and the fourth adhesive area AA4. For example, the first area 141 of the display 140 may be attached to the first adhesive area AA1. For example, the second area 142 of the display 140 may be attached to the second adhesive area AA2. For example, the first non-variable area 144b of the folding area 143 of the display 140 may be attached to the third adhesive area AA3. For example, the second non-variable area 144c of the folding area 143 of the display 140 may be attached to the fourth adhesive area AA4.

In an embodiment, a first non-adhesive area NAA1 may be defined between the first adhesive area AA1 and the third adhesive area AA3. The first non-adhesive area NAA1 may overlap the first out-folding area 145 of the folding area 143 of the display 140. For example, the first out-folding area 145 may remain unattached to the housings 110 and 120 or the hinge structure 200 and may deform to be curved or flat in folding and unfolding motions of the electronic device 100 accordingly (e.g., refer to FIG. 20). For example, the third axis of rotation R3 may overlap the first non-adhesive area NAA1 when the display 140 or the first plate 111 is viewed from above.

In an embodiment, a second non-adhesive area NAA2 may be defined between the second adhesive area AA2 and the fourth adhesive area AA4. The second non-adhesive area NAA2 may overlap the second out-folding area 146 of the folding area 143 of the display 140. For example, the second out-folding area 146 may remain unattached to the housings 110 and 120 or the hinge structure 200 and may deform to be curved or flat in folding and unfolding motions of the electronic device 100 accordingly (e.g., refer to FIG. 20). For example, the fourth axis of rotation R4 may overlap the second non-adhesive area NAA2 when the display 140 or the first plate 121 is viewed from above.

In an embodiment, a third non-adhesive area NAA3 may be defined between the third adhesive area AA3 and the fourth adhesive area AA4. The third non-adhesive area NAA3 may be an area that overlaps the second support portions 261b and the third support portion 261c of the first rotary plate 261 and the fifth support portions 262b and the sixth support portion 262c of the second rotary plate 262. The third non-adhesive area NAA3 may overlap the variable area 144a of the in-folding area 144 in the folding area 143 of the display 140. For example, the variable area 144a of the in-folding area 144 may remain unattached to the hinge structure 200 and may deform to be curved or flat in folding and unfolding motions of the electronic device 100 accordingly (e.g., refer to FIG. 20).

As illustrated in FIGS. 21A and 21B, the adhesive member 191 may be attached to the rear surface of the first area 141, the rear surface of the second area 142, and the rear surface of the non-variable area 144a of the in-folding area 144 of the display 140. The adhesive member 191 may not be disposed on the rear surfaces of the out-folding areas 145 and 146 and the rear surface of the variable area 144a of the in-folding area 144 of the display 140.

According to an embodiment, in folding and unfolding motions, the lengths of the out-folding areas 145 and 146 of the display 140 may remain constant without being changed (e.g., refer to FIG. 20), and thus the non-variable area 144a of the folding area 143 may be attached to the third adhesive area AA3 (e.g., the first support portion 261a of the first rotary plate 261) and the fourth adhesive area AA4 (e.g., the second support portion 261b of the second rotary plate 262) through the adhesive member 191. Accordingly, an area to which the flexible display 140 is attached may increase, and when the electronic device 100 is folded or unfolded, the display 140 may be firmly and stably supported.

Figure 22:
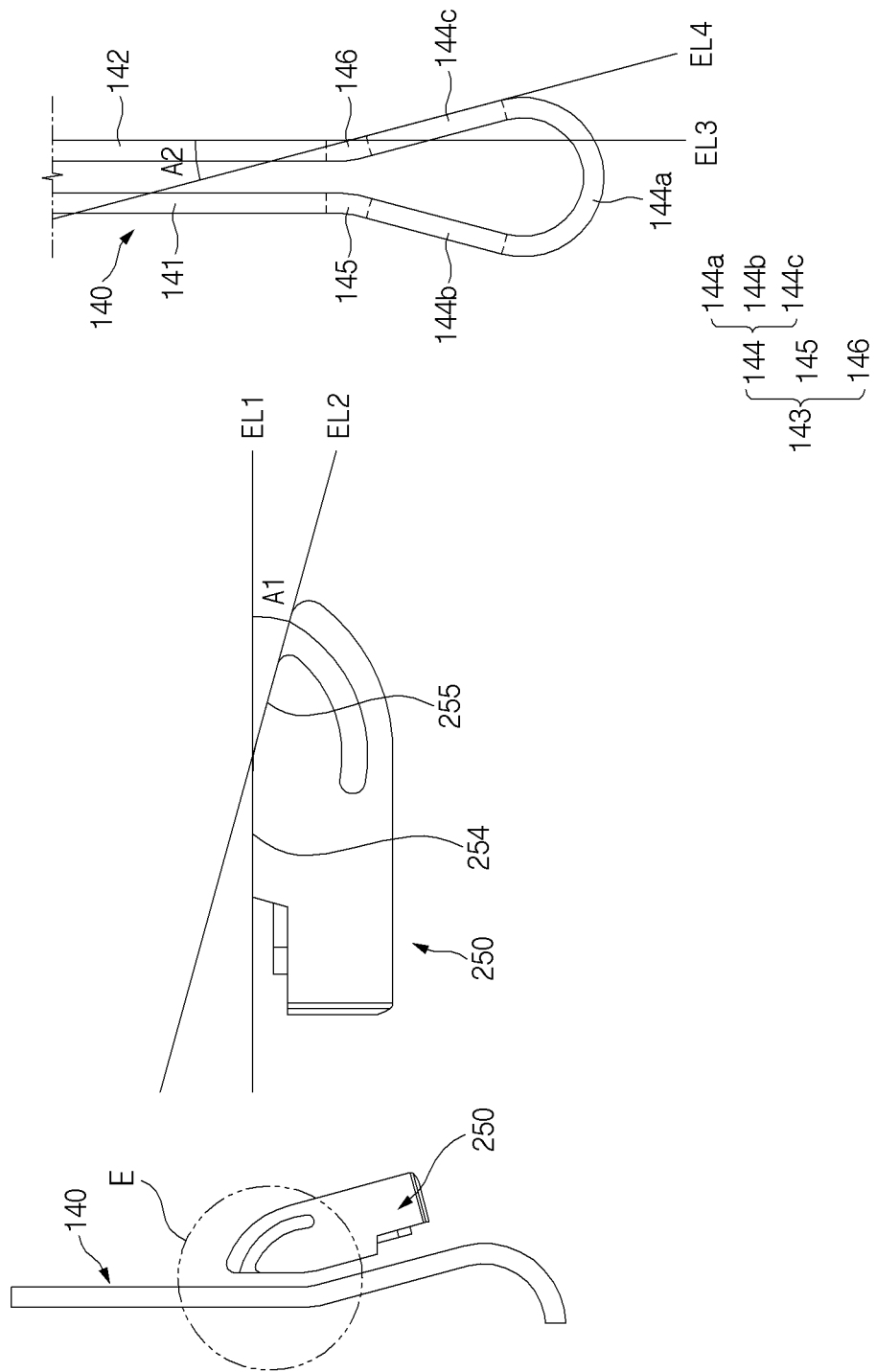
FIG. 22 is a view illustrating a display and a guide member of an electronic device according to an embodiment of the disclosure.

FIG. 22 is a view illustrating a display module and a guide member of an electronic device according to an embodiment of the disclosure.

Referring to FIG. 22, the guide member 250 of the electronic device 100 according to an embodiment may be formed in a shape corresponding to the shape of the display 140 in a fully folded state. For example, one surface of the guide member 250 may be formed to have an angle substantially corresponding to the angle formed by the display 140 such that in the fully folded state, collision and/or interference does not occur between the guide member 250 and the display 140 (e.g., in a portion E of FIG. 22) and the display 140 is stably supported.

The guide member 250 illustrated in FIG. 22 may be referred to as the second guide member 250. However, contents to be described below with reference to FIG. 22 may be identically applied to the first guide member 240.

In an embodiment, the guide member 250 may include the seating surface 254 on which the rotary plate (e.g., the rotary plate 261 or 262 of FIGS. 16A and 16B) is seated and the inclined surface 255 obliquely extending from the seating surface 254 at a specified angle. For example, a first virtual extension line EL1 extending from the seating surface 254 and a second virtual extension line EL2 extending from the inclined surface 255 may be defined to describe the angle between the inclined surface 255 and the seating surface 254. For example, the first virtual extension line EL1 and the second virtual extension line EL2 may form a first included angle A1 that is an acute angle.

In an embodiment, in the fully folded state, the second area 142 of the display 140 may form a predetermined angle with the second non-variable area 144c of the folding area 143. For example, a third virtual extension line EL3 extending from the second area 142 and a fourth virtual extension line EL4 extending from the second variable area 144a may be defined to describe the angle formed by the second area 142 and the second non-variable area 144c in the fully folded state. For example, the third virtual extension line EL3 and the fourth virtual extension line EL4 may form a second included angle A2 that is an acute angle. For example, the angle formed by the first area 141 and the first non-variable area 144b may be equal to the second included angle A2. For example, the first included angle A1 and the second included angle A2 may range from about 10 degrees to about 20 degrees and may preferably be about 15 degrees. However, the first included angle A1 and the second included angle A2 are not limited to the aforementioned range.

In various embodiments, the first included angle A1 and the second included angle A2 may be substantially the same as each other. For example, as illustrated in FIGS. 21A and 21B, in the fully folded state, the seating surface 254 of the second guide member 250 may be parallel to the second non-variable area 144c, and the inclined surface 255 of the second guide member 250 may be parallel to the second area 142.

In another embodiment, the first included angle A1 may be different from the second included angle A2. For example, the first included angle A1 may be formed to be larger than the second included angle A2. For example, the distance between the second area 142 and the inclined surface 255 may increase in the z-axis direction. Accordingly, in the fully folded state, the inclined surface 255 of the second guide member 250 may be prevented from colliding with the second area 142 of the display 140.

Figure 23:
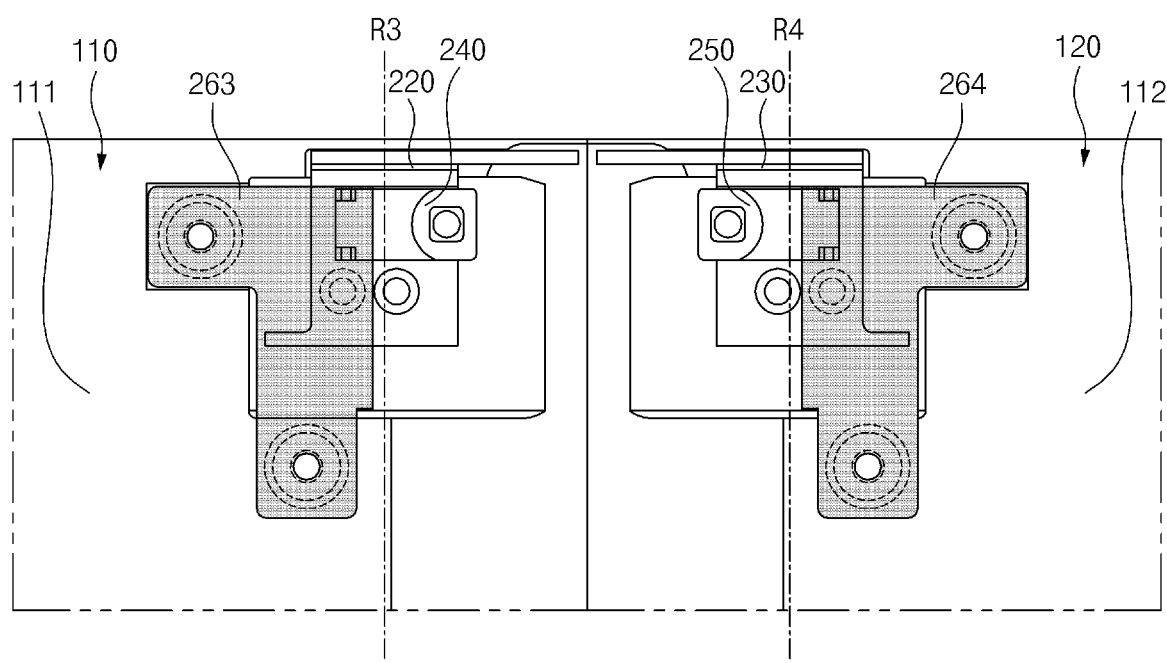
FIG. 23 is a view illustrating fixed plates of a hinge structure according to an embodiment of the disclosure.

FIG. 23 is a view illustrating the fixed plates of the hinge structure according to an embodiment of the disclosure.

Referring to FIG. 23, the hinge structure 200 according to an embodiment may include the first rotary member 220, the second rotary member 230, the first guide member 240, the second guide member 250, the first fixed plate 263, and the second fixed plate 264.

In an embodiment, the first fixed plate 263 may be fixedly disposed on the first plate 111 of the first housing 110. For example, the first fixed plate 263 may be fixed to a partial area of the first plate 111 through screw coupling. In an embodiment, the first fixed plate 263, together with the first plate 111, may support at least a partial area of the display (e.g., the display 140 of FIG. 1).

In an embodiment, the first fixed plate 263 may support the rear surface of the display 140 to prevent the display 140 from being sunk or recessed toward the first rotary member 220 and the first guide member 240. For example, the first fixed plate 263 may be coupled to the first plate 111 so as to overlap at least part of the first rotary member 220 and at least part of the first guide member 240.

According to the illustrated embodiment, the first fixed plate 263 may overlap at least part of the first rotary member 220 and at least part of the first guide member 240 when the first plate 111 is viewed from above. For example, the first fixed plate 263 may overlap the portions where the first guide protrusions 224 are coupled to the first guide grooves (not illustrated) and may thus prevent the first guide member 240 from colliding and interfering with the display 140 when rotating about the third axis of rotation R3.

FIG. 23 may be a view in which the display 140 is omitted. However, in the case where the display 140 is disposed on the first plate 111, the first fixed plate 263 may be disposed between at least part of the first guide member 240 and a partial area of the display 140 when the electronic device 100 is viewed in the axial directions.

In an embodiment, the second fixed plate 264 may be fixedly disposed on the second plate 121 of the second housing 120. For example, the second fixed plate 264 may be fixed to a partial area of the second plate 121 through screw coupling. In an embodiment, the second fixed plate 264, together with the second plate 121, may support at least a partial area of the display (e.g., the display 140 of FIG. 1).

In an embodiment, the second fixed plate 264 may support the rear surface of the display 140 to prevent the display 140 from being sunk or recessed toward the second rotary member 230 and the second guide member 250. For example, the second fixed plate 264 may be coupled to the second plate 121 so as to overlap at least part of the second rotary member 230 and at least part of the second guide member 250.

According to the illustrated embodiment, the second fixed plate 264 may overlap at least part of the second rotary member 230 and at least part of the second guide member 250 when the second plate 121 is viewed from above. For example, the second fixed plate 264 may overlap the portions where the second guide protrusions 234 are coupled to the second guide grooves (not illustrated) and may thus prevent the second guide member 250 from colliding and interfering with the display 140 when rotating about the fourth axis of rotation R4.

FIG. 23 may be a view in which the display 140 is omitted. However, in the case where the display 140 is disposed on the second plate 121, the second fixed plate 264 may be disposed between at least part of the second guide member 250 and a partial area of the display 140 when the electronic device 100 is viewed in the axial directions.

Figure 24A:
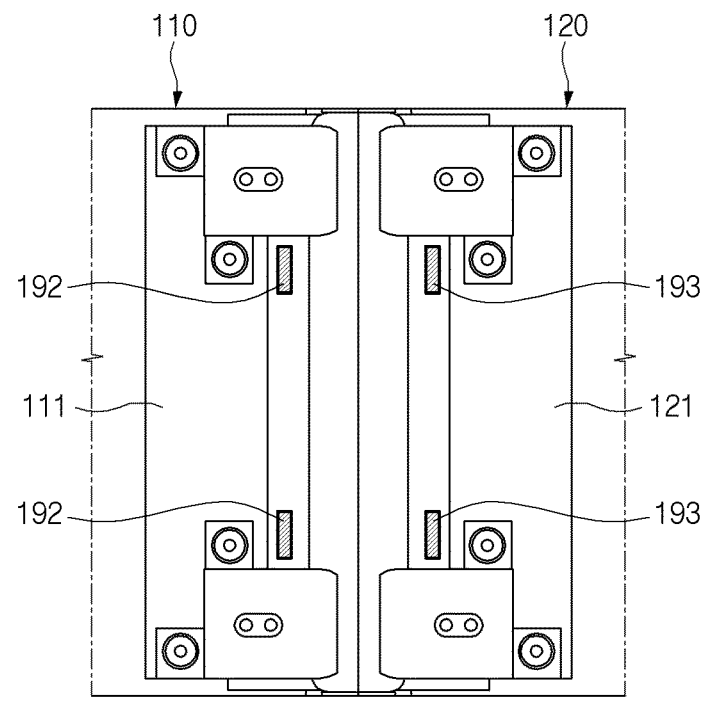
FIG. 24A is a view illustrating magnets of an electronic device and a motion of rotary plates using magnets according to an embodiment of the disclosure.

FIG. 24A is a view illustrating magnets of an electronic device and a motion of the rotary plates using the magnets according to an embodiment of the disclosure.

Figure 24B:
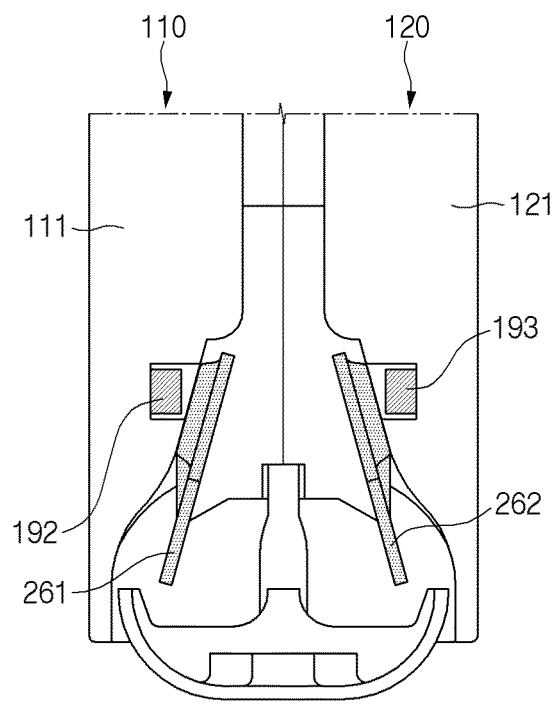
FIG. 24B is a view illustrating magnets of an electronic device and a motion of rotary plates using the magnets according to an embodiment of the disclosure.

FIG. 24B is a view illustrating magnets of an electronic device and a motion of rotary plates using the magnets according to an embodiment of the disclosure.

Referring to FIGS. 24A and 24B, the electronic device 100 according to an embodiment may include the first housing 110, the second housing 120, and magnets 192 and 193 disposed on the first housing 110 and the second housing 120, respectively.

In an embodiment, the magnets 192 and 193 may include the first magnet 192 disposed on the first housing 110 and the second magnet 193 disposed on the second housing 120. For example, the first magnet 192 may be disposed on the first plate 111 of the first housing 110. For example, the second magnet 193 may be disposed on the second plate 121 of the second housing 120.

In an embodiment, the magnets 192 and 193 may provide magnetic forces for a rotary motion of the rotary plates 261 and 262. For example, the rotary plates 261 and 262 may contain a magnetic material such that the magnetic forces of the magnets 192 and 193 act. For example, attractive forces may act between the magnets 192 and 193 and the rotary plates 261 and 262. For example, the rotary plates 261 and 262 may at least partially contain a metallic material. In various embodiments, the entire rotary plates 261 and 262 may be formed of a metallic material, or only portions of the rotary plates 261 and 262 adjacent to the magnets 192 and 193 may be formed of a metallic material.

In an embodiment, when the electronic device 100 is folded, the rotary plate 261 or 262 may be attracted in one direction by the magnet 192 or 193 to perform a rotary motion. As described above, the rotary plates 261 and 262 may be rotated by the repulsive force of the display (e.g., the repulsive force RF of the display 140 of FIG. 7) generated in a folding motion. According to an embodiment, when the repulsive force RF of the display 140 is relatively weak, the rotary plates 261 and 262 may be rotated by the attractive forces provided by the magnets 192 and 193.

In an embodiment, the magnetic force generated by the first magnet 192 may act on the first rotary plate 261. For example, in a folding motion of the electronic device 100, an attractive force may act between the first rotary plate 261 and the first magnet 192. The attractive force, together with the repulsive force RF of the display 140, may act on part of the first rotary plate 261 to rotate the first rotary plate 261.

In an embodiment, the magnetic force generated by the second magnet 193 may act on the second rotary plate 262. For example, in a folding motion of the electronic device 100, an attractive force may act between the second rotary plate 262 and the second magnet 193. The attractive force, together with the repulsive force RF of the display 140, may act on part of the second rotary plate 262 to rotate the second rotary plate 262.

FIG. 24A may be a view in which the rotary plates 261 and 262 are omitted. However, in the case where the rotary plates 261 and 262 are disposed in the housings 110 and 120, the magnets 192 and 193 may be disposed in positions overlapping the rotary plates 261 and 262. For example, in the case where the first rotary plate 261 is disposed on the first plate 111 in FIG. 24A, the first magnet 192 may overlap the first rotary plate 261 when the first plate 111 is viewed from above. For example, in the case where the second rotary plate 262 is disposed on the second plate 121 in FIG. 24A, the second magnet 193 may overlap the second rotary plate 262 when the second plate 121 is viewed from above.

FIG. 25 is a view illustrating reinforcing plates of an electronic device according to an embodiment of the disclosure.

Figure 26A:
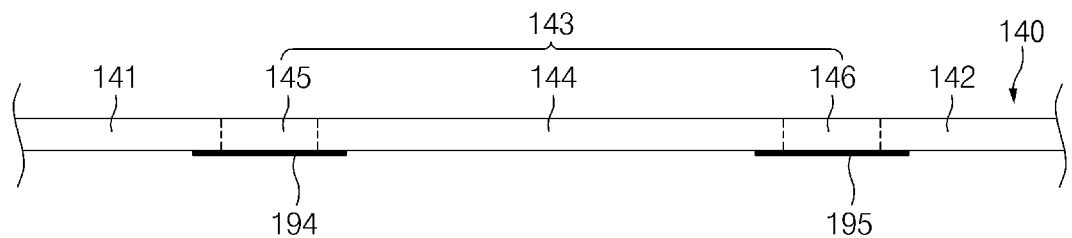
FIG. 26A is a view illustrating a display and reinforcing plates of an electronic device according to an embodiment of the disclosure.

FIG. 26A is a view illustrating a display and reinforcing plates of an electronic device according to an embodiment of the disclosure.

Figure 26B:
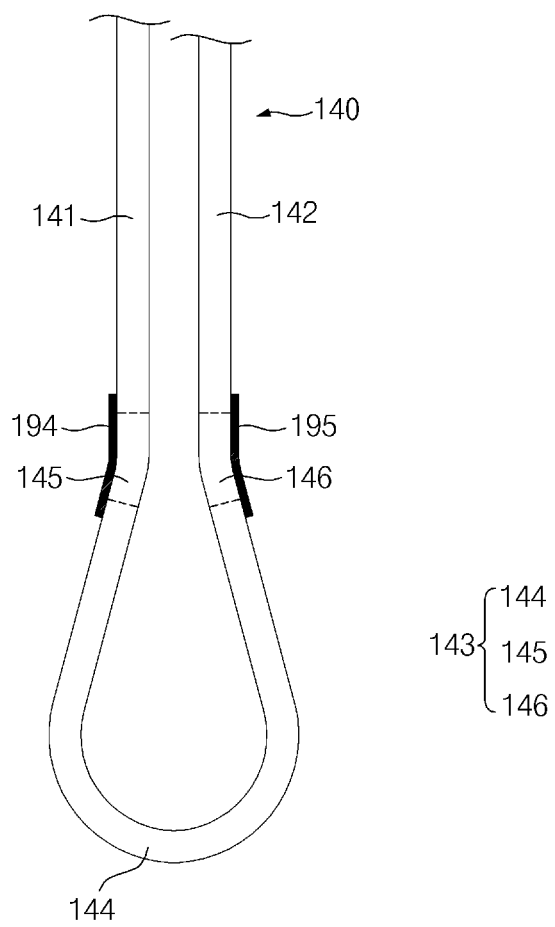
FIG. 26B is a view illustrating a display and reinforcing plates of an electronic device according to an embodiment of the disclosure.

FIG. 26B is a view illustrating a display and reinforcing plates of an electronic device according to an embodiment of the disclosure.

Referring to FIGS. 25, 26A, and 26B, the electronic device 100 according to an embodiment may include the reinforcing plates 194 and 195 supporting the rear surfaces of at least partial areas of the display 140. For example, the reinforcing plates 194 and 195 may include the first reinforcing plate 194 disposed in the first housing 110 and the second reinforcing plate 195 disposed in the second housing 120.

In an embodiment, the first reinforcing plate 194 may be disposed on a partial area of the first plate 111. The first reinforcing plate 194 may extend in the axial directions. In an embodiment, the first reinforcing plate 194 may be disposed between the first fixed plate 263 and the first rotary plate 261. For example, the first reinforcing plate 194 may be configured to support the display 140 together with the first fixed plate 263, the first rotary plate 261, and the first plate 111.

In an embodiment, the first reinforcing plate 194 may include a specified pattern (e.g., a lattice pattern or a slit pattern) such that at least part thereof is able to be bent together with the display 140. In various embodiments, the first reinforcing plate 194 may be formed of a material (e.g., a polymer, rubber, or leather) that can be bent.

In an embodiment, the second reinforcing plate 195 may be disposed on a partial area of the second plate 121. The second reinforcing plate 195 may extend in the axial directions. In an embodiment, the second reinforcing plate 195 may be disposed between the second fixed plate 264 and the second rotary plate 262. For example, the second reinforcing plate 195 may be configured to support the display 140 together with the second fixed plate 264, the second rotary plate 262, and the second plate 121.

In an embodiment, the second reinforcing plate 195 may include a specified pattern (e.g., a lattice pattern or a slit pattern) such that at least part thereof is able to be bent together with the display 140. In various embodiments, the second reinforcing plate 195 may be formed of a material (e.g., a polymer, rubber, or leather) that can be bent.

In an embodiment, the first reinforcing plate 194 and the second reinforcing plate 195 may have, in at least a partial area thereof, a plurality of openings 197 so as to include a lattice pattern and/or a slit pattern. The reinforcing plates 194 and 195 including the lattice pattern and/or the slit pattern may be bent or unbent together with the display 140. For example, the plurality of openings 197 may extend in the axial directions. The plurality of openings 197 may be spaced apart from each other in the direction perpendicular to the axial directions. Referring to FIG. 25, the plurality of openings 197 may be discontinuously formed in the axial directions. In various embodiments, the plurality of openings 197 may be continuously formed in the axial directions.

Referring to FIGS. 26A and 26B, the reinforcing plates 194 and 195 may be attached to the rear surfaces of partial areas of the display 140. For example, so as to be bent or unbent together with the out-folding areas 145 and 146 of the display 140, the reinforcing plates 194 and 195 may be attached to sections of the rear surface of the display 140 that include the out-folding areas 145 and 146.

In an embodiment, the first reinforcing plate 194 may overlap the first out-folding area 145 of the display 140. For example, when the rear surface of the display 140 is viewed, the entire first out-folding area 145 may overlap the first reinforcing plate 194. In an embodiment, the first reinforcing plate 194 may extend from part of the first area 141 to part of the in-folding area 144 through the first out-folding area 145. For example, when the cross-section of the display 140 is viewed, the length of the first reinforcing plate 194 may be greater than the length of the first out-folding area 145.

The position and/or length of the first reinforcing plate 194 is not limited to the illustrated embodiment. In another embodiment, the first reinforcing plate 194 may be located on only the rear surface of the first out-folding area 145. In the other embodiment, when the cross-section of the display 140 is viewed, the length of the first reinforcing plate 194 may be substantially the same as the length of the first out-folding area 145.

In an embodiment, the second reinforcing plate 195 may overlap the second out-folding area 146 of the display 140. For example, when the rear surface of the display 140 is viewed, the entire second out-folding area 146 may overlap the second reinforcing plate 195. In an embodiment, the second reinforcing plate 195 may extend from part of the second area 142 to part of the in-folding area 144 through the second out-folding area 146. For example, when the cross-section of the display 140 is viewed, the length of the second reinforcing plate 195 may be greater than the length of the second out-folding area 146.

The position and/or length of the second reinforcing plate 195 is not limited to the illustrated embodiment. In another embodiment, the second reinforcing plate 195 may be located on only the rear surface of the second out-folding area 146. In the other embodiment, when the cross-section of the display 140 is viewed, the length of the second reinforcing plate 195 may be substantially the same as the length of the second out-folding area 146.

In various embodiments, the areas where the first reinforcing plate 194 and the second reinforcing plate 195 are disposed may substantially correspond to non-adhesive areas where the display 140 is not attached with other components of the electronic device 100. Referring to FIGS. 21A, 21B, and 25 together, the first reinforcing plate 194 may be disposed on the first non-adhesive area (e.g., the first non-adhesive area NAA1 of FIGS. 21A and 21B), and the second reinforcing plate 195 may be disposed on the second non-adhesive area (e.g., the second non-adhesive area NAA2 of FIGS. 21A and 21B).

An electronic device 100 according to an embodiment may include a housing including a first housing 110 and a second housing 120, a display 140 that extends from the first housing 110 to the second housing 120, and a hinge structure 200 that rotatably connects the first housing 110 and the second housing 120. The hinge structure 200 may include a fixed member 210, a first rotary member 220 coupled to the fixed member 210 so as to be rotatable about a first axis of rotation R1 and connected with the first housing 110, the first axis of rotation R1 extending parallel to an axial direction, a second rotary member 230 coupled to the fixed member 210 so as to be rotatable about a second axis of rotation R2 parallel to the axial direction and connected with the second housing 120, a first guide member 240 coupled to the first rotary member 220 so as to be rotatable about a third axis of rotation R3 parallel to the first axis of rotation R1, a second guide member 250 coupled to the second rotary member 230 so as to be rotatable about a fourth axis of rotation R4 parallel to the second axis of rotation R2, a first rotary plate 261 that is at least partially coupled to the first guide member 240 to rotate about the third axis of rotation R3 together with the first guide member 240 and that supports a partial area of the display 140, and a second rotary plate 262 that is at least partially coupled to the second guide member 250 to rotate about the fourth axis of rotation R4 together with the second guide member 250 and that supports another partial area of the display 140. The hinge structure 200 may be configured such that when the first housing 110 and/or the second housing 120 is folded or unfolded, the first rotary member 220 may rotate about the first axis of rotation R1 in a first rotational direction, the first guide member 240 and the first rotary plate 261 may rotate about the third axis of rotation R3 in the first rotational direction, the second rotary member 230 may rotate about the second axis of rotation R2 in a second rotational direction opposite to the first rotational direction, and the second guide member 250 and the second rotary plate 262 may rotate about the fourth axis of rotation R4 in the second rotational direction.

In various embodiments, the hinge structure 200 may be configured such that the third axis of rotation R3 and the fourth axis of rotation R4 are located between opposite surfaces 140a and 140b of the display 140 in a thickness direction.

In various embodiments, the first guide member 240 may include a first guide groove 241 having an arc shape, the first rotary member 220 may include a first guide protrusion 224 accommodated in the first guide groove 241, and the third axis of rotation R3 may be defined as a virtual axis extending parallel to the axial direction from the center of the arc of the first guide groove 241. The second guide member 250 may include a second guide groove 251 having an arc shape, the second rotary member 230 may include a second guide protrusion 234 accommodated in the second guide groove 251, and the fourth axis of rotation R4 may be defined as a virtual axis extending parallel to the axial direction from the center of the arc of the second guide groove 251.

In various embodiments, the first rotary member 220 may include a first opening area 223 in which the first guide member 240 is disposed, and the first guide protrusion 234 may protrude from a sidewall of the first opening area 223 in the axial direction. The second rotary member 230 may include a second opening area 233 in which the second guide member 250 is disposed, and the second guide protrusion 234 may protrude from a sidewall 2331 or 2332 of the second opening area 233 in the axial direction. The sidewalls of the first opening area 223 and the second opening area 233 may be substantially perpendicular to the axial direction.

In various embodiments, the first guide member 240 may include a side surface 242 that faces the sidewall of the first opening area 223, and the first guide groove 241 may be formed on at least part of the side surface 242 of the first guide member 240. The second guide member 250 may include a side surface 252 or 253 that faces the sidewall 2331 or 2332 of the second opening area 233, and the second guide groove 251 may be formed on at least part of the side surface 252 or 253 of the second guide member 250.

In various embodiments, the hinge structure 200 may further include a first connecting shaft 211 that rotatably connects the first rotary member 220 to the fixed member 210 and forms the first axis of rotation R1 and a second connecting shaft 212 that rotatably connects the second rotary member 230 to the fixed member 210 and forms the second axis of rotation R2. The first rotary member 220 may be rotatable about the first connecting shaft 211 relative to the fixed member 210, and the second rotary member 230 may be rotatable about the second connecting shaft 212 relative to the fixed member 210.

In various embodiments, the first rotary member 220 may include a first base portion 222 coupled to the first housing 110 and a first extension 221 that extends from the first base portion 222 toward the fixed member 210, and the first extension 221 may be rotatably coupled to the fixed member 210 through the first connecting shaft 211. The second rotary member 230 may include a second base portion 232 coupled to the second housing 120 and a second extension 231 that extends from the second base portion 232 toward the fixed member 210, and the second extension 231 may be rotatably coupled to the fixed member 210 through the second connecting shaft 212.

In various embodiments, the fixed member 210 may include a first coupling portion 213 to which the first rotary member 220 and the second rotary member 230 are coupled. The first coupling portion 213 may have a first through-hole 216 formed therein in which the first connecting shaft 211 is accommodated and a second through-hole 217 formed therein in which the second connecting shaft 212 is accommodated. The first through-hole 216 and the second through-hole 217 may penetrate partial areas of the first coupling portion 213 in the axial direction.

In various embodiments, the first rotary member 220 may include a third through-hole 226 that is formed in the first extension 221 and in which the first connecting shaft 211 is accommodated, and the third through-hole 226 may be aligned with the first through-hole 216 in the axial direction. The second rotary member 230 may include a fourth through-hole 236 that is formed in the second extension 231 and in which the second connecting shaft 212 is accommodated, and the fourth through-hole 236 may be aligned with the second through-hole 217 in the axial direction.

In various embodiments, when viewed in the axial direction, the first coupling portion 213 of the fixed member 210 may overlap at least part of the first extension 221 and at least part of the second extension 231.

In various embodiments, the electronic device 100 may include a fully folded state in which a first edge P1 of the first housing 110 and a second edge P2 of the second housing 120 parallel to the axial direction among edges of the housing make contact with each other, an unfolded state in which a third edge P3 of the first housing 110 and a fourth edge P4 of the second housing 120 perpendicular to the axial direction among the edges of the housing form substantially the same straight line, and an intermediate state defined as a state between the unfolded state and the fully folded state. The display 140 may be configured such that at least part thereof is curved when the electronic device is changed from the unfolded state to the fully folded state. The first rotary plate 261 and the second rotary plate 262 may rotate about the third axis of rotation R3 and the fourth axis of rotation R4, respectively, by a repulsive force RF generated as the at least part of the display is curved.

In various embodiments, the display 140 may include a first area 141 at least partially disposed in the first housing 110 and formed to be flat, a second area 142 at least partially disposed in the second housing 120 and formed to be flat, and a folding area 143 located between the first area 141 and the second area 142. The folding area 143 may form a flat surface together with the first area 141 and the second area 142 in the unfolded state and may at least partially form a curved surface in the fully folded state or the intermediate state. Each of the first rotary plate 261 and the second rotary plate 262 may support at least part of the folding area 143 of the display 140.

In various embodiments, each of the third axis of rotation R3 and the fourth axis of rotation R4 may pass through at least part of the folding area 143 in a direction parallel to the axial direction.

In various embodiments, the folding area 143 may include an in-folding area 144, a first out-folding area 145 located between the first area 141 and the in-folding area 144, and a second out-folding area 146 located between the second area 142 and the in-folding area 144. In the fully folded state, part of the in-folding area 144 may be formed to be a curved surface whose center of curvature coincides with a first folding axis F1, part of the first out-folding area 145 may be formed to be a curved surface whose center of curvature coincides with a second folding axis F2, part of the second out-folding area 146 may be formed to be a curved surface whose center of curvature coincides with a third folding axis F3, the first folding axis F1 may be located in a direction that a first surface 140a of the display 140 faces, based on the display 140, and the second folding axis F2 and the third folding axis F3 may be located in a direction that a second surface 140b of the display 140 opposite to the first surface 140a faces, based on the display 140.

In various embodiments, the first surface 140a of the display 140 may be defined as a surface that forms at least part of a front surface of the electronic device 100 in the unfolded state, and the second surface 140b of the display 140 may be defined as a surface that faces the first housing 110, the second housing 120, or the hinge structure 200.

In various embodiments, when viewed in the axial direction, the third axis of rotation R3 may overlap the first out-folding area 145, and the fourth axis of rotation R4 may overlap the second out-folding area 146.

In various embodiments, the first rotary plate 261 may include a first support portion 261a that extends in the axial direction, and a second support portion 261b and a third support portion 261c that extend from the first support portion 261a in a direction perpendicular to the axial direction, and a partial area of the display 140 may be attached to the first support portion 261a. The second support portion 261b and the third support portion 261c may be brought into contact with, or spaced apart from, the display 140 as the first rotary plate 261 rotates. The second rotary plate 262 may include a fourth support portion 262a that extends in the axial direction, and a fifth support portion 262b and a sixth support portion 262c that extend from the fourth support portion 262a in a direction perpendicular to the axial direction, and a partial area of the display 140 may be attached to the fourth support portion 262a. The fifth support portion 262b and the sixth support portion 262c may be brought into contact with, or spaced apart from, the display 140 as the second rotary plate 262 rotates.

In various embodiments, the first housing 110 may include a first plate 111 on which at least part of the display 140 is disposed, and the second housing 120 may include a second plate 121 on which at least part of the display 140 is disposed. The electronic device 100 may include a plurality of adhesive areas to which the display 140 is attached, and the plurality of adhesive areas may be spaced apart from each other in a direction perpendicular to the axial direction. When the display is viewed from above, the plurality of adhesive areas may include a first adhesive area AA1 that overlaps the first plate 111, a second adhesive area AA2 that overlaps the second plate 121, a third adhesive area AA3 that overlaps the first support portion 261a of the first rotary plate 261, and a fourth adhesive area AA4 that overlaps the fourth support portion 262a of the second rotary plate 262.

In various embodiments, the electronic device 100 may further include a first non-adhesive area NAA1 defined between the first adhesive area AA1 and the third adhesive area AA3 and a second non-adhesive area NAA2 defined between the second adhesive area AA2 and the fourth adhesive area AA4. When the display 140 is viewed from above, the third axis of rotation R3 may overlap the first non-adhesive area NAA1, and the fourth axis of rotation R4 may overlap the second non-adhesive area NAA2.

An electronic device 100 according to an embodiment may include a housing including a first housing 110 and a second housing 120, a display 140 that extends from the first housing 110 to the second housing 120, and a hinge structure 200 that rotatably connects the first housing 110 and the second housing 120. The hinge structure 200 may include a fixed member 210, a first rotary member 220 that is coupled to the fixed member 210 so as to be rotatable about a first axis of rotation R1 parallel to an axial direction and connected with the first housing 110 and that includes a first guide protrusion 224, a second rotary member 230 that is coupled to the fixed member 210 so as to be rotatable about a second axis of rotation R2 parallel to the axial direction and connected with the second housing 120 and that includes a second guide protrusion 234, a first arm shaft 265 rotatably coupled to the fixed member 210 and parallel to the axial direction, a second arm shaft 166 rotatably coupled to the fixed member 210 and parallel to the axial direction, a first arm 270 that is coupled to the first arm shaft 265 and that rotates together with the first arm shaft 265, the first arm 270 including a first cam 273 that surrounds the first arm shaft 265, a second arm 280 that is coupled to the second arm shaft 266 and that rotates together with the second arm shaft 266, the second arm 280 including a second cam 283 that surrounds the second arm shaft 266, a cam member 292 coupled to the first arm shaft 265 and the second arm shaft 266 and linearly movable in the axial direction, the cam member 292 including a third cam 2921 engaged with the first cam 273 and a fourth cam 2992 engaged with the second cam 283, a first elastic member 293a that is coupled to the first arm shaft 265 and that provides an elastic force to the cam member 292 in the axial direction, a second elastic member 293b that is coupled to the second arm shaft 266 and that provides an elastic force to the cam member 292 in the axial direction, a first guide member 240 that is coupled to the first rotary member 220 so as to be rotatable about a third axis of rotation R3 parallel to the first axis of rotation R1 and that includes a first guide groove 241 having an arc shape in which the first guide protrusion 224 is accommodated, the third axis of rotation R3 being defined as the center of the arc of the first guide groove 241, a second guide member 250 that is coupled to the second rotary member 230 so as to be rotatable about a fourth axis of rotation R4 parallel to the second axis of rotation R2 and that includes a second guide groove 251 having an arc shape in which the second guide protrusion 234 is accommodated, the fourth axis of rotation R4 being defined as the center of the arc of the second guide groove 251, a first rotary plate 261 that is coupled to the first guide member 240 to rotate together with the first guide member 240 and that supports a partial area of the display 140, and a second rotary plate 262 that is coupled to the second guide member 250 to rotate together with the second guide member 250 and that supports another partial area of the display 140. The first guide member 240 and the second guide member 250 may rotate relative to the first rotary member 220 and the second rotary member 230 as the first rotary member 220 and the second rotary member 230 rotate. When viewed in the axial direction, each of the third axis of rotation R3 and the fourth axis of rotation R4 may overlap at least a partial area of the display 140.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 340) including one or more instructions that are stored in a storage medium (e.g., internal memory 336 or external memory 338) that is readable by a machine (e.g., the electronic device 301). For example, a processor (e.g., the processor 320) of the machine (e.g., the electronic device 301) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing comprising a first housing and a second housing;
   a display configured to extend from the first housing to the second housing; and
   a hinge structure configured to rotatably connect the first housing and the second housing,
   wherein the hinge structure comprises:
      a fixed member,
      a first rotary member coupled to the fixed member so as to be rotatable about a first axis of rotation and connected with the first housing, the first axis of rotation being configured to extend parallel to an axial direction,
      a second rotary member coupled to the fixed member so as to be rotatable about a second axis of rotation parallel to the axial direction and connected with the second housing,
      a first guide member coupled to the first rotary member so as to be rotatable about a third axis of rotation parallel to the first axis of rotation,
      a second guide member coupled to the second rotary member so as to be rotatable about a fourth axis of rotation parallel to the second axis of rotation,
      a first rotary plate at least partially coupled to the first guide member to rotate about the third axis of rotation together with the first guide member and configured to support a partial area of the display, and
      a second rotary plate at least partially coupled to the second guide member to rotate about the fourth axis of rotation together with the second guide member and configured to support another partial area of the display,
   wherein the hinge structure is configured such that when the first housing or the second housing is folded or unfolded,
   wherein the first rotary member rotates about the first axis of rotation in a first rotational direction,
   wherein the first guide member and the first rotary plate rotate about the third axis of rotation in the first rotational direction,
   wherein the second rotary member rotates about the second axis of rotation in a second rotational direction opposite to the first rotational direction, and
   wherein the second guide member and the second rotary plate rotate about the fourth axis of rotation in the second rotational direction.

2. The electronic device of claim 1, wherein the hinge structure is configured such that the third axis of rotation and the fourth axis of rotation are located between opposite surfaces of the display in a thickness direction.

3. The electronic device of claim 1,
   wherein the first guide member comprises a first guide groove having an arc shape,
   wherein the first rotary member comprises a first guide protrusion accommodated in the first guide groove,
   wherein the third axis of rotation is defined as a virtual axis configured to extend parallel to the axial direction from a center of the arc of the first guide groove,
   wherein the second guide member comprises a second guide groove having an arc shape,
   wherein the second rotary member comprises a second guide protrusion accommodated in the second guide groove, and
   wherein the fourth axis of rotation is defined as a virtual axis configured to extend parallel to the axial direction from a center of the arc of the second guide groove.

4. The electronic device of claim 3,
   wherein the first rotary member comprises a first opening area in which the first guide member is disposed, and the first guide protrusion protrudes from a sidewall of the first opening area in the axial direction,
   wherein the second rotary member comprises a second opening area in which the second guide member is disposed, and the second guide protrusion protrudes from a sidewall of the second opening area in the axial direction, and
   wherein the sidewalls of the first opening area and the second opening area are substantially perpendicular to the axial direction.

5. The electronic device of claim 4,
   wherein the first guide member comprises a side surface configured to face the sidewall of the first opening area, and the first guide groove is formed on at least part of the side surface of the first guide member, and wherein the second guide member comprises a side surface configured to face the sidewall of the second opening area, and the second guide groove is formed on at least part of the side surface of the second guide member.

6. The electronic device of claim 1, wherein the hinge structure further comprises:
- a first connecting shaft configured to rotatably connect the first rotary member to the fixed member and to form the first axis of rotation, and
- a second connecting shaft configured to rotatably connect the second rotary member to the fixed member and to form the second axis of rotation, wherein the first rotary member is rotatable about the first connecting shaft relative to the fixed member, and wherein the second rotary member is rotatable about the second connecting shaft relative to the fixed member.

7. The electronic device of claim 6, wherein the first rotary member comprises a first base portion coupled to the first housing and a first extension configured to extend from the first base portion toward the fixed member, wherein the first extension is rotatably coupled to the fixed member through the first connecting shaft, wherein the second rotary member comprises a second base portion coupled to the second housing and a second extension configured to extend from the second base portion toward the fixed member, and wherein the second extension is rotatably coupled to the fixed member through the second connecting shaft.

8. The electronic device of claim 7, wherein the fixed member comprises a first coupling portion to which the first rotary member and the second rotary member are coupled, wherein the first coupling portion has a first through-hole formed therein in which the first connecting shaft is accommodated and a second through-hole formed therein in which the second connecting shaft is accommodated, and wherein the first through-hole and the second through-hole penetrate partial areas of the first coupling portion in the axial direction.

9. The electronic device of claim 8, wherein the first rotary member comprises a third through-hole that is formed in the first extension and in which the first connecting shaft is accommodated, wherein the third through-hole is aligned with the first through-hole in the axial direction, wherein the second rotary member comprises a fourth through-hole that is formed in the second extension and in which the second connecting shaft is accommodated, and wherein the fourth through-hole is aligned with the second through-hole in the axial direction.

10. The electronic device of claim 8, wherein when viewed in the axial direction, the first coupling portion of the fixed member overlaps at least part of the first extension and at least part of the second extension.

11. The electronic device of claim 1, wherein the electronic device comprises:
- a fully folded state in which a first edge of the first housing and a second edge of the second housing parallel to the axial direction among edges of the housing make contact with each other,
- an unfolded state in which a third edge of the first housing and a fourth edge of the second housing perpendicular to the axial direction among the edges of the housing form substantially a same straight line, and
- an intermediate state defined as a state between the unfolded state and the fully folded state, wherein the display is configured such that at least part thereof is curved when the electronic device is changed from the unfolded state to the fully folded state, and wherein the first rotary plate and the second rotary plate are configured to rotate about the third axis of rotation and the fourth axis of rotation, respectively, by a repulsive force generated as the at least part of the display is curved.

12. The electronic device of claim 11, wherein the display comprises a first area at least partially disposed in the first housing and formed to be flat, a second area at least partially disposed in the second housing and formed to be flat, and a folding area located between the first area and the second area, wherein the folding area is configured to form a flat surface together with the first area and the second area in the unfolded state and to at least partially form a curved surface in the fully folded state or the intermediate state, and wherein each of the first rotary plate and the second rotary plate supports at least part of the folding area of the display.

13. The electronic device of claim 12, wherein each of the third axis of rotation and the fourth axis of rotation passes through at least part of the folding area in a direction parallel to the axial direction.

14. The electronic device of claim 12, wherein the folding area comprises an in-folding area, a first out-folding area located between the first area and the in-folding area, and a second out-folding area located between the second area and the in-folding area, and wherein in the fully folded state:
- part of the in-folding area is formed to be a curved surface whose center of curvature coincides with a first folding axis,
- part of the first out-folding area is formed to be a curved surface whose center of curvature coincides with a second folding axis,
- part of the second out-folding area is formed to be a curved surface whose center of curvature coincides with a third folding axis,
- the first folding axis is located in a direction that a first surface of the display faces, based on the display, and
- the second folding axis and the third folding axis are located in a direction that a second surface of the display opposite to the first surface faces, based on the display.

15. The electronic device of claim 14, wherein the first surface of the display is defined as a surface configured to form at least part of a front surface of the electronic device in the unfolded state, and wherein the second surface of the display is defined as a surface configured to face the first housing, the second housing, or the hinge structure.

16. The electronic device of claim 14, wherein when viewed in the axial direction, the third axis of rotation overlaps the first out-folding area, and the fourth axis of rotation overlaps the second out-folding area.

17. The electronic device of claim 1,
wherein the first rotary plate comprises a first support portion configured to extend in the axial direction, and a second support portion and a third support portion configured to extend from the first support portion in a direction perpendicular to the axial direction, and a partial area of the display is attached to the first support portion,
wherein the second support portion and the third support portion are configured to be brought into contact with, or spaced apart from, the display as the first rotary plate rotates,
wherein the second rotary plate comprises a fourth support portion configured to extend in the axial direction, and a fifth support portion and a sixth support portion configured to extend from the fourth support portion in a direction perpendicular to the axial direction, and a partial area of the display is attached to the fourth support portion, and
wherein the fifth support portion and the sixth support portion are configured to be brought into contact with, or spaced apart from, the display as the second rotary plate rotates.

18. The electronic device of claim 17,
wherein the first housing comprises a first plate on which at least part of the display is disposed,
wherein the second housing comprises a second plate on which at least part of the display is disposed,
wherein the electronic device comprises a plurality of adhesive areas to which the display is attached, and the plurality of adhesive areas are spaced apart from each other in a direction perpendicular to the axial direction, and
wherein when the display is viewed from above, the plurality of adhesive areas comprises a first adhesive area configured to overlap the first plate, a second adhesive area configured to overlap the second plate, a third adhesive area configured to overlap the first support portion of the first rotary plate, and a fourth adhesive area configured to overlap the fourth support portion of the second rotary plate.

19. The electronic device of claim 18,
wherein the electronic device further comprises a first non-adhesive area defined between the first adhesive area and the third adhesive area and a second non-adhesive area defined between the second adhesive area and the fourth adhesive area, and
wherein when the display is viewed from above, the third axis of rotation overlaps the first non-adhesive area, and the fourth axis of rotation overlaps the second non-adhesive area.

20. An electronic device comprising:
a housing comprising a first housing and a second housing;
a display configured to extend from the first housing to the second housing; and
a hinge structure configured to rotatably connect the first housing and the second housing,
wherein the hinge structure comprises:
  a fixed member,
  a first rotary member coupled to the fixed member so as to be rotatable about a first axis of rotation parallel to an axial direction and connected with the first housing, the first rotary member comprising a first guide protrusion,
  a second rotary member coupled to the fixed member so as to be rotatable about a second axis of rotation parallel to the axial direction and connected with the second housing, the second rotary member comprising a second guide protrusion,
  a first arm shaft rotatably coupled to the fixed member and parallel to the axial direction,
  a second arm shaft rotatably coupled to the fixed member and parallel to the axial direction,
  a first arm coupled to the first arm shaft and configured to rotate together with the first arm shaft, the first arm comprising a first cam configured to surround the first arm shaft,
  a second arm coupled to the second arm shaft and configured to rotate together with the second arm shaft, the second arm comprising a second cam configured to surround the second arm shaft,
  a cam member coupled to the first arm shaft and the second arm shaft and linearly movable in the axial direction, the cam member comprising a third cam engaged with the first cam and a fourth cam engaged with the second cam,
  a first elastic member coupled to the first arm shaft and configured to provide an elastic force to the cam member in the axial direction,
  a second elastic member coupled to the second arm shaft and configured to provide an elastic force to the cam member in the axial direction,
  a first guide member coupled to the first rotary member so as to be rotatable about a third axis of rotation parallel to the first axis of rotation, the first guide member a first guide groove having an arc shape in which the first guide protrusion is accommodated, and the third axis of rotation being defined as a center of the arc of the first guide groove,
  a second guide member coupled to the second rotary member so as to be rotatable about a fourth axis of rotation parallel to the second axis of rotation, the second guide member comprising a second guide groove having an arc shape in which the second guide protrusion is accommodated, and the fourth axis of rotation being defined as a center of the arc of the second guide groove,
  a first rotary plate coupled to the first guide member to rotate together with the first guide member and configured to support a partial area of the display, and
  a second rotary plate coupled to the second guide member to rotate together with the second guide member and configured to support another partial area of the display,
wherein the first guide member and the second guide member are configured to rotate relative to the first rotary member and the second rotary member as the first rotary member and the second rotary member rotate, and
wherein when viewed in the axial direction, each of the third axis of rotation and the fourth axis of rotation overlaps at least a partial area of the display.

* * * * *